US010498321B2

(12) United States Patent
Kikuchi et al.

(10) Patent No.: US 10,498,321 B2
(45) Date of Patent: Dec. 3, 2019

(54) COMPARATOR, AD CONVERTER, SOLID-STATE IMAGE PICKUP DEVICE, ELECTRONIC DEVICE, METHOD OF CONTROLLING COMPARATOR, DATA WRITING CIRCUIT, DATA READING CIRCUIT, AND DATA TRANSFERRING CIRCUIT

(71) Applicant: SONY CORPORATION, Tokyo (JP)

(72) Inventors: Hidekazu Kikuchi, Kanagawa (JP); Tadayuki Taura, Kanagawa (JP); Masaki Sakakibara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/058,340

(22) Filed: Aug. 8, 2018

(65) Prior Publication Data
US 2018/0351540 A1 Dec. 6, 2018

Related U.S. Application Data

(63) Continuation of application No. 15/548,289, filed as application No. PCT/JP2016/053732 on Feb. 9, 2016, now Pat. No. 10,075,155.

(30) Foreign Application Priority Data

Feb. 23, 2015 (JP) ................. 2015-032576

(51) Int. Cl.
H03M 1/50 (2006.01)
H03K 5/24 (2006.01)
(Continued)

(52) U.S. Cl.
CPC ..... H03K 5/2481 (2013.01); H03K 3/356017 (2013.01); H03K 3/356104 (2013.01);
(Continued)

(58) Field of Classification Search
CPC ........... H03K 5/2481; H03K 3/356104; H03K 3/356017; H03K 5/08; H04N 5/379;
(Continued)

(56) References Cited

U.S. PATENT DOCUMENTS 6,798,243 B1 9/2004 Nguyen et al.
8,174,427 B2 5/2012 Mashiyama et al.
(Continued)

FOREIGN PATENT DOCUMENTS

AU 2002366514 A 6/2003
CN 1602621 A 3/2005
(Continued)

OTHER PUBLICATIONS

Yang, et al., "A Nyquist Rate Pixel Level ADC for CMOS Image Sensors", Information Systems Laboratory, Stanford University, Stanford, CA 94305-4055, 04 pages.
(Continued)

Primary Examiner — Jean B Jeanglaude
(74) Attorney, Agent, or Firm — Chip Law Group

(57) ABSTRACT

An imaging device for improving the determining speed of the comparator and reducing power consumption. The comparator includes a differential input circuit that operates with a first power supply voltage, the differential input circuit that outputs a signal when an input signal is higher than a reference signal in voltage, a positive feedback circuit that operates with a second power supply voltage lower than the first power supply voltage and accelerates transition speed when a compared result signal indicating a compared result between the input signal and the reference signal in voltage, is inverted, based on the output signal of the differential input circuit, and a voltage conversion circuit that converts the output signal of the differential input circuit into a signal corresponding to the second power supply voltage.

16 Claims, 36 Drawing Sheets

(51) Int. Cl.
*H03K 5/08* (2006.01)
*H04N 5/374* (2011.01)
*H04N 5/378* (2011.01)
*H03K 3/356* (2006.01)
*H04N 5/232* (2006.01)
*H04N 5/376* (2011.01)
*H04N 5/369* (2011.01)
*H03M 1/56* (2006.01)
*G11C 19/00* (2006.01)
*H03M 1/12* (2006.01)
*G11C 19/28* (2006.01)

(52) U.S. Cl.
CPC .............. *H03K 5/08* (2013.01); *H03M 1/50* (2013.01); *H04N 5/23241* (2013.01); *H04N 5/374* (2013.01); *H04N 5/378* (2013.01); *H04N 5/379* (2018.08); *H04N 5/3765* (2013.01); *G11C 19/00* (2013.01); *G11C 19/28* (2013.01); *H03M 1/123* (2013.01); *H03M 1/56* (2013.01)

(58) Field of Classification Search
CPC .. H04N 5/23241; H04N 5/3765; H04N 5/378; H04N 5/374; H03M 1/50; H03M 1/123; H03M 1/56; G11C 19/00
USPC .......................... 341/126, 136, 164, 166, 155
See application file for complete search history.

(56) References Cited

U.S. PATENT DOCUMENTS

| | | | |
|---|---|---|---|
| 8,288,807 B2 | 10/2012 | Kimura | |
| 8,513,710 B2 * | 8/2013 | Mabuchi | H01L 27/14623 257/223 |
| 8,606,051 B2 | 12/2013 | Wang et al. | |
| 9,244,102 B2 | 1/2016 | Kikuchi | |
| 2003/0107666 A1 | 6/2003 | Harton et al. | |
| 2006/0186315 A1 | 8/2006 | Lee et al. | |
| 2011/0068967 A1 | 3/2011 | Mashiyama et al. | |
| 2011/0169681 A1 | 7/2011 | Naka et al. | |
| 2014/0131588 A1 | 5/2014 | Tsukiyama et al. | |
| 2014/0320690 A1 | 10/2014 | Kobayashi et al. | |
| 2017/0272678 A1 * | 9/2017 | Sakakibara | H04N 5/3745 |

FOREIGN PATENT DOCUMENTS

| | | | |
|---|---|---|---|
| DE | 102006008886 A | | 2/2007 |
| EP | 2651119 A1 | | 10/2013 |
| JP | 2005-512464 A | | 4/2005 |
| JP | 2006-238444 A | | 9/2006 |
| JP | 2012-147339 A | | 8/2012 |
| JP | 2013-051527 A | | 3/2013 |
| JP | 5275367 B2 | | 8/2013 |
| KR | 10-2006-0093637 A | | 8/2006 |
| WO | 2003/051036 A1 | | 6/2003 |
| WO | 2010/064338 A1 | | 6/2010 |
| WO | 2012/077217 A1 | | 6/2012 |

OTHER PUBLICATIONS

International Search Report and Written Opinion of PCT Application No. PCT/JP2016/053732, dated Apr. 12, 2016, 02 pages of English Translation and 08 pages of ISRWO.

Non-Final Office Action for U.S. Appl. No. 15/548,289, dated Dec. 4, 2017, 06 pages.

Notice of Allowance for U.S. Appl. No. 15/548,289, dated May 8, 2018, 08 pages.

International Preliminary Report on Patentability of PCT Application No. PCT/JP2016/053732, dated Sep. 8, 2017, 10 pages of English Translation and 05 pages of IPRP.

* cited by examiner

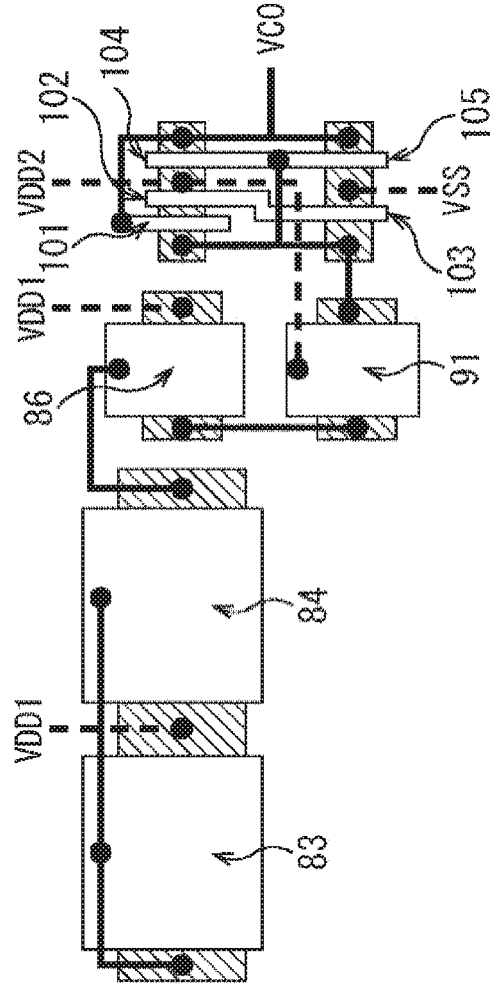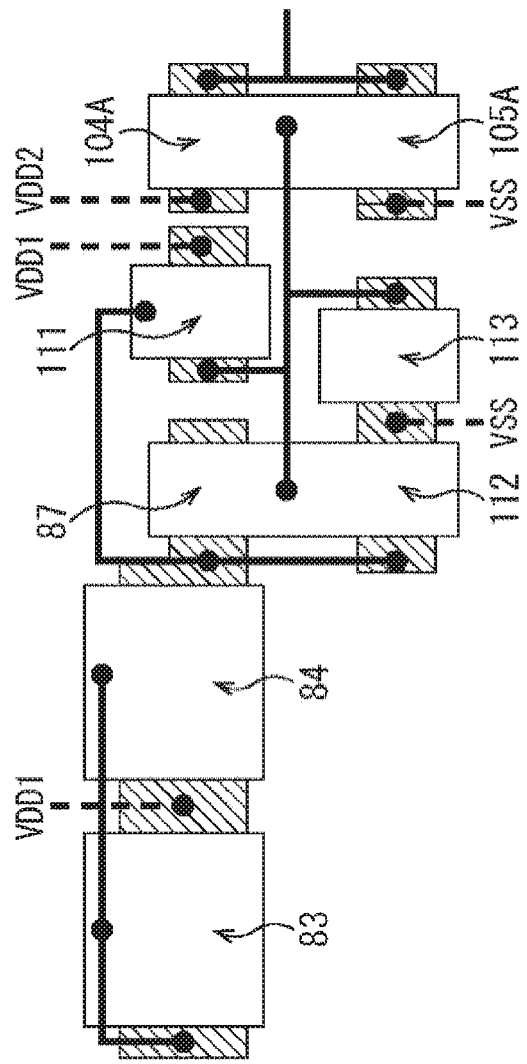
FIG. 10A
FIG. 10B

COMPARATOR, AD CONVERTER, SOLID-STATE IMAGE PICKUP DEVICE, ELECTRONIC DEVICE, METHOD OF CONTROLLING COMPARATOR, DATA WRITING CIRCUIT, DATA READING CIRCUIT, AND DATA TRANSFERRING CIRCUIT

CROSS REFERENCE TO RELATED APPLICATIONS

The present application is a continuation application of U.S. patent application Ser. No. 15/548,289, filed Aug. 2, 2017, which is a National Stage of PCT/JP2016/053732, filed Feb. 9, 2016, and which claims the priority from Japanese Patent Application JP 2015-032576 filed Feb. 23, 2015, the entire content of which is hereby incorporated by reference.

TECHNICAL FIELD

The present disclosure relates to a comparator, an AD converter, a solid-state image pickup device, an electronic device, a method of controlling the comparator, a data writing circuit, a data reading circuit, and a data transferring circuit, and particularly relates to a comparator, an AD converter, a solid-state image pickup device, an electronic device, a method of controlling the comparator, a data writing circuit, a data reading circuit, and a data transferring circuit, capable of improving the determining speed of the comparator and reducing power consumption.

BACKGROUND ART

In a case where AD conversion is performed in a limited area, for example, in a pixel, a system having most favorable area efficiency, in signal reading systems for a solid-state image pickup device, is an integrating-typed (slope-typed) AD conversion system including a comparator and a digital circuit at the subsequent stage of the comparator.

Non-Patent Document 1 has proposed a technology of achieving AD conversion in a limited area with the integrating-typed AD conversion system. For example, the system of Non-Patent Document 1 has a circuit configuration of inputting a slope signal into a comparator a plurality of times with one DRAM circuit being a digital circuit at a subsequent stage. For example, the same slope signal is repeatedly input into the comparator eight times for 8-bit AD conversion. Then, an operation of storing, into the DRAM circuit, a code of 0 or 1 at a point in time in which the output of the comparator is inverted, is repeated eight times so that the storage is read to the outside at a point in time in which comparison over the entire surface is completed.

CITATION LIST

Non-Patent Document

Non-Patent Document 1: D. Yang, B. Fowler, and A. El Gamal, "A Nyquist rate pixel level ADC for CMOS image sensors," in Proc. IEEE 1998 Custom Integrated Circuits Conf., Santa Clara, Calif., May 1998, pp. 237-240.

SUMMARY OF THE INVENTION

Problems to be Solved by the Invention

In a case where an AD converter is arranged in a pixel, an area housing circuits is limited and thus a comparator that sufficiently satisfies requirements is difficult to produce, differently from a case where flexibility in area is relatively present, for example, in column parallel including the AD converter arranged for each pixel line. For example, the determining speed of comparison may deaccelerate or power consumption may increases in a case where performance is enhanced.

The present disclosure has been made in consideration of the situation, and is to improve the determining speed of a comparator and additionally to reduce power consumption.

Solutions to Problems

A comparator according to a first aspect of the present disclosure, includes: a differential input circuit configured to operate with a first power supply voltage, the differential input circuit configured to output a signal when an input signal is higher than a reference signal in voltage; a positive feedback circuit configured to operate with a second power supply voltage lower than the first power supply voltage, the positive feedback circuit being configured to accelerate transition speed when a compared result signal indicating a compared result between the input signal and the reference signal in voltage, is inverted, on the basis of the output signal from the differential input circuit; and a voltage conversion circuit configured to convert the output signal of the differential input circuit into a signal corresponding to the second power supply voltage.

According to the first aspect of the present disclosure, the differential input circuit operates with the first power supply voltage, and outputs the signal when the input signal is higher than the reference signal in voltage. The positive feedback circuit operates with the second power supply voltage lower than the first power supply voltage, and accelerates the transition speed when the compared result signal indicating the compared result between the input signal and the reference signal in voltage, is inverted, on the basis of the output signal from the differential input circuit. The voltage conversion circuit converts the output signal of the differential input circuit into the signal corresponding to the second power supply voltage.

An AD converter according to a second aspect of the present disclosure, includes: a differential input circuit configured to operate with a first power supply voltage, the differential input circuit configured to output a signal when an input signal is higher than a reference signal in voltage; a positive feedback circuit configured to operate with a second power supply voltage lower than the first power supply voltage, the positive feedback circuit being configured to accelerate transition speed when a compared result signal indicating a compared result between the input signal and the reference signal in voltage, is inverted, on the basis of the output signal from the differential input circuit; a voltage conversion circuit configured to convert the output signal of the differential input circuit into a signal corresponding to the second power supply voltage; and a data storage unit configured to store a time code when the compared result signal is inverted.

According to the second aspect of the present disclosure, the differential input circuit configured to operate with the first power supply voltage, and outputs the signal when the input signal is higher than the reference signal in voltage. The positive feedback circuit operates with the second power supply voltage lower than the first power supply voltage, accelerates the transition speed when the compared result signal indicating the compared result between the input signal and the reference signal in voltage, is inverted, on the basis of the output signal from the differential input circuit. The voltage conversion circuit configured to convert the output signal of the differential input circuit into the signal corresponding to the second power supply voltage. The data storage unit stores the time code when the compared result signal is inverted.

A solid-state image pickup device according to a third aspect of the present disclosure, includes: an AD converter including: a differential input circuit configured to operate with a first power supply voltage, the differential input circuit configured to output a signal when an input signal is higher than a reference signal in voltage; a positive feedback circuit configured to operate with a second power supply voltage lower than the first power supply voltage, the positive feedback circuit being configured to accelerate transition speed when a compared result signal indicating a compared result between the input signal and the reference signal in voltage, is inverted, on the basis of the output signal from the differential input circuit; a voltage conversion circuit configured to convert the output signal of the differential input circuit into a signal corresponding to the second power supply voltage; and a data storage unit configured to store a time code when the compared result signal is inverted; and a pixel circuit configured to output an electric charge signal to the differential input circuit as the input signal, the electric charge signal being generated by receiving and photoelectrically converting light incident on a pixel.

An electronic device according to a fourth aspect of the present disclosure, includes: a solid-state image pickup device including: an AD converter including: a differential input circuit configured to operate with a first power supply voltage, the differential input circuit configured to output a signal when an input signal is higher than a reference signal in voltage; a positive feedback circuit configured to operate with a second power supply voltage lower than the first power supply voltage, the positive feedback circuit being configured to accelerate transition speed when a compared result signal indicating a compared result between the input signal and the reference signal in voltage, is inverted, on the basis of the output signal from the differential input circuit; a voltage conversion circuit configured to convert the output signal of the differential input circuit into a signal corresponding to the second power supply voltage; and a data storage unit configured to store a time code when the compared result signal is inverted; and a pixel circuit configured to output an electric charge signal to the differential input circuit as the input signal, the electric charge signal being generated by receiving and photoelectrically converting light incident on a pixel.

According to the third and fourth aspects of the present disclosure, the differential input circuit operates with the first power supply voltage, and outputs the signal when the input signal is higher than the reference signal in voltage. The positive feedback circuit operates with the second power supply voltage lower than the first power supply voltage, and accelerates the transition speed when the compared result signal indicating the compared result between the input signal and the reference signal in voltage, is inverted, on the basis of the output signal from the differential input circuit. The voltage conversion circuit converts the output signal of the differential input circuit into the signal corresponding to the second power supply voltage. The data storage unit stores the time code when the compared result signal is inverted. The pixel circuit outputs the electric charge signal to the differential input circuit as the input signal, the electric charge signal being generated by receiving and photoelectrically converting the light incident on the pixel.

A method of controlling a comparator according to a fifth aspect of the present disclosure, the comparator including a differential input circuit configured to operate with a first power supply voltage, a positive feedback circuit configured to operate with a second power supply voltage lower than the first power supply voltage, and a voltage conversion circuit, includes: outputting a signal by the differential input circuit when an input signal is higher than a reference signal in voltage; converting the output signal of the differential input circuit into a signal corresponding to the second power supply voltage, by the voltage conversion circuit; and accelerating transition speed when a compared result signal indicating a compared result between the input signal and the reference signal in voltage, is inverted, by the positive feedback circuit on the basis of the output signal of the differential input circuit, the output signal being converted by the voltage conversion circuit.

In the comparator including the differential input circuit configured to operate with the first power supply voltage, the positive feedback circuit configured to operate with the second power supply voltage lower than the first power supply voltage, and the voltage conversion circuit, according to the first to third aspects of the present disclosure, the differential input circuit outputs the signal when the input signal is higher than the reference signal in voltage. The voltage conversion circuit converts the output signal of the differential input circuit into the signal corresponding to the second power supply voltage. The positive feedback circuit accelerates the transition speed when the compared result signal indicating the compared result between the input signal and the reference signal in voltage, is inverted, on the basis of the output signal of the differential input circuit, the output signal being converted by the voltage conversion circuit.

A data writing circuit according to a sixth aspect of the present disclosure, includes: a shift register configured to acquire a time code output from a time code generating unit so as to transfer the time code sequentially; and a latch circuit configured to latch-store the time code that has been transferred.

According to the sixth aspect of the present disclosure, the time code output from the time code generating unit is acquired and sequentially transferred, and the time code that has been transferred is latch-stored.

A data reading circuit according to a seventh aspect of the present disclosure, includes: a latch circuit configured to latch-store a predetermined time code; and a shift register configured to receive the time code latch-stored in the latch circuit so as to transfer the time code sequentially.

According to the seventh aspect of the present disclosure, the predetermined time code is latch-stored in the latch circuit, and the time code latch-stored in the latch circuit is received and sequentially transferred.

A data transferring circuit according to an eighth aspect of the present disclosure, includes: an interactive buffer configured to make a switch between a writing operation and a reading operation of a time code output from a time code generating unit; a latch circuit configured to latch-store a predetermined time code; and a shift register configured to acquire the time code output from the time code generating unit and supply it to the latch circuit so as to transfer the time code sequentially in a case where the writing operation has been set in the interactive buffer, the shift register being configured to receive the time code latch-stored in the latch circuit so as to transfer the time code sequentially in a case where the reading operation has been set in the interactive buffer.

According to the first to third aspects of the present disclosure, an interactive buffer makes a switch between a writing operation and a reading operation of a time code output from a time code generating unit. The time code output from the time code generating unit is acquired and is supplied to the latch circuit so as to be sequentially transferred, in a case where the writing operation has been set in the interactive buffer. The time code latch-stored in the latch circuit is received and is sequentially transferred, in a case where the reading operation has been set in the interactive buffer.

The comparator, the AD converter, the solid-state image pick up device, the data writing circuit, the data reading circuit, and the data transferring circuit each may be an individual device or may be a module built in a different device.

Effects of the Invention

According to the first to eighth aspects of the present disclosure, the determining speed of the comparator can improve and power consumption can be reduced.

Note that, the effects described here are not limited, and any of the effects described in the present disclosure may be provided.

BRIEF DESCRIPTION OF DRAWINGS

FIGS. 10A and 10B are plan views of the circuit layouts of the first exemplary configuration and the fourth exemplary configuration of the comparison circuit.

MODE FOR CARRYING OUT THE INVENTION

Figure 1:
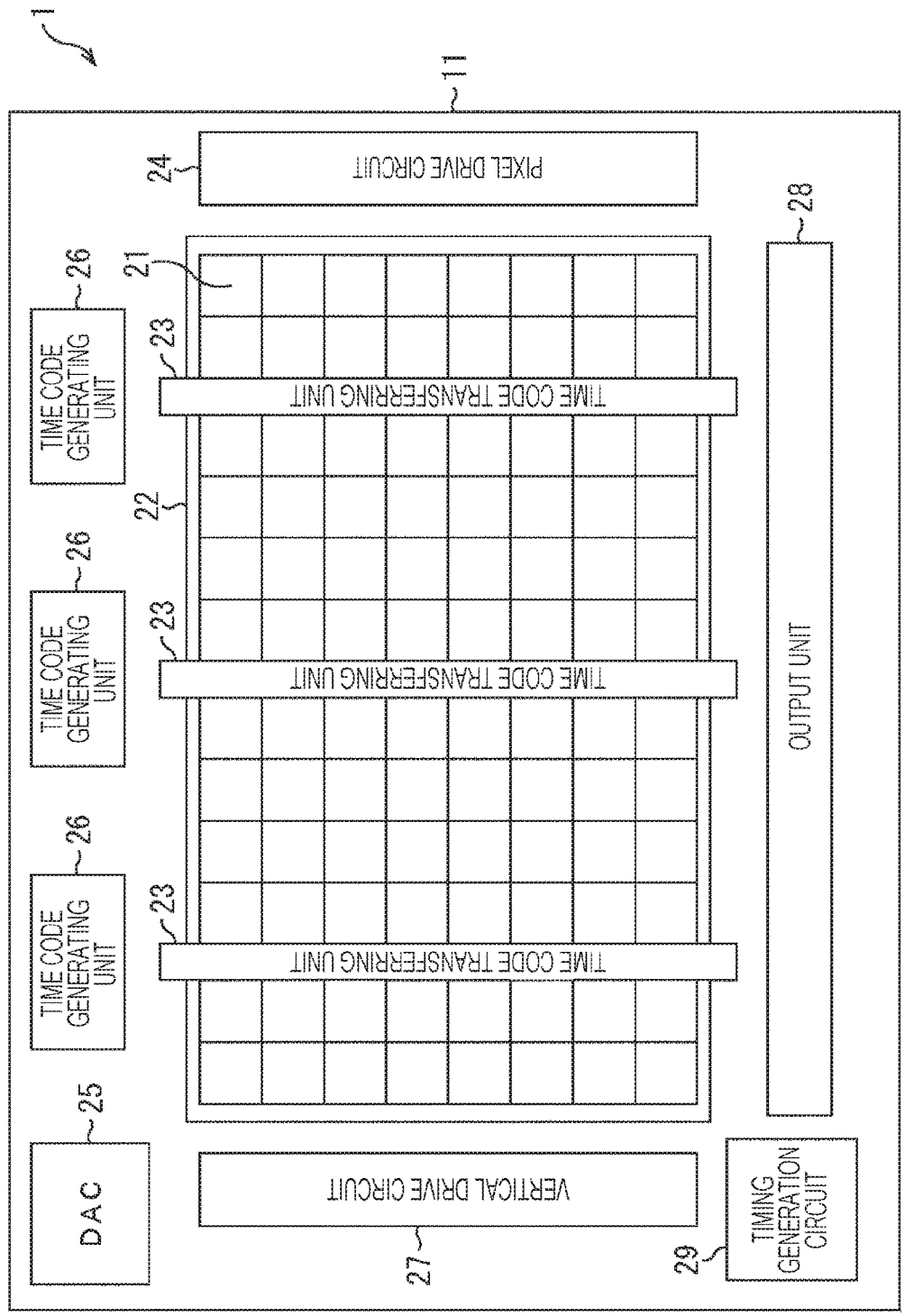
FIG. 1 is a diagram of a schematic configuration of a solid-state image pickup device according to the present disclosure.

Modes for carrying out the present disclosure (hereinafter, referred to as embodiments) will be described below. Note that, the descriptions will be given in the following order.
1. Exemplary schematic configuration of a solid-state image pickup device
2. Exemplary detailed configuration of a pixel
3. First exemplary configuration of a comparison circuit
4. Second exemplary configuration of the comparison circuit
5. Third exemplary configuration of the comparison circuit
6. Fourth exemplary configuration of the comparison circuit
7. First exemplary configuration of joint pixels 8. Second exemplary configuration of the joint pixels
9. First exemplary configuration of a time code transferring unit and a data storage unit
10. Second exemplary configuration of the time code transferring unit and the data storage unit
11. Third exemplary configuration of the time code transferring unit and the data storage unit
12. Detailed description of the third exemplary configuration of the time code transferring unit
13. First modification of the time code transferring unit according to the third exemplary configuration
14. Second modification of the time code transferring unit according to the third exemplary configuration
15. Third modification of the time code transferring unit according to the third exemplary configuration
16. Exemplary configuration of a time code generating unit
17. Difference between the first and second exemplary configurations and the third exemplary configuration of the time code transferring unit
18. Different exemplary configuration of the data storage unit
19. Different exemplary configuration of a clock supply circuit
20. Exemplary application to a column AD system
21. Plural substrate configuration 1
22. Plural substrate configuration 2
23. Exemplary application to an electronic device <1. Exemplary Schematic Configuration of Solid-State Image Pickup Device>

FIG. 1 is a schematic configuration of a solid-state image pickup device according to the present disclosure.

The solid-state image pickup device 1 of FIG. 1 includes a pixel array unit 22 including pixels 21 arranged in a two-dimensional array format on a semiconductor substrate 11 using, for example, silicon (Si) as a semiconductor. The pixel array unit 22 includes a time code transferring units 23 that transfers a time code generated by a time code generating unit 26 to each pixel 21. Then, a pixel drive circuit 24, a D/A converter (DAC) 25, the time code generating unit 26, a vertical drive circuit 27, an output unit 28, and a timing generation circuit 29 are formed on the periphery of the pixel array unit 22 on the semiconductor substrate 11.

Each of the pixels 21 arranged in the two-dimensional array format, includes a pixel circuit 41 and an ADC 42 provided, as described later with reference to FIG. 2. The pixels 21 each generate an electric charge signal corresponding to light intensity received by a light-receiving element (e.g., a photodiode) in the pixel, so as to convert the electric charge signal into a digital pixel signal SIG to be output.

Figure 2:
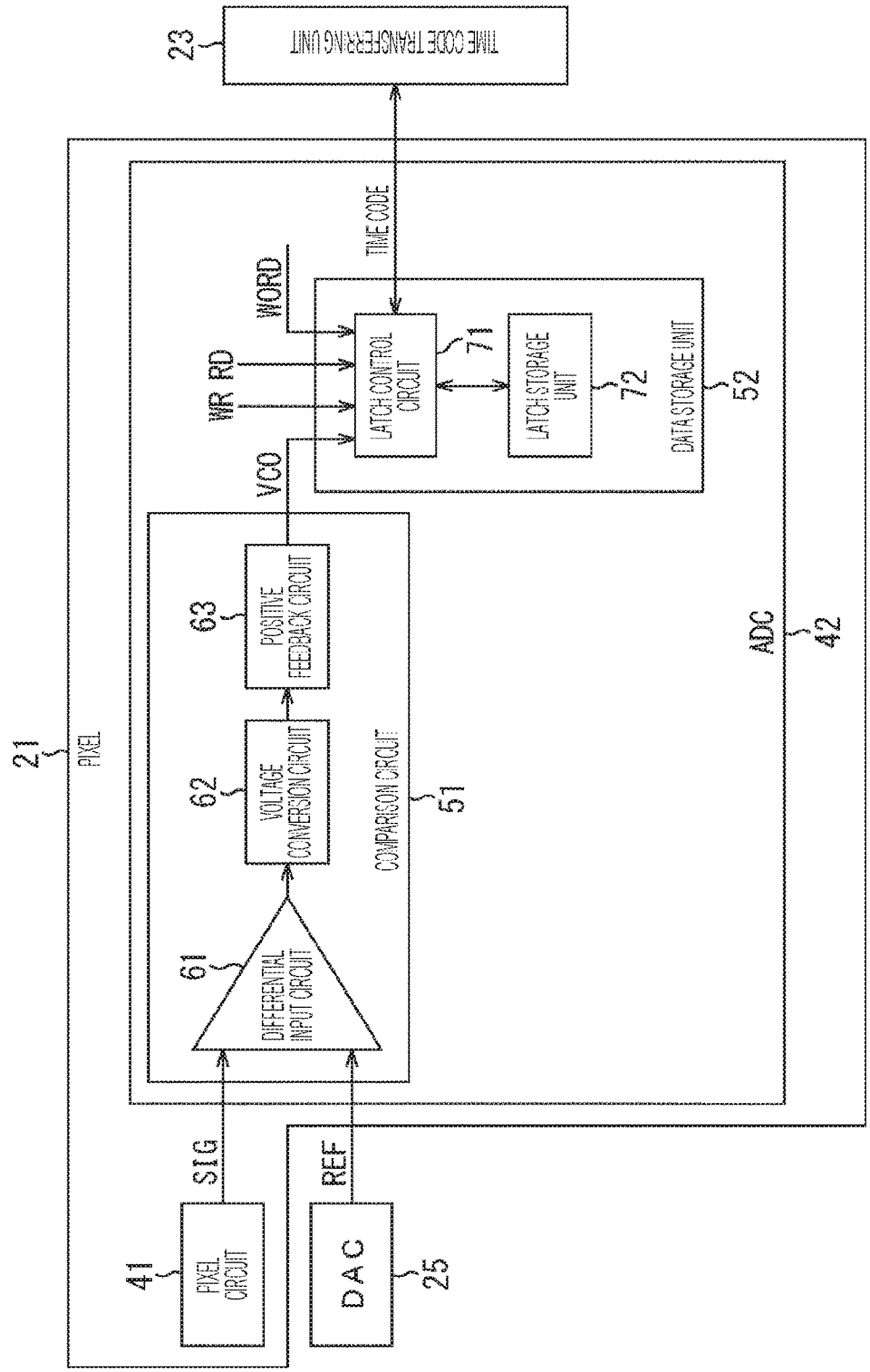
FIG. 2 is a block diagram of an exemplary detailed configuration of a pixel.

The pixel drive circuit 24 drives the pixel circuit 41 in the pixel 21 (refer to FIG. 2). The DAC 25 generates a reference signal (a reference voltage signal) REF being a slope signal having a level (a voltage) monotonously decreasing in response to the passage of time, so as to supply the reference signal REF to each pixel 21. The time code generating unit 26 generates a time code used in converting (AD conversion) an analog pixel signal SIG into a digital signal by each pixel 21, so as to supply the time code to the corresponding time code transferring unit 23. A plurality of the time code generating units 26 is provided to the pixel array unit 22, and the time code transferring units 23 are provided in the pixel array unit 22, the number of the time code transferring units 23 corresponding to the number of the time code generating units 26. That is, the time code generating units 26 correspond to the time code transferring units 23 each that transfer the time code generated by the corresponding time code generating unit 26, on a one-to-one basis.

The vertical drive circuit 27 controls the digital pixel signal SIG generated in each pixel 21, to be output to the output unit 28 in predetermined order on the basis of a timing signal supplied from the timing generation circuit 29. The digital pixel signal SIG output from each pixel 21, is output from the output unit 28 to the outside of the solid-state image pickup device 1. The output unit 28 performs, as necessary, predetermined digital signal processing, such as black-level correction processing of correcting a black level and correlated double sampling (CDS) processing, and then performs output to the outside.

The timing generation circuit 29 includes, for example, a timing generator that generates various timing signals, and supplies the various timing signals that have been generated, to the pixel drive circuit 24, the DAC 25, and the vertical drive circuit 27, for example.

The solid-state image pickup device 1 has the above configuration. Note that, as described above, the circuits included in the solid-state image pickup device 1 all formed on the one semiconductor substrate 11, have been described in FIG. 1. However, as described later, the circuits included in the solid-state image pickup device 1 can be arranged so as to be divided into a plurality of the semiconductor substrates 11.

<2. Exemplary Detailed Configuration of Pixel>

FIG. 2 is a block diagram of an exemplary detailed configuration of a pixel 21.

The pixel 21 includes the pixel circuit 41 and the AD converter (ADC) 42.

The pixel circuit 41 outputs an electric charge signal corresponding to the light intensity that has been received, to the ADC 42 as an analog pixel signal SIG. The ADC 42 converts the analog pixel signal SIG supplied from the pixel circuit 41, into a digital signal.

The ADC 42 includes a comparison circuit 51 and a data storage unit 52.

The comparison circuit 51 compares the reference signal REF supplied from the DAC 25 and the pixel signal SIG, so as to output an output signal VCO as a compared result signal indicating a compared result. The comparison circuit 51 inverts the output signal VCO when the reference signal REF and the pixel signal SIG become the same (voltage).

The comparison circuit 51 includes a differential input circuit 61, a voltage conversion circuit 62, and a positive feedback (PFB) circuit 63, and the details will be described later with reference to FIG. 3.

The data storage unit 52 is supplied with a WR signal indicating a writing operation for the pixel signal, an RD signal indicating a reading operation for the pixel signal, and a WORD signal for controlling reading timing for the pixel 21 during the reading operation for the pixel signal, from the vertical drive circuit 27, in addition to the output signal VCO input from the comparison circuit 51. In addition, a time code generated by the corresponding time code generating unit 26 is supplied through the corresponding time code transferring unit 23.

The data storage unit 52 includes a latch control circuit 71 that controls a writing operation and a reading operation of the time code on the basis of the WR signal and the RD signal, and a latch storage unit 72 that stores the time code.

In the writing operation of the time code, the latch control circuit 71 stores the time code that is supplied from the time code transferring unit 23 and is updated per unit time, into the latch storage unit 72 while the comparison circuit 51 is inputting the output signal VCO being Hi (High). Then, when the reference signal REF and the pixel signal SIG become the same (voltage) and the output signal VCO supplied from the comparison circuit 51 is inverted to be Lo (Low), the writing (updating) of the time code to be supplied is canceled and the time code finally stored in the latch storage unit 72 is retained in the latch storage unit 72. The time code stored in the latch storage unit 72 indicates the time at which the pixel signal SIG and the reference signal REF become equivalent to each other, and indicates data indicating that the pixel signal SIG is a reference voltage at the time, namely, a digitized light intensity value.

After sweep of the reference signal REF is completed and the time code is stored in the latch storage unit 72 of each pixel 21 in the pixel array unit 22, the operation of each pixel 21 is changed from the writing operation to the reading operation.

When the reading timing of each pixel 21 comes, the latch control circuit 71 outputs the time code (the digital pixel signal SIG) stored in the latch storage unit 72, to the time code transferring unit 23, in the reading operation of the time code, on the basis of the WORD signal for controlling the reading timing. The time code transferring unit 23 sequentially transfers the time code that has been supplied, in a column direction (a vertical direction), to be supplied to the output unit 28.

In order to make a distinction from the time code written in the latch storage unit 72 in the wiring operation of the time code, the digitized pixel data indicating that the pixel signal SIG, being an inverted time code when the output signal VCO read from the latch storage unit 72 in the reading operation of the time code, is inverted, is the reference voltage at the time, is also referred to as AD conversion pixel data, below.

<3. First Exemplary Configuration of Comparison Circuit>

Figure 3:
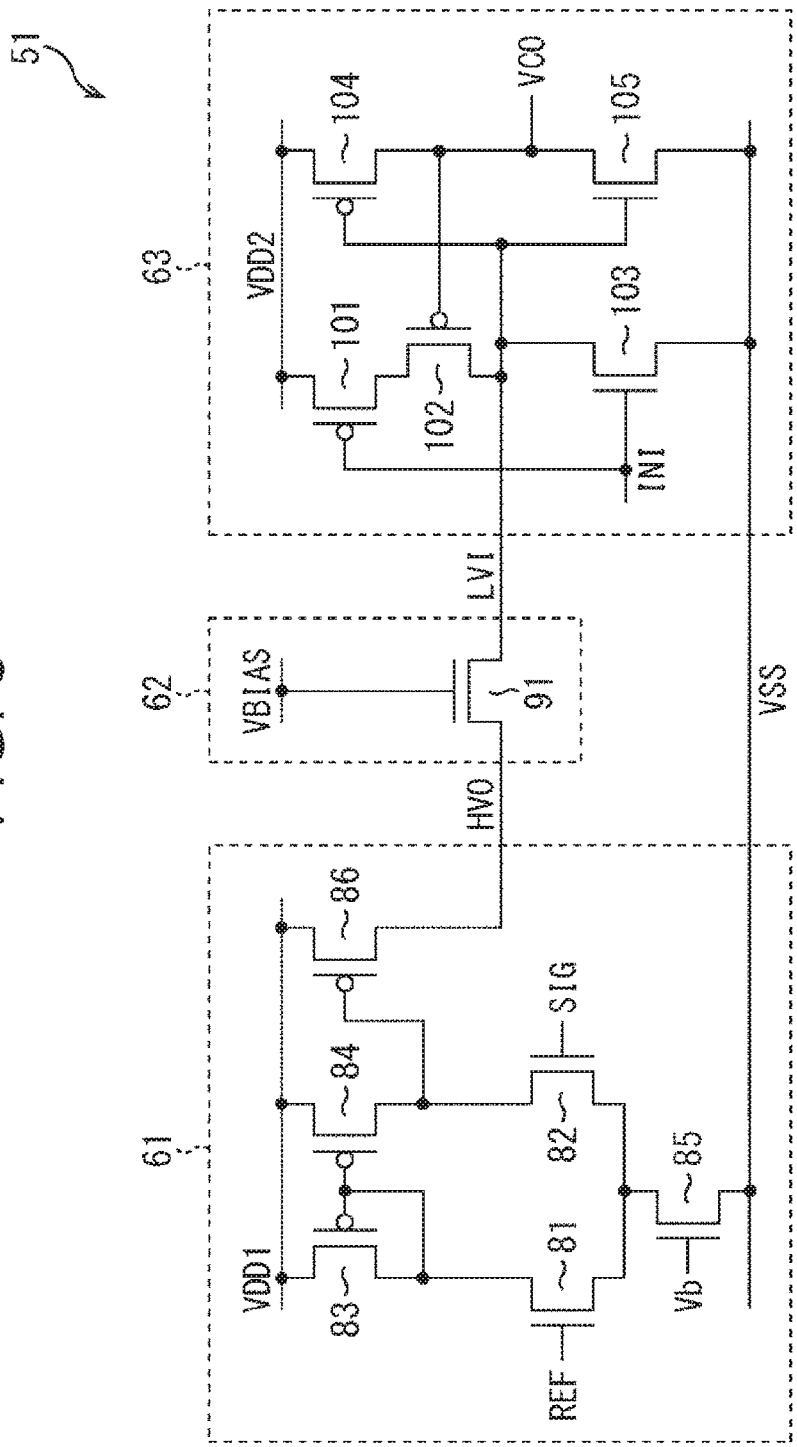
FIG. 3 is a block diagram of an exemplary detailed configuration of a comparison circuit.

FIG. 3 is a circuit diagram of a detailed configuration of the differential input circuit 61, the voltage conversion circuit 62, and the positive feedback circuit 63 included in the comparison circuit 51.

The differential input circuit 61 compares the pixel signal SIG output from the pixel circuit 41 in the pixel 21 and the reference signal REF output from the DAC 25, and outputs a predetermined signal (current) when the pixel signal SIG is higher than the reference signal REF.

The differential input circuit 61 includes transistors 81 and 82 being a differential pair, transistors 83 and 84 included in a current mirror, a transistor 85 being a constant current source that supplies a current IB corresponding to an input bias current Vb, and a transistor 86 that outputs an output signal HVO of the differential input circuit 61.

The transistors 81, 82, and 85 each include a negative channel MOS (NMOS) transistor, and the transistors 83, 84, and 86 each include a positive channel MOS (PMOS) transistor.

The reference signal REF output from the DAC 25 is input into the gate of the transistor 81 from the transistors 81 and 82 being the differential pair, and the pixel signal SIG output from the pixel circuit 41 in the pixel 21 is input into the gate of the transistor 82. The sources of the transistors 81 and 82 are coupled to the drain of the transistor 85, and the source of the transistor 85 is coupled to a predetermined voltage VSS (VSS<VDD2<VDD1).

The drain of the transistor 81 is coupled to the gates of the transistors 83 and 84 included in the current mirror circuit and the drain of the transistor 83, and the drain of the transistor 82 is coupled to the drain of the transistor 84 and the gate of the transistor 86. The sources of the transistors 83, 84, and 86 are coupled to a first power supply voltage VDD1.

The voltage conversion circuit 62 includes, for example, an NMOS transistor 91. The drain of the transistor 91 is coupled to the drain of the transistor 86 in the differential input circuit 61. The source of the transistor 91 is coupled to a predetermined connection point in the positive feedback circuit 63. The gate of the transistor 86 is coupled to a bias voltage VBIAS.

The differential input circuit 61 including the transistors 81 to 86, operates with the first power supply voltage VDD1 being a high voltage, and the positive feedback circuit 63 operates with a second power supply voltage VDD2 lower than the first power supply voltage VDD1. The voltage conversion circuit 62 converts the output signal HVO input from the differential input circuit 61 into a low voltage signal (a converted signal) LVI with which the positive feedback circuit 63 can operate, so as to supply the converted signal LVI to the positive feedback circuit 63.

The bias voltage VBIAS at least makes conversion to a voltage that does not destroy transistors 101 to 105, which operate with a constant voltage, in the positive feedback circuit 63. For example, the bias voltage VBIAS can be made to be a voltage the same as the second power supply voltage VDD2 of the positive feedback circuit 63 (VBIAS=VDD2).

The positive feedback circuit 63 outputs the compared result signal inverted when the pixel signal SIG is higher than the reference signal REF, on the basis of the converted signal LVI including the output signal HVO from the differential input circuit 61, converted to a signal corresponding to the second power supply voltage VDD2. In addition, the positive feedback circuit 63 accelerates transition speed when the output signal VCO output as the compared result signal, is inverted.

The positive feedback circuit 63 includes the five transistors 101 to 105. Here, the transistors 101, 102, and 104 each include a PMOS transistor, and the transistors 103 and 105 each include an NMOS transistor.

The source of the transistor 91 is coupled to the drains of the transistors 102 and 103 and the gates of the transistors 104 and 105, the source being the output end of the voltage conversion circuit 62. The sources of the transistors 101 and 104 are coupled to the second power supply voltage VDD2. The drain of the transistor 101 is coupled to the source of the transistor 102. The gate of the transistor 102 is coupled to the drains of the transistors 104 and 105, the drains being the output end of the positive feedback circuit 63. The sources of the transistors 103 and 105 are coupled to the predetermined voltage VSS. The gates of the transistors 101 and 103 are supplied with an initialization signal INI.

The transistors 104 and 105 are included in an inverter circuit, and the connection point between the drains of the transistors 104 and 105 is the output end from which the comparison circuit 51 outputs the output signal VCO.

Figure 4:
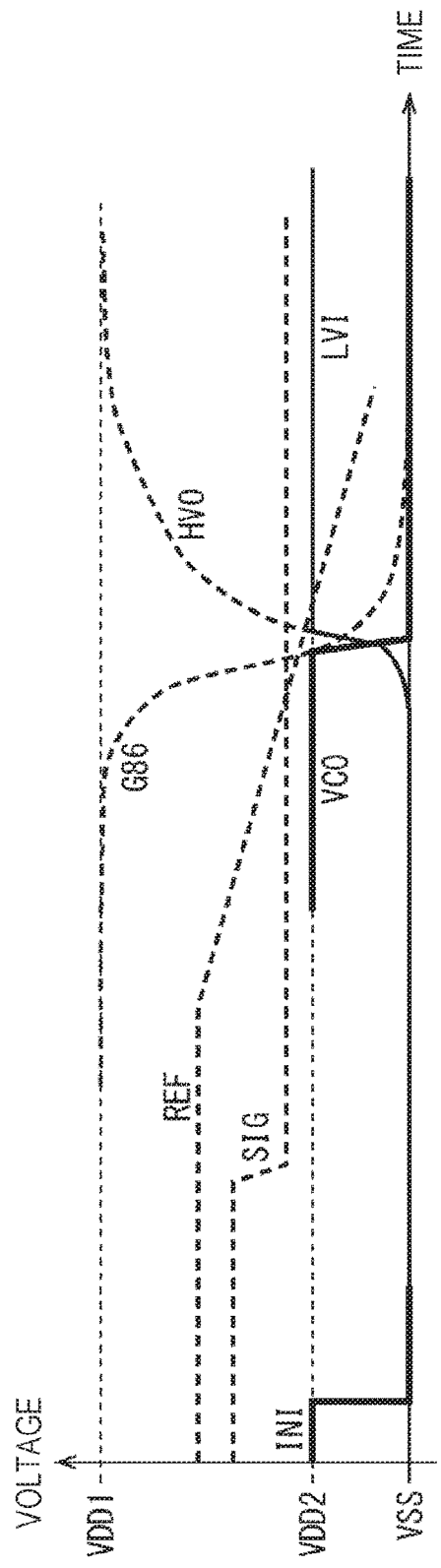
FIG. 4 is a graphical representation of the transition of each signal of the comparison circuit in operation.

The operation of the comparison circuit 51 having the above configuration, will be described. FIG. 4 illustrates the transition of each signal of the comparison circuit 51 in operation. Note that, "G86" denotes the gate potential of the transistor 86, in FIG. 4.

First, the reference signal REF is set to be at a voltage higher than the pixel signals SIG of all the pixels 21, and additionally the initialization signal INI is turned to be Hi so that the comparison circuit 51 is initialized.

More specifically, the reference signal REF is applied to the gate of the transistor 81, and the pixel signal SIG is applied to the gate of the transistor 82. When the voltage of the reference signal REF is higher than the voltage of the pixel signal SIG, a current output from the transistor 85 being the current source, mostly flows into the transistor 83 including diode connection, through the transistor 81. The channel resistance of the transistor 84 having the common gate with the transistor 83, sufficiently lowers so that the transistor 86 is interrupted with the gate of the transistor 86 being retained approximately at a first power supply voltage VDD1 level. Therefore, even in a case where the transistor 91 in the voltage conversion circuit 62 has been made into conduction, the positive feedback circuit 63 being a charging circuit does not charge the converted signal LVI. Meanwhile, since the initialization signal INI being Hi has been supplied, the transistor 103 is made into conduction so that the positive feedback circuit 63 discharges the converted signal LVI. In addition, the transistor 101 is interrupted so that the positive feedback circuit 63 does not charge the converted signal LVI through the transistor 102. As a result, the converted signal LVI is discharged until the predetermined voltage VSS, and the positive feedback circuit 63 outputs the output signal VCO being Hi, using the transistors 104 and 105 included in the inverter, so that the comparison circuit 51 is initialized.

After the initialization, the initialization signal INI is turned to be Lo so that the sweep of the reference signal REF starts.

During a period during which the voltage of the reference signal REF is higher than the voltage of the pixel signal SIG, the transistor 86 is turned off so as to be interrupted, so that the output signal VCO is turned to be Hi and the transistor 102 is also turned off so as to be interrupted. The transistor 103 is also interrupted since the initialization signal INI has been Lo. The converted signal LVI retains the predetermined voltage VSS in a high impedance state so that the output signal VCO being Hi is output.

When the reference signal REF is lower than the pixel signal SIG, the output current of the transistor 85 being the current source does not flow into the transistor 81 so that the gate potentials of the transistors 83 and 84 rise and then the channel resistance of the transistor 84 increases. Then, the current flowing through the transistor 82, causes voltage drop to decrease the gate potential of the transistor 86 so that the transistor 91 is made into conduction. The output signal HVO output from the transistor 86 is converted into the converted signal LVI by the transistor 91 in the voltage conversion circuit 62, so that the converted signal LVI is supplied to the positive feedback circuit 63. The positive feedback circuit 63 being the charging circuit, charges the converted signal LVI so that the potential comes close to the second power supply voltage VDD2 from the low voltage VSS.

Then, when the voltage of the converted signal LVI exceeds the threshold voltage of the inverter including the transistors 104 and 105, the output signal VCO is turned to be Lo so that the transistor 102 is made into conduction. Since the transistor 101 has been in conduction by applying the initialization signal INI being Lo, the positive feedback circuit 63 rapidly charges the converted signal LVI through the transistors 101 and 102 so that the potential immediately rises up to the second power supply voltage VDD2.

Since the bias voltage VBIAS has been applied to the gate, the transistor 91 in the voltage conversion circuit 62 is interrupted if the voltage of the converted signal LVI reaches a voltage value decreased by a transistor threshold value from the bias voltage VBIAS. Even if the transistor 86 remains in conduction, the converted signal LVI is not charged any further, and the voltage conversion circuit 62 also functions as a voltage clamping circuit.

The charge of the converted signal LVI due to the conduction of the transistor 102, is a positive feedback operation of accelerating the behavior thereof with the origin that the converted signal LVI has risen up to the inverter threshold value. Since the number of circuits simultaneously operating in parallel in the solid-state image pickup device 1, is massive, a current per circuit is set to be considerably small in the transistor 85 being the current source in the differential input circuit 61. Furthermore, since the voltage varying per unit time at which the time code switches, is the LSB step of AD conversion, the reference signal REF is extremely and gradually swept. Therefore, the variation of the gate potential of the transistor 86 is also gradual, and the variation of the output current of the transistor 86 operating with the gate potential, is also gradual. However, positive feedback from the subsequent stage is performed to the converted signal LVI charged with the output current so that the output signal VCO can sufficiently and rapidly transition. Preferably, the transition duration of the output signal VCO is a fraction of the unit time of the time code, and is typically 1 ns or less. The comparison circuit 51 according to the present disclosure, can achieve the output transition duration with the transistor 85, being the current source, including a small current of 0.1 uA only set, for example.

<Exemplary Detailed Configuration of Pixel Circuit>

A detailed configuration of the pixel circuit 41 will be described with reference to FIG. 5.

Figure 5:
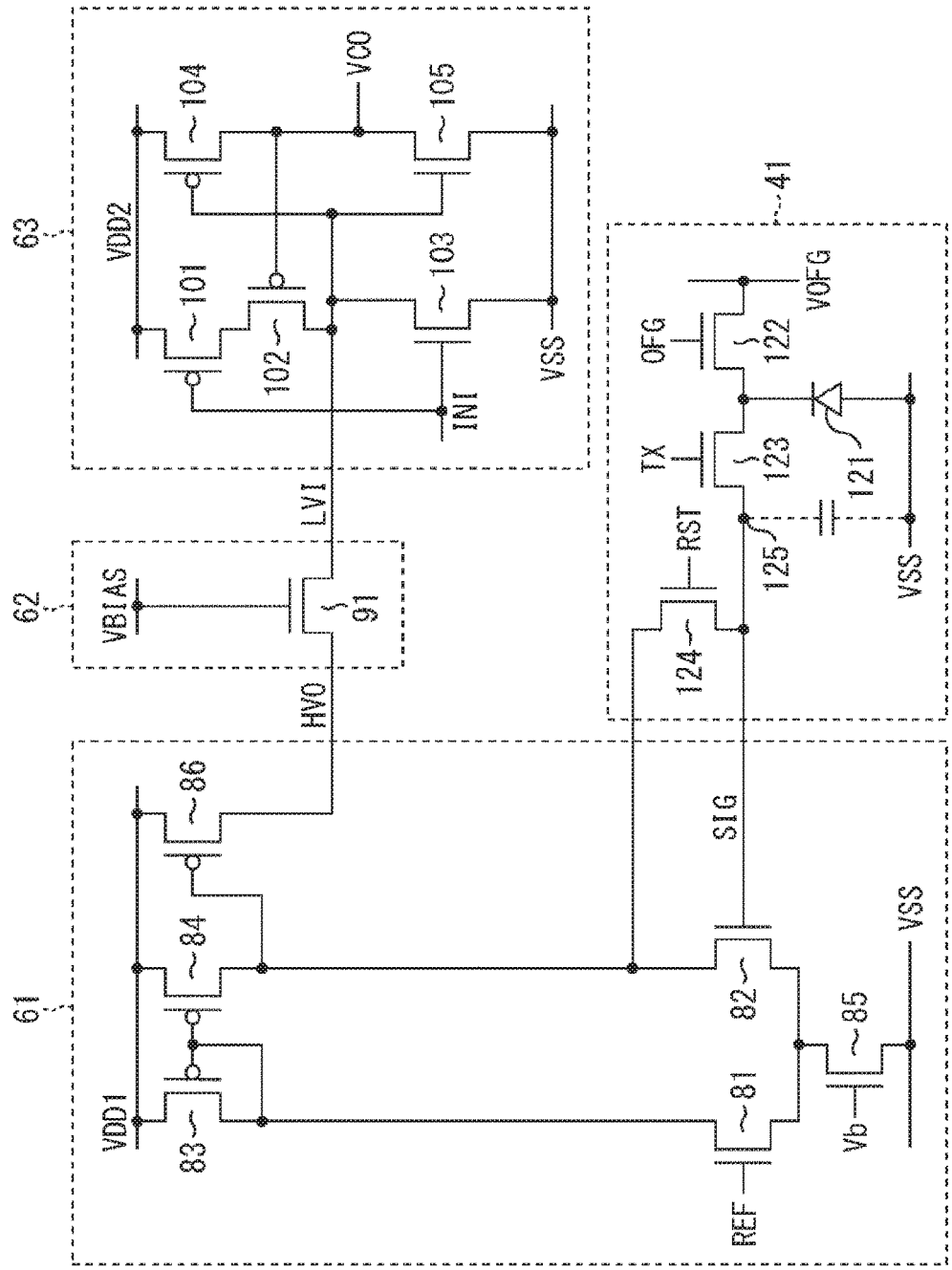
FIG. 5 is a diagram for describing a detailed configuration of a pixel circuit.

FIG. 5 is a circuit diagram of the comparison circuit 51 illustrated in FIG. 3 with the details of the pixel circuit 41 added.

The pixel circuit 41 includes a photodiode (PD) 121 being a photoelectric conversion element, a discharging transistor 122, a transferring transistor 123, a reset transistor 124, and a floating diffusion layer (FD) 125.

The discharging transistor 122 is used in a case where an exposure period is adjusted. Specifically, when the discharging transistor 122 is turned on in a case where the exposure period starts with arbitrary timing, electric charge charged in the photodiode 121 until that, is discharged so that the exposure period starts after the discharging transistor 122 is turned off.

The transferring transistor 123 transfers the electric charge generated in the photodiode 121, to the FD 125. The reset transistor 124 resets the electric charge retained in the FD 125. The FD 125 is coupled to the gate of the transistor 82 in the differential input circuit 61. With this arrangement, the transistor 82 in the differential input circuit 61 also functions as an amplifying transistor for the pixel circuit 41.

The source of the reset transistor 124 is coupled to the gate of the transistor 82 in the differential input circuit 61 and the FD 125, and the drain of the reset transistor 124 is coupled to the drain of the transistor 82. Therefore, there is no fixed reset voltage for resetting the electric charge in the FD 125. This is because the circuit state of the differential input circuit 61 is controlled so that the reset voltage for resetting the FD 125 can be arbitrarily set with the reference signal REF.

<Timing Chart of Pixel Unit>

Figure 6:
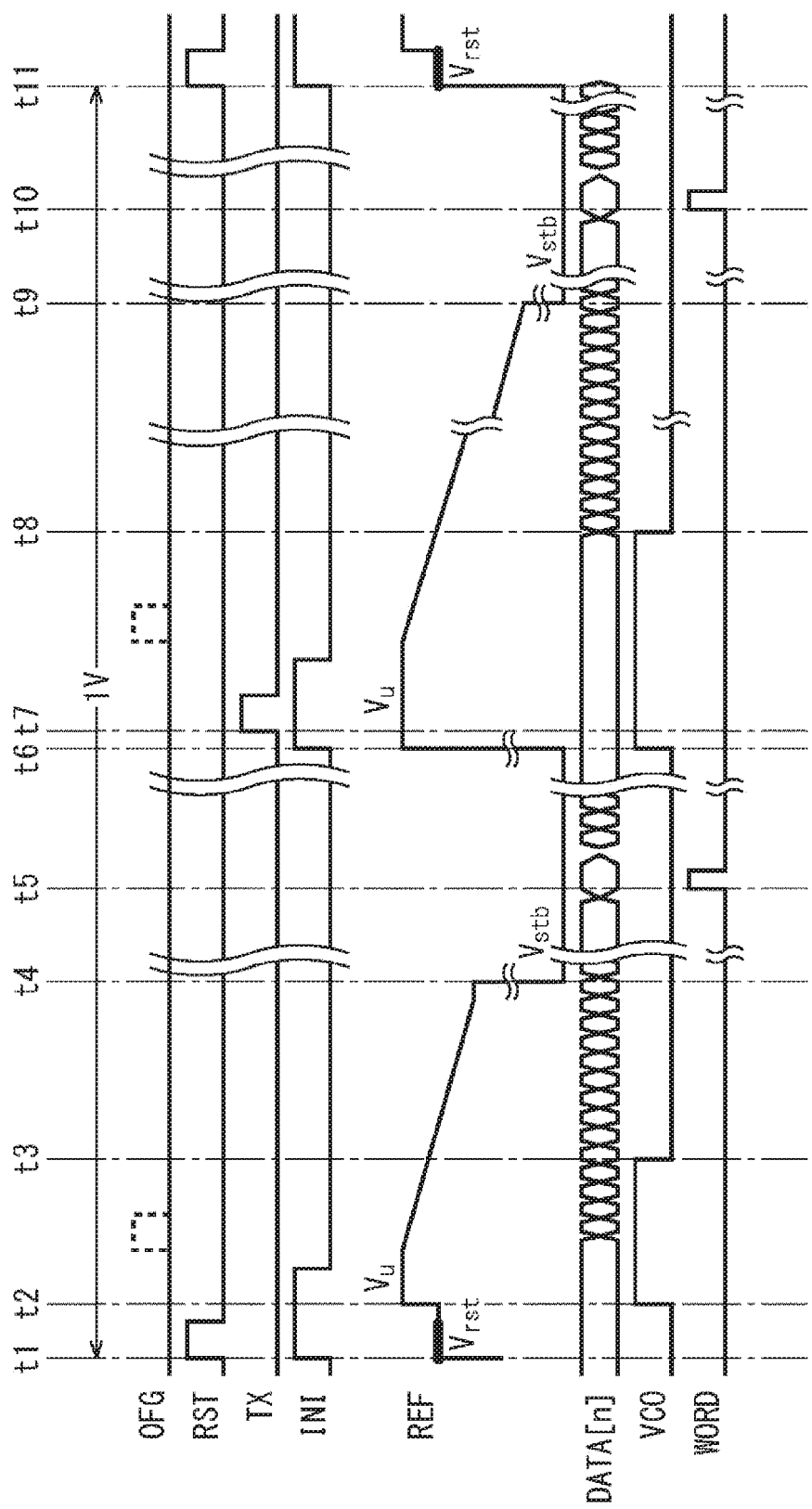
FIG. 6 is a timing chart for describing the operation of the pixel.

The operation of the pixel 21 illustrated in FIG. 5 will be described with reference to a timing chart of FIG. 6.

First, at time t1, the reference signal REF is set at a reset voltage $V_{rst}$ for resetting the electric charge in the FD 125, from a standby voltage $V_{stb}$ until time t1 and the reset transistor 124 is turned on so that the electric charge in the FD 125 is reset. In addition, at time t1, the initialization signal INI supplied to the gates of the transistors 101 and 103 in the positive feedback circuit 63, is set to be Hi so that the positive feedback circuit 63 is set in an initialization state.

At time t2, the reference signal REF rises up to a predetermined voltage $V_u$ so that comparison between the reference signal REF and the pixel signal SIG starts (sweep of the reference signal REF). At this point in time, the reference signal REF is larger than the pixel signal SIG so that the output signal VCO is Hi.

At time t3 at which it is determined that the reference signal REF and the pixel signal SIG become the same, the output signal VCO is inverted (transition to be Low). When the output signal VCO is inverted, the positive feedback circuit 63 accelerates the inversion of the output signal VCO as described above. In addition, the data storage unit 52 stores time data (N bits of DATA[1] to DATA[N]) at a point in time in which the output signal VCO is inverted.

After a signal writing period has been completed and at time t4 being the start time of a signal reading period, the voltage of the reference signal REF supplied to the gate of the transistor 81 in the comparison circuit 51, lowers down to a level at which the transistor 81 is turned off (the standby voltage $V_{stb}$). With this arrangement, the current consumption of the comparison circuit 51 during the signal reading period, is inhibited.

At time t5, the WORD signal for controlling the reading timing is turned to be Hi so that the latch control circuit 71 in the data storage unit 52 outputs an N-bit latch signal Col[n] (n=1 to N) (not illustrated). The data acquired here is P-phase data at a reset level in performing the correlated double sampling (CDS) processing.

At time t6, the reference signal REF rises up to the predetermined voltage $V_u$ and the initialization signal INI supplied to the gates of the transistors 101 and 103, is set to be Hi so that the positive feedback circuit 63 is set in the initialization state again.

At time t7, the transferring transistor 123 in the pixel circuit 41 is turned on with a transferring signal TX being Hi so that the electric charge generated in the photodiode 121 is transferred to the FD 125.

After the initialization signal INI is turned back to be Low, the comparison between the reference signal REF and the pixel signal SIG (the sweep of the reference signal REF) starts. At this point in time, the reference signal REF is larger than the pixel signal SIG so that the output signal VCO is Hi.

Then, at time t8 at which it is determined that the reference signal REF and the pixel signal SIG become the same, the output signal VCO is inverted (transition to be Low). When the output signal VCO is inverted, the positive feedback circuit 63 accelerates the inversion of the output signal VCO. In addition, the data storage unit 52 stores the time data (N bits of DATA[1] to DATA[N]) at a point in time in which the output signal VCO is inverted.

After a signal writing period has been completed and at time t9 being the start time of a signal reading period, the voltage of the reference signal REF supplied to the gate of the transistor 81 in the comparison circuit 51, lowers down to the level at which the transistor 81 is turned off (the standby voltage $V_{stb}$). With this arrangement, the current consumption of the comparison circuit 51 during the signal reading period, is inhibited.

At time t10, the WORD signal for controlling the reading timing is turned to be Hi so that the latch control circuit 71 in the data storage unit 52 outputs the N-bit latch signal Col[n] (n=1 to N) (not illustrated). The data acquired here is D-phase data at a signal level in performing the CDS processing. Time t11 is in a state the same as that at time t1 described above, and the next 1V (one vertical scanning period) is driven at time t11.

According to the drive of the pixel 21 above, at the outset, the P-phase data (the reset level) is acquired and then is read. Next, the D-phase data (the signal level) is acquired and then is read.

With the operation, a global shutter operation of simultaneously resetting all the pixels and simultaneously exposing all the pixels, can be applied to each pixel 21 in the pixel array unit 22 of the solid-state image pickup device 1. Since all the pixels can be simultaneously exposed and read, no retaining unit provided in each pixel, is not required, the retaining unit configured to retain electric charge until the electric charge is read. In addition, with the configuration of each pixel 21, no selection transistor necessary for a column-parallel-reading-typed solid-state image pickup device, is also required, the selection transistor being configured to select the pixel that outputs the pixel signal SIG.

The discharging transistor 122 is controlled to remain off in the drive of the pixel 21 described with reference to FIG. 6. However, as indicated with a broken line in FIG. 6, a discharging signal OFG is set to be Hi at desired time and the discharging transistor 122 is temporarily turned on and then is turned off so that an arbitrary exposure period can be set.

<4. Second Exemplary Configuration of Comparison Circuit>

Figure 7:
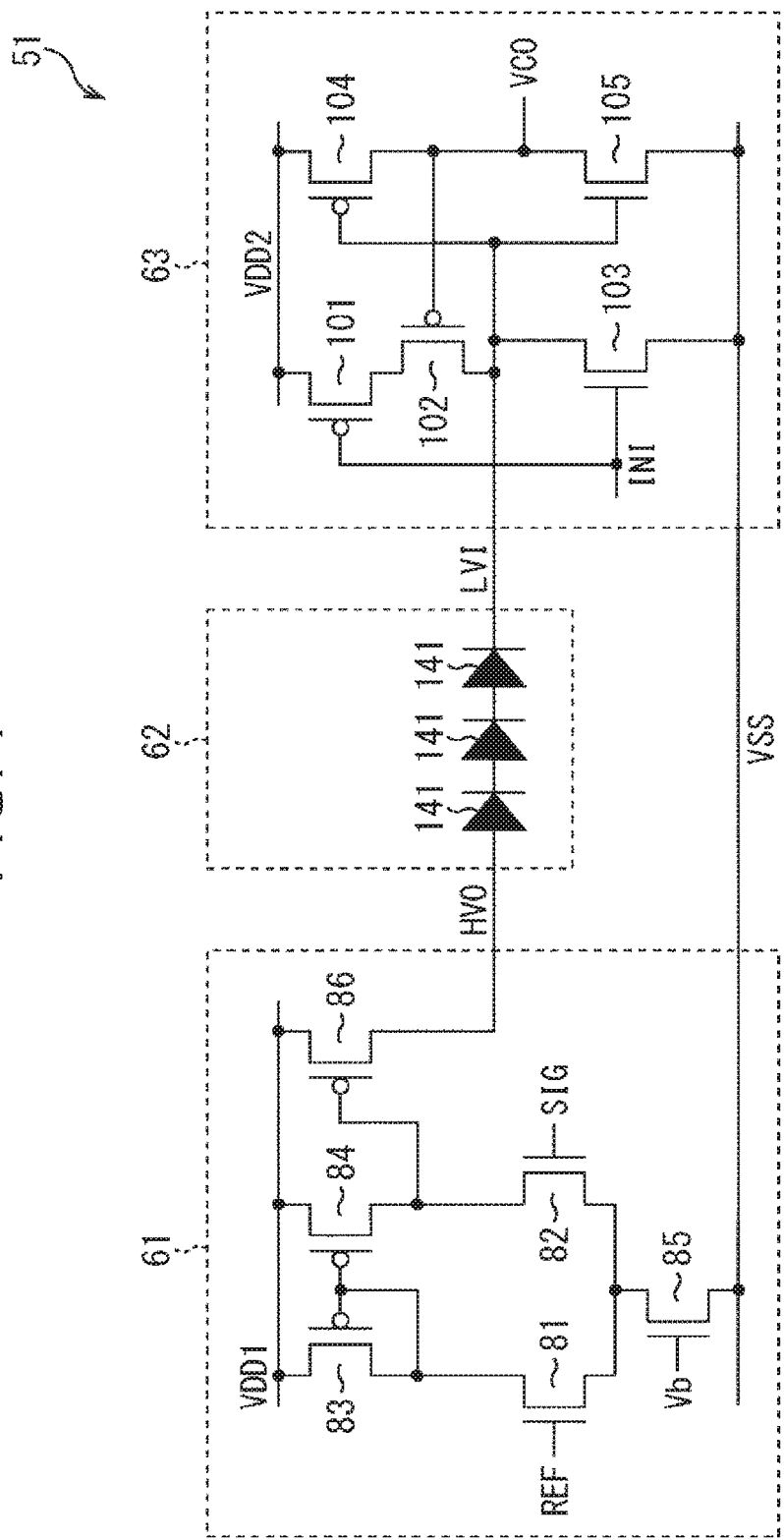
FIG. 7 is a circuit diagram of a second exemplary configuration of the comparison circuit.

FIG. 7 is a circuit diagram of a second exemplary configuration of the comparison circuit 51.

In FIG. 7, units corresponding to those in the first exemplary configuration illustrated in FIG. 3, are denoted with the same reference signs, and thus the descriptions thereof will be appropriately omitted. From FIG. 8 onward will be in a similar manner.

The second exemplary configuration of the comparison circuit 51 is different from the first exemplary configuration illustrated in FIG. 3 in terms of only the configuration of the voltage conversion circuit 62. More specifically, the voltage conversion circuit 62 includes a plurality of diodes 141 (three in FIG. 7) coupled in series, instead of the transistor 91. The diodes 141 each may be a junction diode or may be a MOS transistor including diode connection.

<5. Third Exemplary Configuration of Comparison Circuit>

Figure 8:
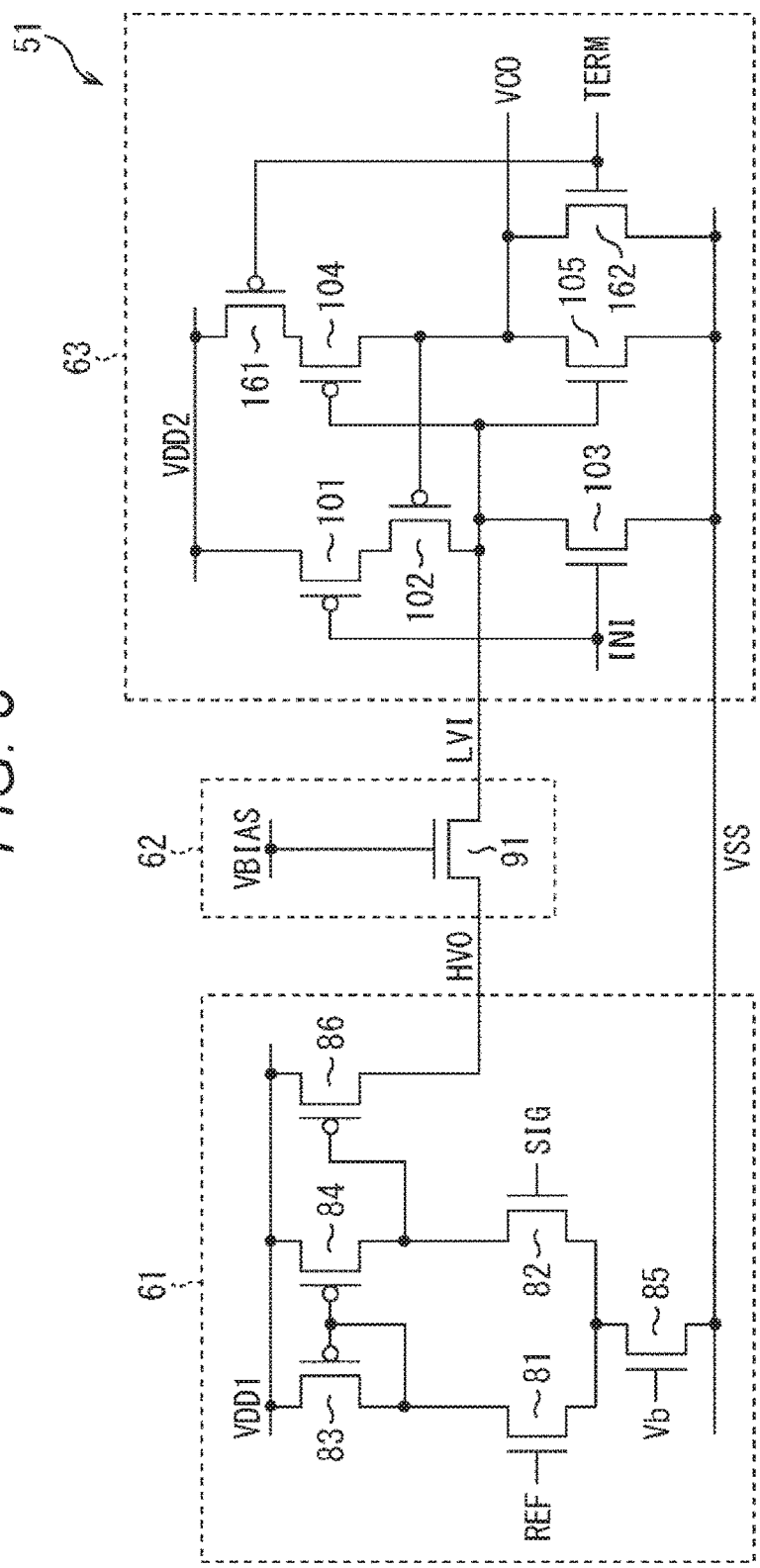
FIG. 8 is a circuit diagram of a third exemplary configuration of the comparison circuit.

FIG. 8 is a circuit diagram of a third exemplary configuration of the comparison circuit 51.

The third exemplary configuration of the comparison circuit 51 is similar to the first exemplary configuration illustrated in FIG. 3 except that the positive feedback circuit 63 includes two transistors 161 and 162 added.

In the third exemplary configuration, the inverter circuit in the positive feedback circuit 63 in the first exemplary configuration is replaced with a two-input NOR circuit. The gate of the transistor 161 including a PMOS transistor and the gate of the transistor 162 including an NMOS transistor are supplied with a control signal TERM being a second input instead of the converted signal LVI being a first input.

The source of the transistor 161 is coupled to the second power supply voltage VDD2, and the drain of the transistor 161 is coupled to the source of the transistor 104. The drain of the transistor 162 is coupled to the output end of the comparison circuit 51, and the source of the transistor 162 is coupled to the predetermined voltage VSS.

In the third exemplary configuration of the comparison circuit 51 having the configuration, when the control signal TERM being the second input is turned to be Hi, the output signal VCO can be made to be Lo regardless of the state of the differential input circuit 61.

For example, when the voltage of the pixel signal SIG falls below the final voltage of the reference signal REF due to high brightness exceeding an assumption (e.g., an sun's image introduced in the angle of field of the solid-state image pickup device 1), a comparison period is completed with the output signal VCO of the comparison circuit 51, remaining Hi. Thus, the data storage unit 52 controlled with the output signal VCO cannot fix a value so that an AD conversion function is lost. In order to prevent the state from occurring, the control signal TERM having a Hi pulse is input at the end of the sweep of the reference signal REF so that the output signal VCO that has still not been inverted to be Lo, can be forcedly inverted. The data storage unit 52 stores (latches) the time code just before the enforced inversion so that, in a case where the configuration of FIG. 8 has been adopted, the ADC 42 accordingly functions as an AD converter including an output value to brightness input having a certain level or more, the output value being clamped.

The bias voltage VBIAS is controlled to be at the Lo level so that the transistor 91 is interrupted. Then, the initialization signal INI is turned to be Hi so that the output signal VCO is turned to be Hi regardless of the state of the differential input circuit 61. Therefore, the enforced Hi output of the output signal VCO and the enforced Lo output due to the control signal TERM described above, are combined so that the value of the output signal VCO can be arbitrarily set regardless of the state of the differential input circuit 61 and the states of the pixel circuit 41 and the DAC 25 each being the previous stage thereof. With this function, for example, the pixel 21 can examine a circuit at the subsequent stage, with only an electric signal input without an optical input to the solid-state image pickup device 1.

<6. Fourth Exemplary Configuration of Comparison Circuit>

Figure 9:
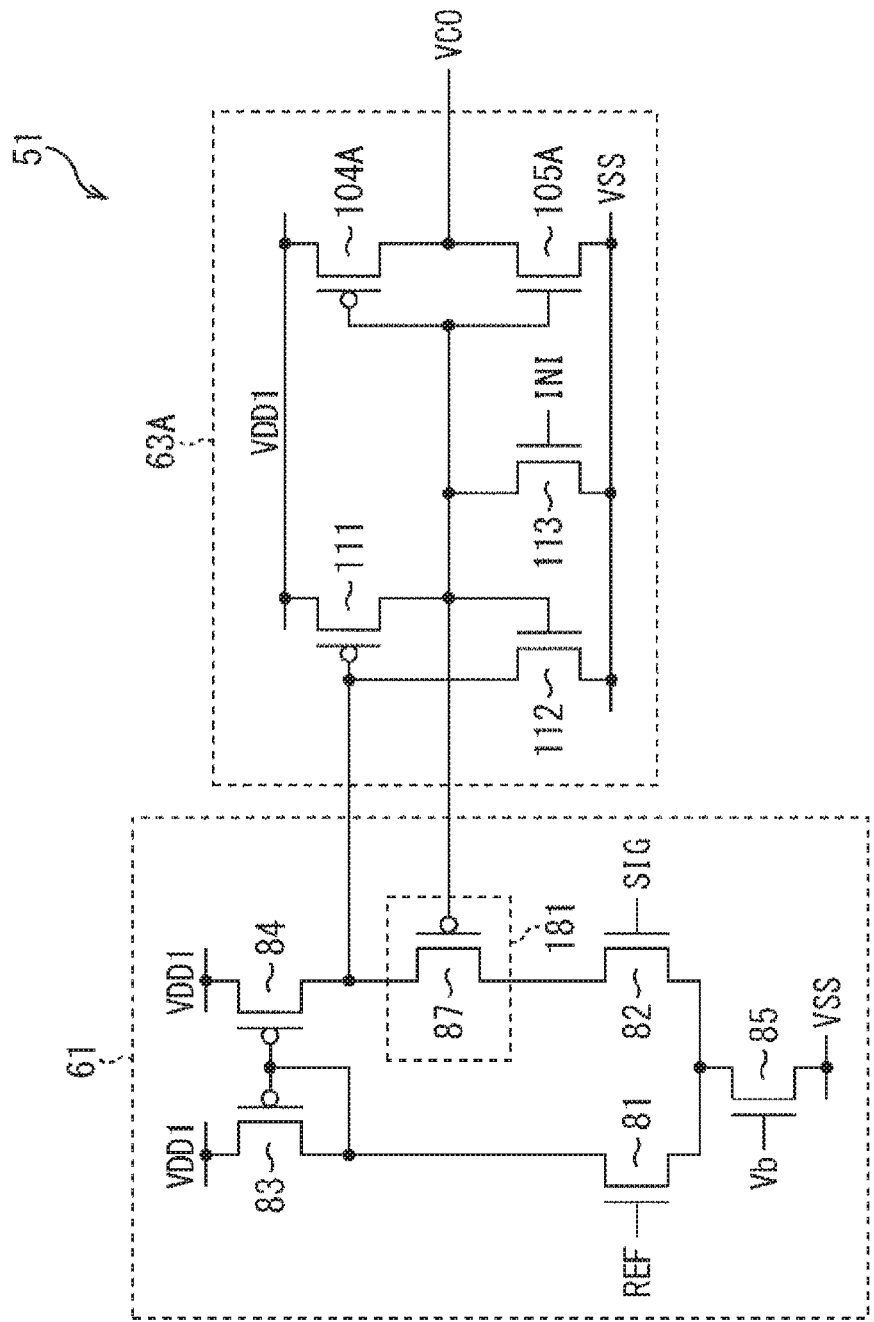
FIG. 9 is a circuit diagram of a fourth exemplary configuration of the comparison circuit.

FIG. 9 is a circuit diagram of a fourth exemplary configuration of the comparison circuit 51.

The comparison circuit 51 of FIG. 9 includes the differential input circuit 61 and a positive feedback circuit 63A, and the entire comparison circuit 51 including a high voltage circuit and excluding the voltage conversion circuit 62, is illustrated. Note that, in FIG. 9, units corresponding to those in the first exemplary configuration illustrated in FIG. 3, are denoted with the same reference signs, and thus the descriptions thereof will be appropriately omitted.

A PMOS transistor 87 as a current limiting unit 181 is coupled between the transistors 82 and 84 in the differential input circuit 61 in the fourth exemplary configuration of the comparison circuit 51. In addition, the positive feedback circuit 63A includes three transistors 111 to 113 and transistors 104A and 105A included in an inverter.

The drain of the transistor 84 is coupled to the source of the transistor 87 and the gate of the transistor 111, and the drain of the transistor 82 is coupled to the drain of the transistor 87 being the current limiting unit 181. The gate of the transistor 87 is coupled to the respective drains of the transistors 111 to 113 in the positive feedback circuit 63A.

The operation of the comparison circuit 51 in the fourth exemplary configuration, will be described.

The differential amplifier circuit 61 compares the reference signal REF input into the gate of the transistor 81 and the pixel signal SIG input into the gate of the transistor 82 so that the output signal VCO is inverted to be Low from Hi when the reference signal REF and the pixel signal SIG become the same (voltage).

In a case where the output signal VCO has been inverted to be Low from Hi, the transistor 111 in the positive feedback circuit 63A is turned on so that the drain voltage rises up. Since the drain of the transistor 111 is coupled to the gate of the transistor 112, the transistor 112 is turned on. Turning the transistor 112 on couples the gate of the transistor 111 to the predetermined potential VSS so that the output signal VCO sharply lowers down. With this arrangement, the transistor 111 is made into a further strong on-state and simultaneously the transistor 112 is also made into a further strong on-state.

The function of the current limiting unit 181 will be described.

If the transistor 87 being the current limiting unit 181 is not provided, a considerably large current for accelerating the output signal VCO, that flows from the transistor 84 in the differential input circuit 61 to the transistor 112 in the positive feedback circuit 63A, is made to be flowing.

However, the transistor 87 being the current limiting unit 181 is inserted between the transistors 82 and 84 in the differential input circuit 61 so that the considerably large current flowing from the transistor 84 in the differential input circuit 61 to the transistor 112 in the positive feedback circuit 63A is limited after the output signal VCO is inverted. The quantity of the current when the limitation is made, is determined with a current that flows into the transistors 83 and 84 of the current mirror in the differential input circuit 61, and the current that flows into the transistors 83 and 84 of the current mirror, is determined with the input bias current Vb of the transistor 85 being the constant current source so as to be the current IB flowing through the transistor 85.

Therefore, the current IB limited with the input bias current Vb, first flows in a state where the reference signal REF is larger than the pixel signal SIG, during a series of operations of the comparison circuit 51. Then, when the reference signal REF and the pixel signal SIG become the same, a considerably large current instantaneously flows in the comparison circuit 51 so that the inversion of the output signal VCO is accelerated. Then, after the inversion of the output signal VCO, the current IB limited with the input bias current Vb and the mirror current IB flow into the comparison circuit 51. Therefore, the current limiting unit 181 is provided so that the current flowing in the comparison circuit 51 becomes 2IB double the initial current IB after the comparison determination.

<Exemplary Circuit Layouts>

FIGS. 10A and 10B are plan views of the circuit layouts of the first exemplary configuration of the comparison circuit 51 illustrated in FIG. 3 and the fourth exemplary configuration of the comparison circuit 51 illustrated in FIG. 9.

FIG. 10A illustrates the circuit layout of the first exemplary configuration illustrated in FIG. 3, and FIG. 10B illustrates the circuit layout of the fourth exemplary configuration illustrated in FIG. 9. Note that, the illustrations of the transistors 81, 82, and 85 are omitted in the circuit layouts in FIG. 10A and FIG. 10B.

The pixel circuit 41 requires a large potential operation, namely, a high voltage circuit operation in order to thoroughly retain or move electric charge induced by exposure. Similarly, the differential input circuit 61 that inputs a pixel signal voltage, necessarily includes a high-withstand-voltage element against approximately 3 V.

Similarly, the positive feedback circuit 63A includes a high-withstand-voltage element in the comparison circuit 51 with the fourth exemplary configuration illustrated in FIG. 10B.

In contrast to this, in the comparison circuit 51 having the first exemplary configuration illustrated in FIG. 10A, each transistor in the positive feedback circuit 63 can include, for example, a transistor having a withstanding voltage of approximately 1 V so that the layout area can be reduced as is obvious from FIGS. 10A and 10B.

In addition, as described above, the operation current after the inversion of the output signal VCO, is 2IB double the initial current IB in the comparison circuit 51 with the fourth exemplary configuration. However, after the inversion of the output signal VCO, the operation current is still equivalent to the output current of 85 so as to remain constant in the comparison circuit 51 with the first exemplary configuration.

Thus, the comparison circuit 51 with the first exemplary configuration can improve the determining speed of the comparison circuit 51 and can further reduce power consumption in comparison to the comparison circuit 51 with the fourth exemplary configuration.

Note that, the comparison circuit 51 with the second exemplary configuration and the comparison circuit 51 with the third exemplary configuration, each have an effect similar to that of the comparison circuit 51 with the first exemplary configuration.

<7. First Exemplary Configuration of Joint Pixels>

Figure 11:
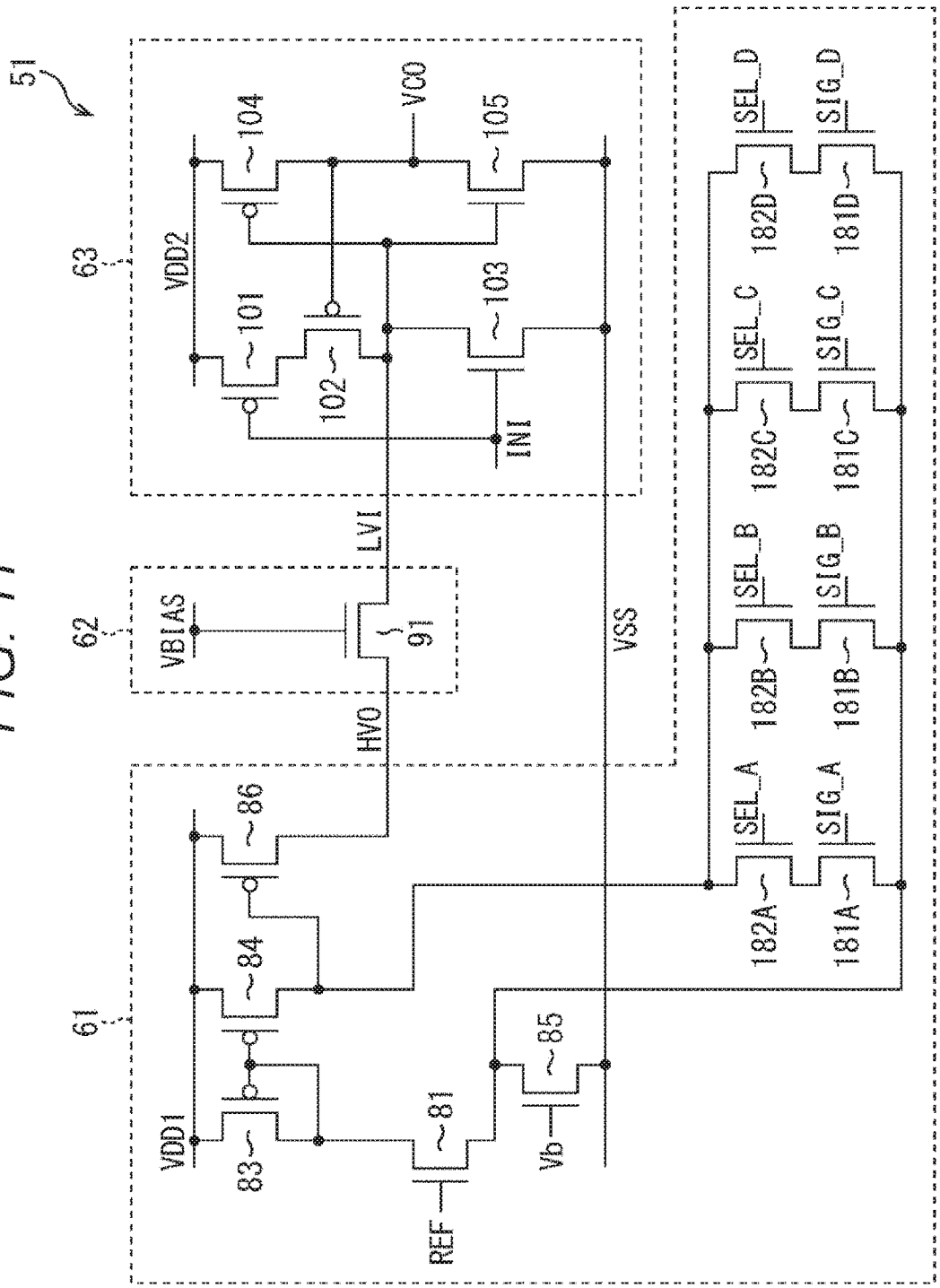
FIG. 11 is a circuit diagram of an exemplary configuration of the comparison circuit in a case of joint pixels.

One ADC 42 is arranged in one pixel 21 for each of the comparison circuits 51 described above, but one ADC 42 can be shared between a plurality of pixels 21. FIG. 11 is a circuit diagram of an exemplary configuration of the comparison circuit 51 in a case of joint pixels in which one ADC 42 is shared between a plurality of pixels 21.

FIG. 11 illustrates the exemplary configuration of the comparison circuit 51 in a case where one ADC 42 is shared between four pixels 21 including a pixel 21A, a pixel 21B, a pixel 21C, and a pixel 21D.

Specifically, a transistor 181A into which a pixel signal SIG_A is input from the pixel circuit 41 in the pixel 21A and a selection transistor 182A that activates the transistor 181A, are provided between the drain of the transistor 85 and the drain of the transistor 84. Similarly, a transistor 181B into which a pixel signal SIG_B is input from the pixel circuit 41 in the pixel 21B and a selection transistor 182B that activates the transistor 181B, a transistor 181C into which a pixel signal SIG_C is input from the pixel circuit 41 in the pixel 21C and a selection transistor 182C that activates the transistor 181C, and a transistor 181D into which a pixel signal SIG_D is input from the pixel circuit 41 in the pixel 21D and a selection transistor 182D that activates the transistor 181D, are coupled in parallel to the transistor 181A and the selection transistor 182A.

<8. Second Exemplary Configuration of Joint Pixels>

Figure 12:
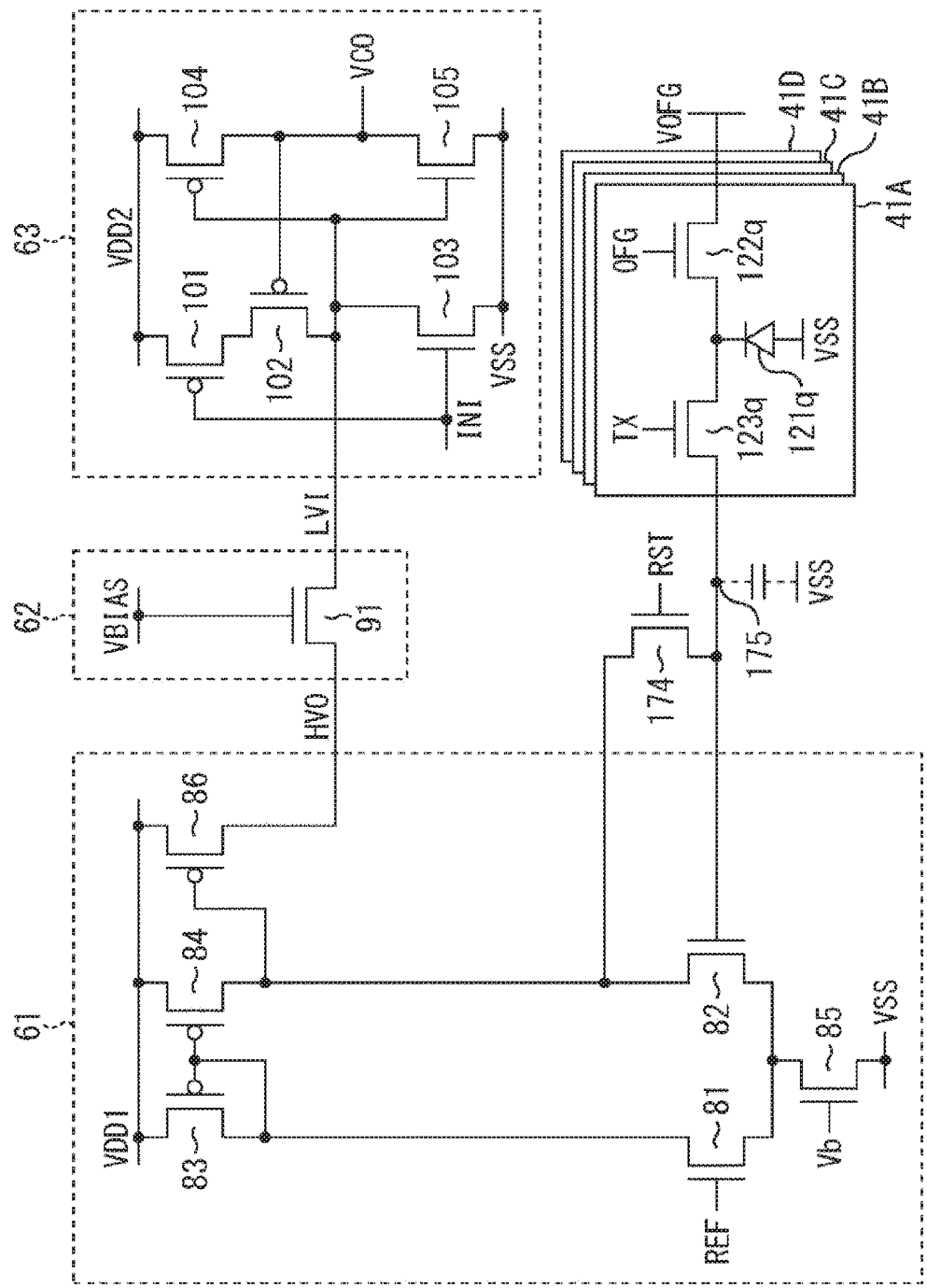
FIG. 12 is a circuit diagram of an exemplary configuration of the comparison circuit in the case of joint pixels.

In addition, a configuration illustrated in FIG. 12 can be also adopted in a case where one ADC 42 is shared between the four pixels 21A to 21D.

In FIG. 12, the configuration of the differential input circuit 61, the voltage conversion circuit 62, and the positive feedback circuit 63 included in the comparison circuit 51, is similar to the configuration illustrated in FIG. 3.

In FIG. 12, pixel circuits 41A to 41D are provided to the four pixels 21A to 21D, respectively, and the pixel circuits 41A to 41D individually include a photodiode 121$q$, a discharging transistor 122$q$, and a transferring transistor 123$q$ provided. Meanwhile, a reset transistor 174 and an FD 175 are shared between the four pixels 21A to 21D.

Note that, the circuit configuration illustrated in FIG. 3 has been adopted as the circuit configuration of the comparison circuit 51 in FIG. 12, but a different circuit configuration may be adopted.

<9. First Exemplary Configuration of Time Code Transferring Unit and Data Storage Unit>

Figure 13:
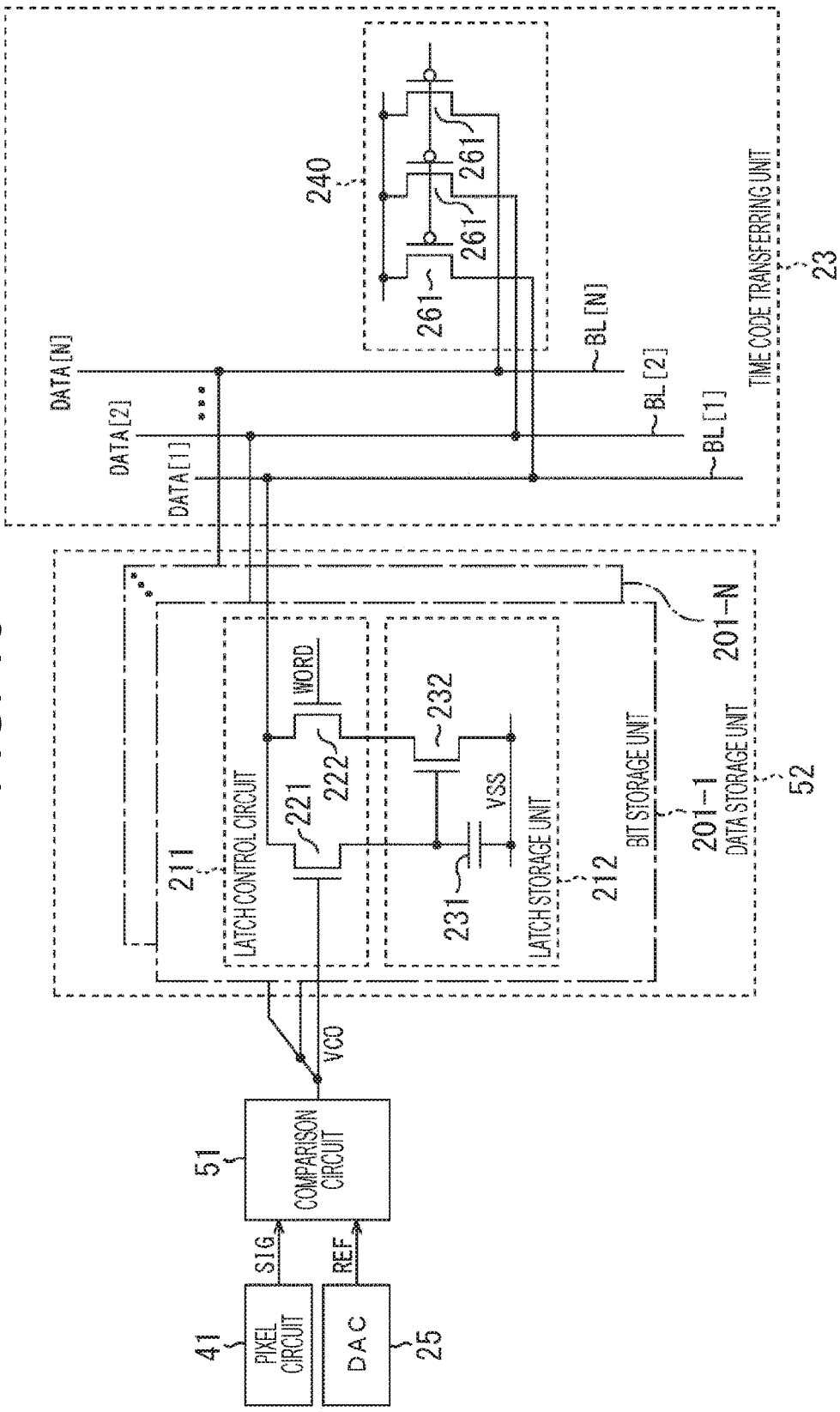
FIG. 13 is a circuit diagram of a first exemplary configuration of a time code transferring unit and a data storage unit.

Next, writing control and reading control of a time code, will be described. FIG. 13 is a circuit diagram of a first exemplary configuration of the time code transferring unit 23 and the data storage unit 52.

The data storage unit 52 includes N bit storage units 201-1 to 201-N provided corresponding to the time code indicated with N bits of DATA[1] to DATA[N].

The bit storage unit 201-$n$ (n=1 to N) includes a latch control circuit 211 that controls the writing and reading of the time code, and a latch storage unit 212 that stores bit data. The latch control circuit 211 of each of the N bit storage units 201-1 to 201-N corresponds to the latch control circuit 71 of FIG. 1, and the latch storage unit 212 of each of the N bit storage units 201-1 to 201-N corresponds to the latch storage unit 72 of FIG. 1. Here, the reading of the time code means the reading of the inverted time code when the output signal VCO is inverted, namely, the AD conversion pixel data.

The latch control circuit 211 includes two NMOS transistors 221 and 222, and the latch storage unit 212 includes a capacitance unit 231 and an NMOS transistor 232.

The time code transferring unit 23 includes passive conductive lines BL[1] to BL[N] through which the N bits of DATA[1] to DATA[N] are transmitted, respectively, and a pre-charging circuit 240 that pre-charges capacitors (not illustrated) with a predetermined potential, the capacitors being in the output unit 28 coupled to the ends of the conductive lines BL[1] to BL[N]. The pre-charging circuit 240 includes, for example, N PMOS transistors 261 provided to the conductive lines BL[1] to BL[N] on a one-to-one basis.

The output signal VCO of the comparison circuit 51 is input to the gate of the transistor 221 in the n-th bit latch control circuit 211-$n$. The drains of the transistors 221 and 222 in the latch control circuit 211-$n$, are coupled to the conductive line BL[n] through which the n-th bit DATA[n] is transmitted, in the time code transferring unit 23. The WORD signal for controlling the reading timing of the time code, is input to the gate of the transistor 222 in the latch control circuit 211-$n$.

In the writing operation of the time code, the transistor 222 is supplied with the WORD signal being Lo, and the transistor 221 is made into conduction only while the output signal VCO being Hi is being input from the comparison circuit 51. During the output signal VCO being Hi, the capacitance unit 231 stores the n-th bit time code switching per unit time, generated by the time code generating unit 26, through the conductive line BL[n]. The N bits of DATA[1] to DATA[N] generated by the time code generating unit 26, each are a bit signal, such as a Gray code.

In the reading operation of the time code, first, the pre-charging circuit 240 in the time code transferring unit 23, pre-charges the capacitors (not illustrated) in the output unit 28 coupled to the ends of the conductive lines BL[1] to BL[N], with the predetermined potential.

Then, the WORD signal being Hi is supplied to the transistor 222 in the latch control circuit 211 of the pixel 21 to be read. In this case, if the capacitance unit 231 has been charged, the transistor 232 is made into conduction so that the potential pre-charged in the corresponding capacitor in the output unit 28 is discharged. If the capacitance unit 231 has not been charged, the potential pre-charged in the corresponding capacitor in the output unit 28 is not discharged so that the potential that has been pre-charged is retained. The output unit 28 determines the variation of the potential with a sense amplifier (not illustrated) so that the time code retained in the latch storage unit 212 can be read. The reading processing is sequentially performed to all the pixels 21 in the pixel array unit 22.

<10. Second Exemplary Configuration of Time Code Transferring Unit and Data Storage Unit>

Figure 14:
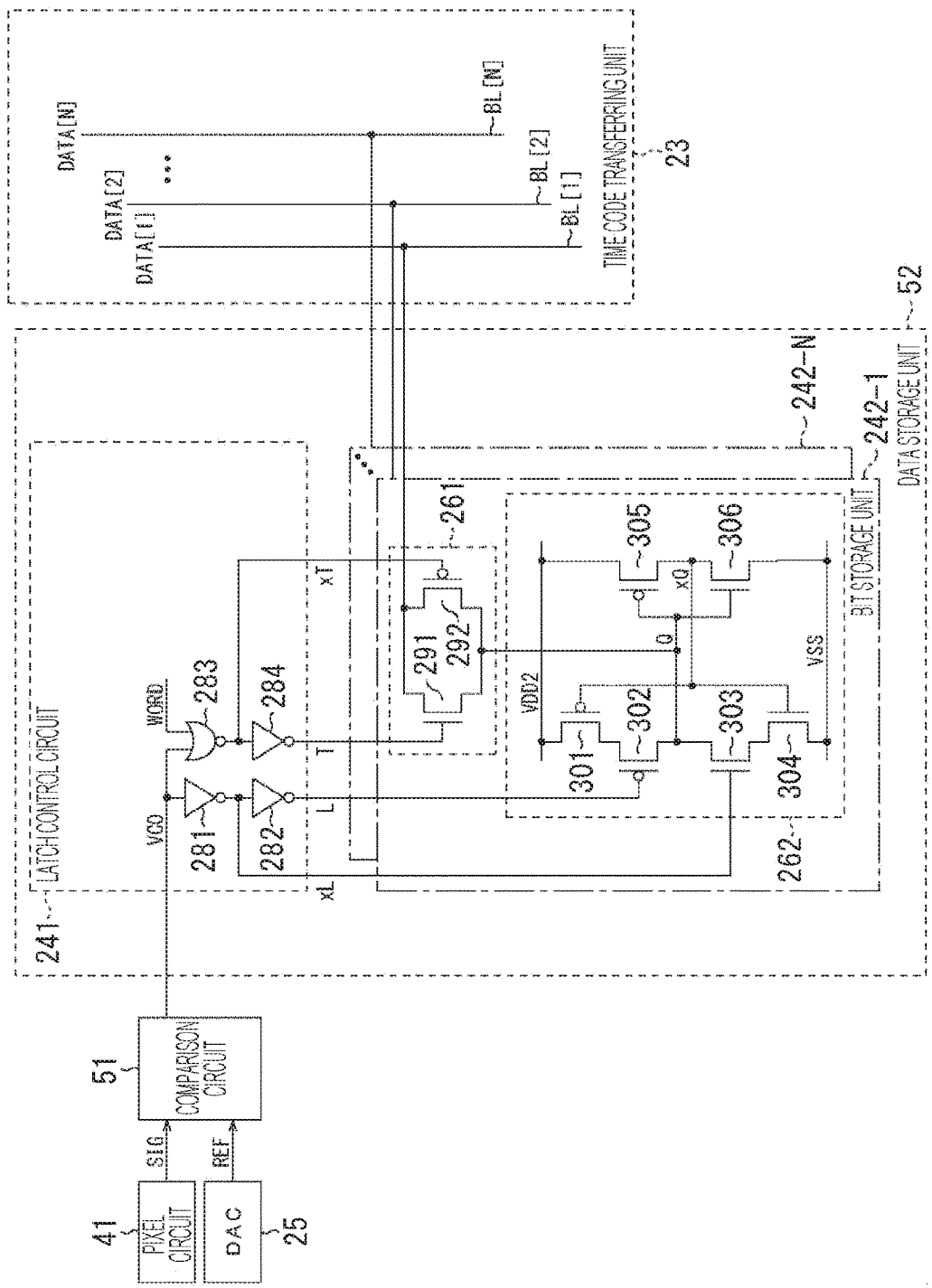
FIG. 14 is a circuit diagram of a second exemplary configuration of the time code transferring unit and the data storage unit.

FIG. 14 is a circuit diagram of a second exemplary configuration the time code transferring unit 23 and the data storage unit 52.

In the second exemplary configuration, the data storage unit 52 includes one latch control circuit 241 and N bit storage units 242-1 to 242-N. In the second exemplary configuration, the one latch control circuit 241 supplies the output signal VCO and the WORD signal to the N bit storage units 242-1 to 242-N. The bit storage units 242-1 to 242-N each include a transfer gate 261 and a latch storage unit 262.

Therefore, the latch control circuit 211 is provided to each of the bit storage units 201-1 to 201-N in the first exemplary configuration of FIG. 13, whereas the latch control circuit 241 is provided outside the bit storage units 242-1 to 242-N so as to be shared between the bit storage units 242-1 to 242-N in the second exemplary configuration. The latch control circuit 241 corresponds to the latch control circuit 71 of FIG. 1, and the bit storage units 242-1 to 242-N correspond to the latch storage unit 72 of FIG. 1.

The latch control circuit 241 includes two inverters 281 and 282 coupled in series and a NOR circuit 283 and an inverter 284 coupled in series.

The transfer gate 261 in the bit storage unit 242-*n*, includes two transistors 291 and 292, the transistor 291 including an NMOS transistor, the transistor 292 including a PMOS transistor.

The latch storage unit 262 in the bit storage unit 242-*n*, includes a static latch circuit including transistors 301 to 306. The transistors 301, 302, and 305 each include a PMOS transistor, and the transistors 303, 304, and 306 each include an NMOS transistor.

The output signal VCO being an output from the comparison circuit 51, is input into the inverter 281 and the NOR circuit 283, and the WORD signal is supplied to the other input of the NOR circuit 283. The output of the inverter 281 is supplied to the inverter 282 and the gate of the transistor 303 in the latch storage unit 262, and the output of the inverter 282 is supplied to the gate of the transistor 302 in the latch storage unit 262. In addition, the output of the NOR circuit 283 is supplied to the inverter 284 and the gate of the transistor 292 in the transfer gate 261, and the output of the inverter 284 is supplied to the gate of the transistor 291 in the transfer gate 261.

In the writing operation of the time code, the WORD signal is turned to be Lo for all the pixels, and the transfer gate 261 is made into conduction when the output signal VCO is Hi and the transfer gate 261 is interrupted when the output signal VCO is Lo. The feedback of the latch storage unit 262 (output xQ to input Q) is interrupted when the output signal VCO is Hi, and the feedback of the latch storage unit 262 is made into conduction when the output signal VCO is Lo. Therefore, the latch storage unit 262 is made into the writing state of the n-th bit time code (transparent) when the output signal VCO is Hi, and the latch storage unit 262 is made into the retaining state of the time code that has been written (latch state) when the output signal VCO is Lo.

In the reading operation of the time code, the WORD signal is supplied only to the latch control circuit 241 in the pixel 21 to be read. Since the output signal VCO is Lo, the transfer gate 261 is made into conduction only when the WORD signal being Hi is input, so that the time code retained in the latch storage unit 212 is output to the time code transferring unit 23.

Therefore, an operation similar to that in the first exemplary configuration, is performed even in the second exemplary configuration.

<11. Third Exemplary Configuration of Time Code Transferring Unit and Data Storage Unit>

Figure 15:
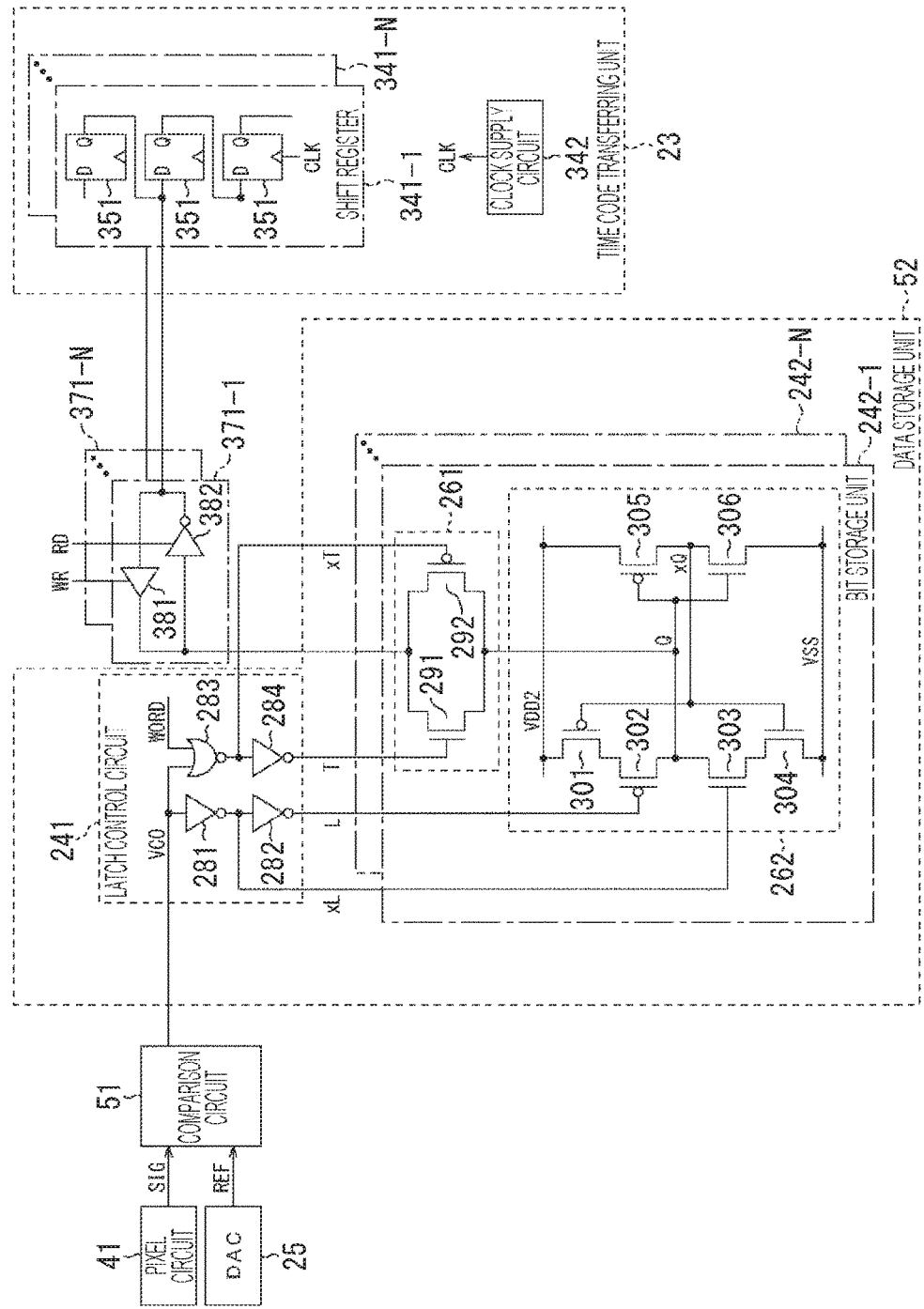
FIG. 15 is a circuit diagram of a third exemplary configuration of the time code transferring unit and the data storage unit.

FIG. 15 is a circuit diagram of a third exemplary configuration of the time code transferring unit 23 and the data storage unit 52.

In the third exemplary configuration, the time code transferring unit 23 includes N shift registers 341-1 to 341-N corresponding to the N-bit time code DATA[1] to DATA[N], respectively, and a clock supply circuit 342. The N shift registers 341-1 to 341-N each include a plurality of D-flip-flops (D-F/F) 351. The clock supply circuit 342 supplies a clock signal CLK to the clock input of each D-F/F 351 in the shift register 341.

The data storage unit 52 includes the latch control circuit 241 and the N bit storage units 242-1 to 242-N similar to those in the second exemplary configuration illustrated in FIG. 14. Furthermore, in the third exemplary configuration, N interactive buffer circuits 371-1 to 371-N are newly added between the time code transferring unit 23 and the data storage unit 52.

The N interactive buffer circuits 371-1 to 371-N are provided to the N shift registers 341-1 to 341-N in the time code transferring unit 23, on a one-to-one basis. The interactive buffer circuit 371 is coupled to one D-F/F 351 in the corresponding shift register 341.

A buffer circuit 381 in the interactive buffer circuit 371-*n* is supplied with the writing control signal WR being Hi in the writing operation of the time code, and an inverter circuit 382 is supplied with the reading control signal RD being Hi in the reading operation of the time code. The interactive buffer circuit 371-*n* makes a switch between the writing operation and the reading operation of the time code with respect to the bit storage unit 242-*n*, on the basis of the writing control signal WR and the reading control signal RD.

The bit storage units 242-1 to 242-N each include a configuration similar to that in the second exemplary configuration illustrated in FIG. 14.

During the AD conversion period during which the sweep of the reference signal REF is performed, the N shift registers 341 in the time code transferring unit 23, each transfer the time code supplied from the time code generating unit 26, with a shift clock having a clock cycle being the unit time of the time code.

In the writing operation of the time code, the writing control signal WR being Hi and the reading control signal RD being Lo are supplied to the interactive buffer circuit 371, and the interactive buffer circuit 371 supplies the time code supplied from the predetermined D-F/F 351 of the shift register 341, to the bit storage unit 242 through the transfer gate 261. The bit storage unit 242 stores the time code that has been supplied.

In the next reading operation of the time code, the time code stored in the bit storage unit 242 is supplied to the predetermined D-F/F 351 of the shift register 341 in the time code transferring unit 23, through the interactive buffer circuit 371. The shift register 341 sequentially transfers the time data supplied to each staged D-F/F 351, to the output unit 28 so that output is performed.

More specifically, each D-F/F 351 of the shift register 341 adopts a configuration so as to be made into a high-impedance state (hereinafter, referred to as a Hi-Z state) with the clock signal CLK, supplied to the clock input, being Hi or Lo. For example, with configurations of a D-F/F 351 to be described later in FIGS. 16 and 17, the D-F/F 351 is made into the Hi-Z state when the clock signal CLK is Lo.

During a period during which each D-F/F 351 in the shift register 341 has been made into the Hi-Z state, the reading control signal RD being Hi is supplied to the interactive buffer circuit 371 and the WORD signal is turned to be Hi, so that the time code stored in the bit storage unit 242 is supplied to the predetermined D-F/F 351 in the shift register 341 of the time code transferring unit 23, through the interactive buffer circuit 371.

After the reading control signal RD is turned back to be Lo, the shift clock is supplied to each D-F/F 351 in the shift register 341. Then, the shift register 341 sequentially transfers the time data supplied to each staged D-F/F 351, to the output unit 28 so that output is performed.

<Exemplary Configuration of D-F/F>

Figure 16:
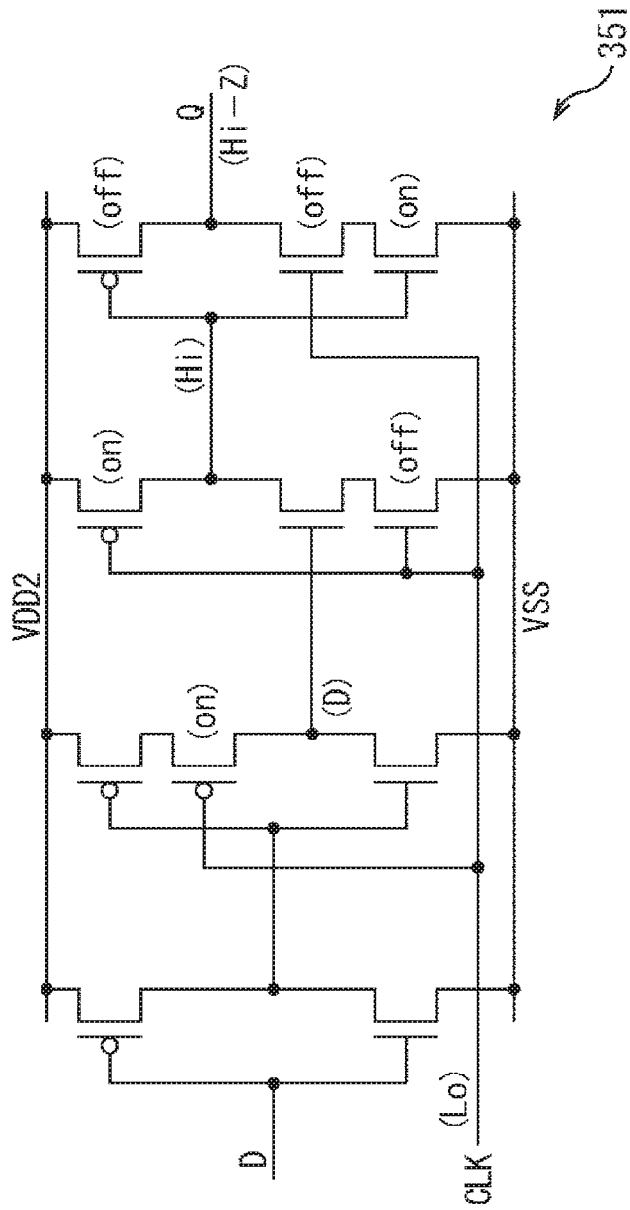
FIG. 16 is a diagram of a first exemplary configuration of a D-F/F of a shift register.

FIG. 16 illustrates a first exemplary configuration of the D-F/F 351 in the shift register 341.

In FIG. 16, a letter, such as on or off, indicated with brackets, in proximity to each transistor and signal line, indicates the potential state of each transistor and signal line when the clock signal CLK being Lo is input to the clock input.

As illustrated in FIG. 16, the D-F/F 351 is made into the Hi-Z state in a case where the clock signal CLK being Lo has been input into the D-F/F 351.

Figure 17:
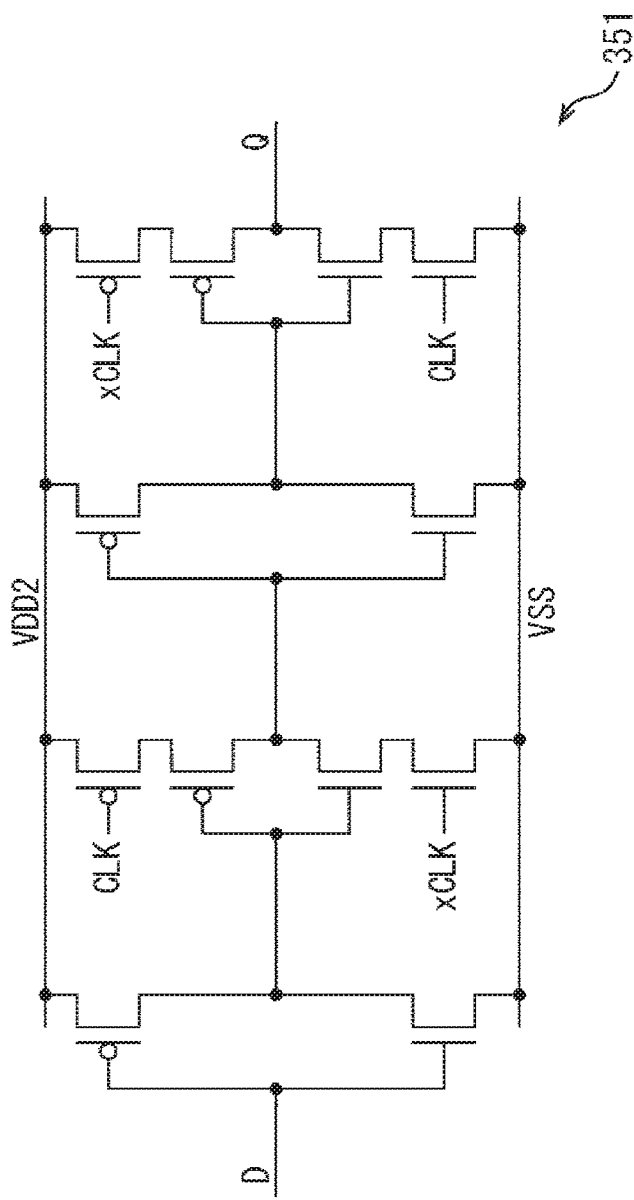
FIG. 17 is a diagram of a second exemplary configuration of the D-F/F of the shift register.

FIG. 17 illustrates a second exemplary configuration of the D-F/F 351 in the shift register 341.

The D-F/F 351 includes two clocked inverters each using complementary clock signals CLK and xCLK and two consecutively operating inverters, and is a flip-flop including the clocked inverter, the consecutively operating inverter, the clocked inverter, and the consecutively operating inverter, coupled in this order from the input side. The D-F/F 351 of FIG. 17 is made into the Hi-Z state when the clock signal CLK is Lo and the inverted clock signal xCLK is Hi.

<Exemplary Configuration of Interactive Buffer Circuit>

Figure 18:
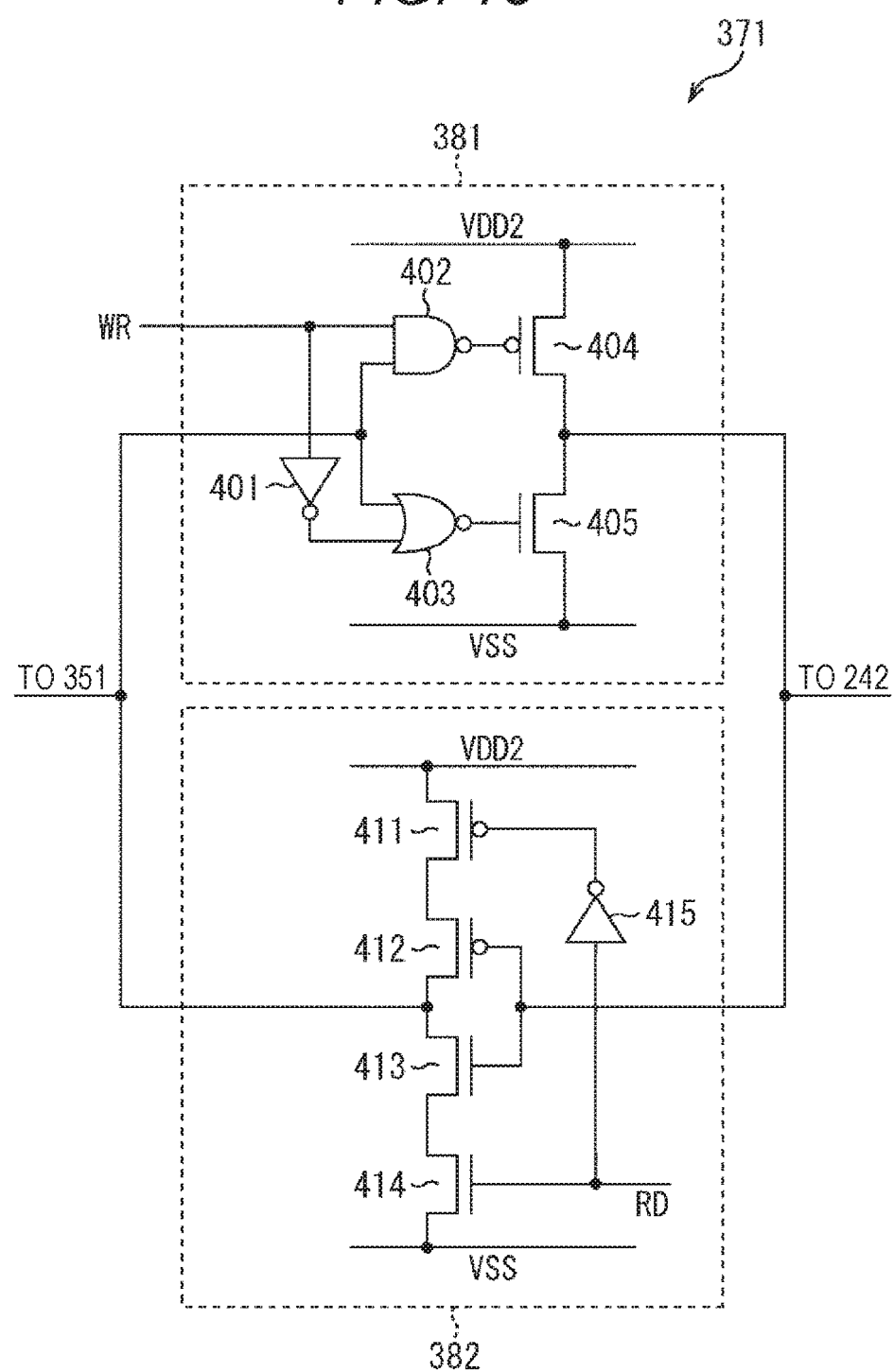
FIG. 18 is a diagram of a first exemplary configuration of an interactive buffer circuit.

FIG. 18 is a first exemplary configuration of the interactive buffer circuit 371.

The interactive buffer circuit 371 illustrated in FIG. 18 includes the buffer circuit 381 and the inverter circuit 382.

The buffer circuit 381 includes an inverter 401, a NAND circuit 402, a NOR circuit 403, a PMOS transistor 404, and an NMOS transistor 405.

In the buffer circuit 381, when the writing control signal WR is Hi, the output of the NAND circuit 402 and the output of the NOR circuit 403 each include the time code supplied from the D-F/F 351 in the time code transferring unit 23, inverted. The output of the buffer circuit 381 includes the time code that has been inverted, further inverted, so as to finally have a value the same as that of the time code supplied from the D-F/F 351. When the writing control signal WR is Lo, the output of the NAND circuit 402 is turned to be Hi and the output of the NOR circuit 403 is turned to be Lo so that the output of the buffer circuit 381 is made into the Hi-Z state.

Meanwhile, the inverter circuit 382 includes two PMOS transistors 411 and 412, two NMOS transistors 413 and 414, and a clocked inverter including an inverter 415.

When the reading control signal RD is Hi, the clocked inverter becomes active in the inverter circuit 382 so that the inverter circuit 382 inverts and outputs the time code supplied from the bit storage unit 242. When the reading control signal RD is Lo, the clocked inverter becomes inert (inactive) so that the output of the inverter circuit 382 is made into the Hi-Z state.

Figure 19:
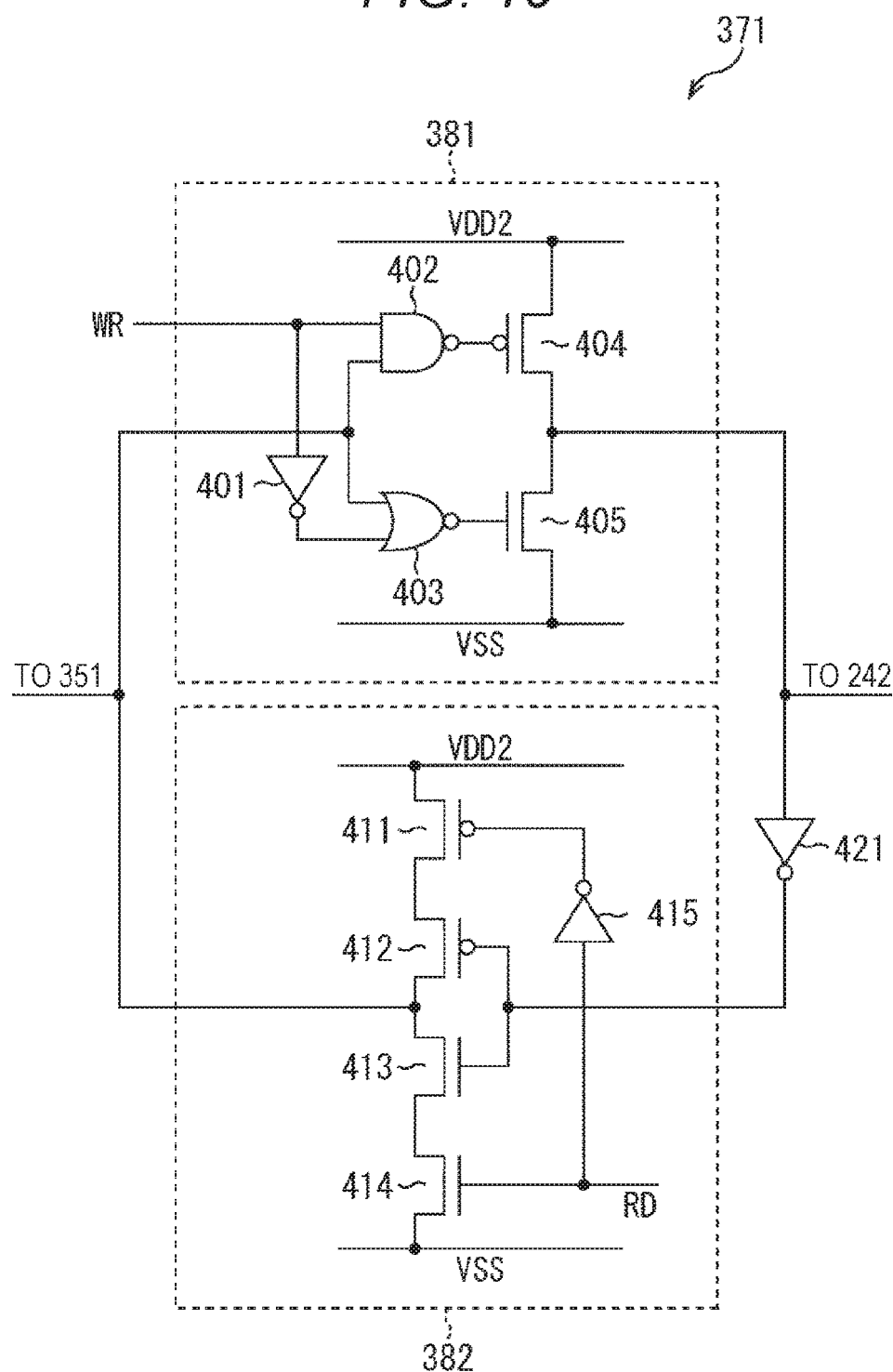
FIG. 19 is a diagram of a second exemplary configuration of the interactive buffer circuit.

FIG. 19 illustrates a second exemplary configuration of the interactive buffer circuit 371.

The interactive buffer circuit 371 illustrated in FIG. 19 includes an inverter 421 provided at the previous stage of the inverter circuit 382, in addition to the buffer circuit 381 and the inverter circuit 382 illustrated in FIG. 18.

In the first exemplary configuration of the interactive buffer circuit 371 of FIG. 18, as described above, when the time code supplied from the D-F/F 351 in the time code transferring unit 23 is written into the bit storage unit 242, the time code has a value the same as that of the time code supplied from the D-F/F 351 so that the polarity is not inverted, and when the time code stored in the bit storage unit 242 is read, the polarity is inverted. Therefore, the time code that has been read (AD conversion pixel data) is the data including the time code that has been supplied, inverted.

Thus, in the second exemplary configuration of the interactive buffer circuit 371 illustrated in FIG. 19, the inverter 421 is provided at the previous stage of the inverter circuit 382 so that the time code read from the bit storage unit 242 is output so as to have polarity the same as that of the time code that has been supplied.

In FIG. 19, the configuration of a buffer circuit that outputs a signal having polarity the same as that of an input signal, by providing the inverter 421 at the previous stage of the inverter circuit 382 in a direction in which the time code is read, has been also adopted. The configuration of the buffer circuit can be adopted as the configuration of the buffer circuit 381 in a direction in which the time code is written. Conversely, the configuration including the inverter provided at the previous stage of the buffer circuit 381 in the direction in which the time code is written, can be used for the inverter circuit 382 in the direction in which the time code is read. Alternatively, other different configurations may be adopted as the configurations of the buffer circuit 381 and the inverter circuit 382.

<12. Detailed Description of Third Exemplary Configuration of Time Code Transferring Unit>

Next, the third exemplary configuration of the time code transferring unit 23 illustrated in FIG. 15, will be described in more detail.

<Description of Number of D-F/Fs>

In the above description, the time code transferring unit 23 includes the N shift registers 341-1 to 341-N corresponding to the N-bit time code DATA[1] to DATA[N], respectively, and each shift register 341 (shift register 341-n) includes the plurality of D-F/Fs 351.

The number of D-F/Fs 351 included in each shift register 341 in the time code transferring unit 23, will be described with reference to FIG. 20.

Figure 20:
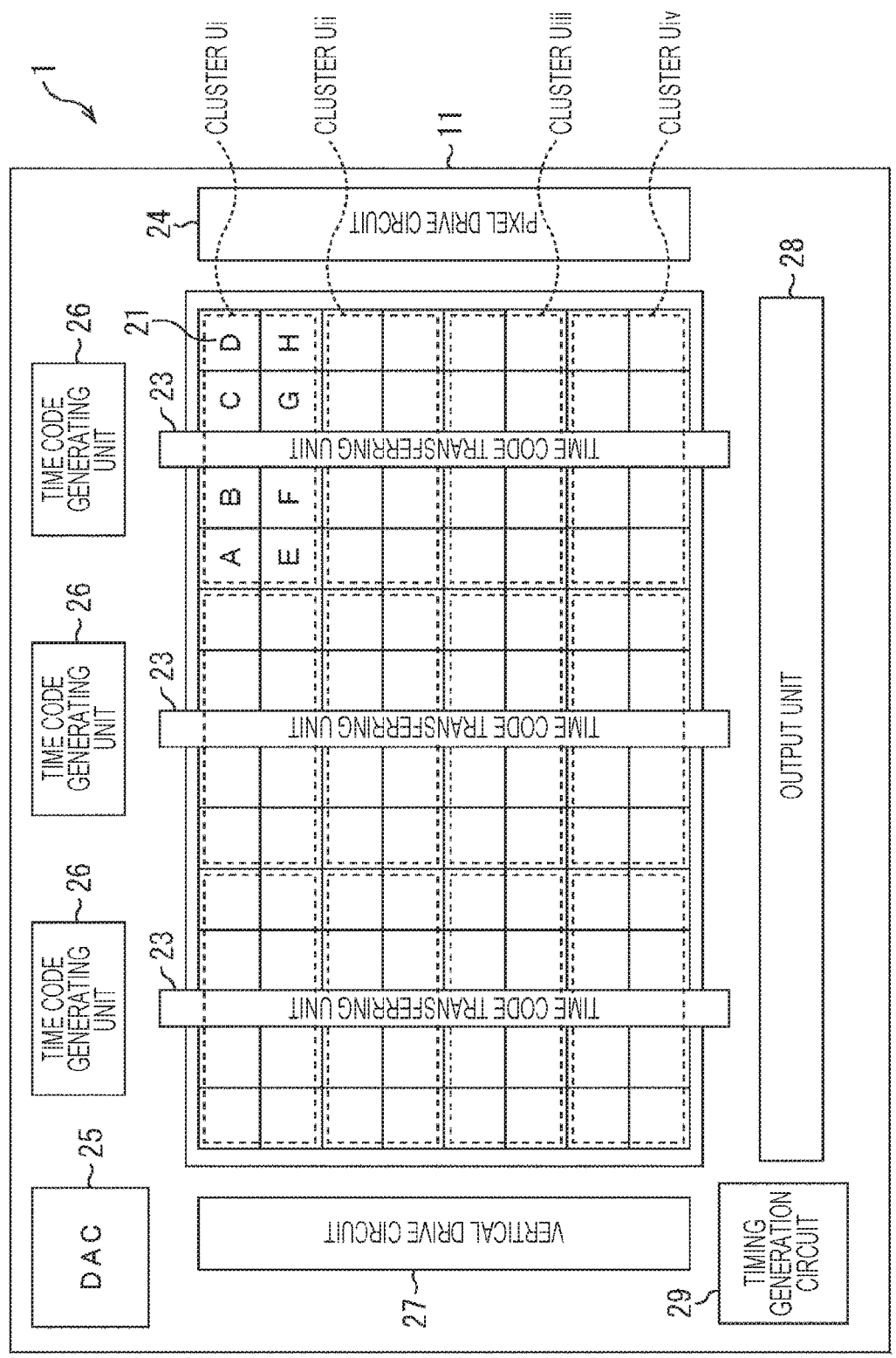
FIG. 20 is a diagram for describing the number of the D-F/Fs included in the shift register.

The pixel array unit 22 is assumed to overall include 96 pixels 21 in an 8×12 matrix (a vertical direction×a horizontal direction), for example, as illustrated in FIG. 20. Then, the entire pixel array unit 22 is divided into four in the vertical direction and is divided into three in the horizontal direction so that the pixel array unit 22 is divided into 12 clusters U.

When the pixel array unit 22 is divided into the plurality of clusters U as described above, one time code generating unit 26 and one time code transferring unit 23 are arranged to four clusters U having the same position in the horizontal direction, in other words, a cluster U group formed in the column direction (the vertical direction).

Then, in the time code transferring unit 23 provided to each time code generating units 26, the shift register 341 in the time code transferring unit 23, includes a number of D-F/Fs 351 corresponding to the number of clusters U formed in the column direction.

Therefore, as illustrated in FIG. 20, in a case where the division is made into four clusters U in the column direction, the shift register 341 in the time code transferring unit 23, includes four D-F/Fs 351.

Note that, for convenience in the description below, as illustrated in FIG. 20, the four clusters U formed in the column direction are distinguished by a cluster Ui, a cluster Uii, a cluster Uiii, and a cluster Uiv from the side close to the time code generating unit 26. In addition, eight pixels 21 in one cluster U, may be described as pixels 21A to 21H so as to be distinguished, corresponding to "A to H" attached in the cluster Ui of FIG. 20.

Figure 21:
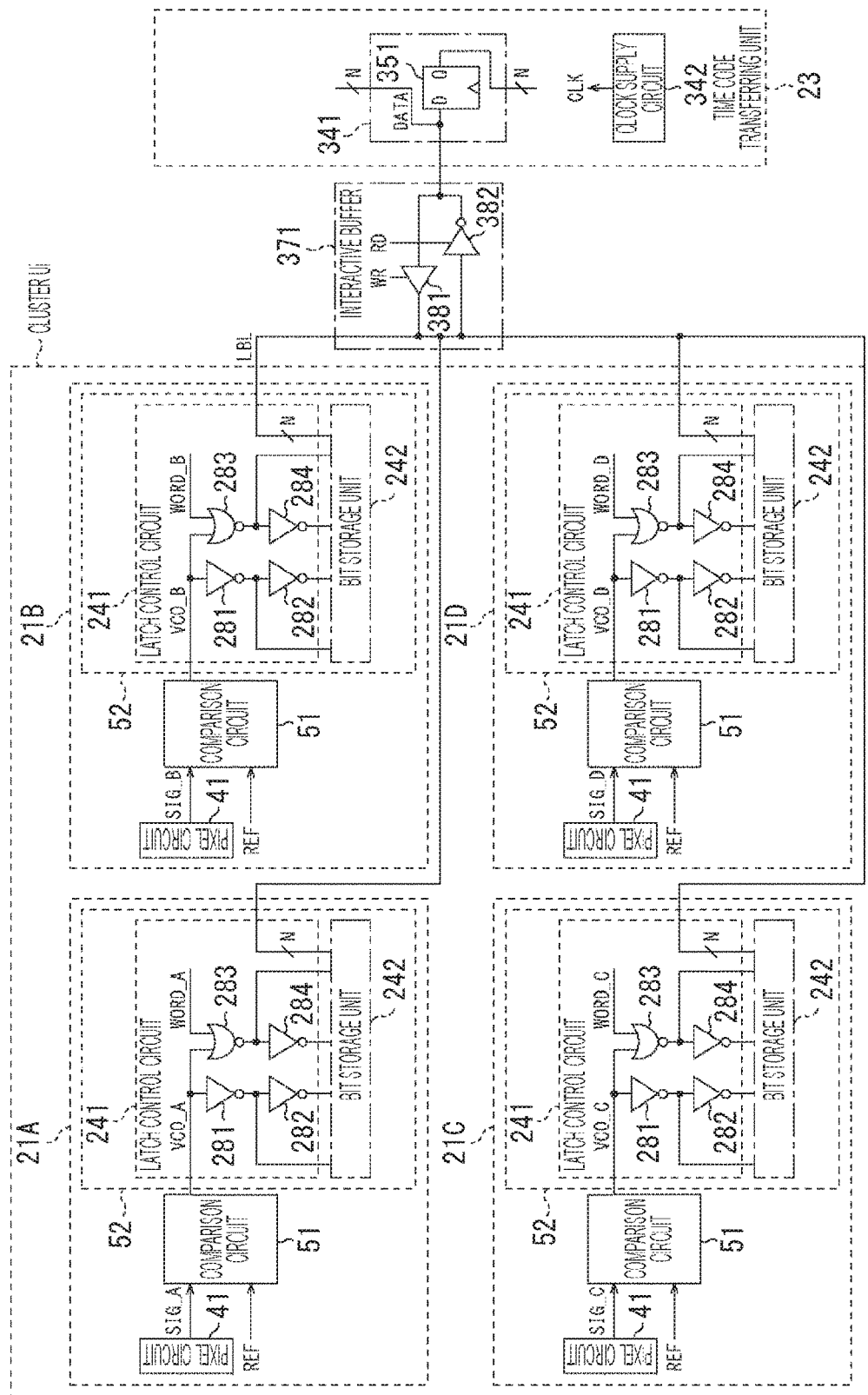
FIG. 21 is a diagram of the corresponding relationship between a cluster and the D-F/F of the shift register.

FIG. 21 is a diagram of the corresponding relationship with the D-F/F 351 of the shift register 341 in the time code transferring unit 23 by paying attention to one cluster U (e.g., the cluster Ui).

The plurality of D-F/Fs 351 included in the shift register 341 of the time code transferring unit 23 (four in the example of FIG. 20), each is coupled to the data storage units 52 of the eight pixels 21A to 21H in the allocated cluster U through the interactive buffer circuit 371. Note that, only four pixels 21A to 21D from the eight pixels 21A to 21H in the cluster Ui, are illustrated in FIG. 21 because of drawing space.

The configuration of the time code transferring unit 23 and each of the data storage units 52 illustrated in FIG. 21 is the third exemplary configuration of the time code transferring unit 23 and the data storage unit 52 illustrated in FIG. 15.

Therefore, although the illustration has been simplified in FIG. 21, as illustrated in FIG. 15, the time code transferring unit 23 includes the N shift registers 341-1 to 341-N provided, corresponding to the N-bit time code DATA[1] to DATA[N] generated by the time code generating unit 26. Then, the N interactive buffer circuits 371-1 to 371-N are provided corresponding to the N shift registers 341-1 to 341-N, and the N interactive buffer circuits 371-1 to 371-N are coupled to the data storage units 52 of the eight pixels 21A to 21H in the cluster U.

In the writing operation of the time code, the writing control signal WR supplied to the interactive buffer circuit 371, is turned to be Hi, and the N-bit time code DATA[1] to DATA[N] generated by the time code generating unit 26, are simultaneously supplied to and stored in the data storage units 52 of all the pixels 21A to 21H in each cluster U coupled in parallel.

In the reading operation of the time code, for example, the WORD signal (WORD_A) of the pixel 21A being one of all the pixels 21A to 21H in each cluster U coupled in parallel, is turned to be Hi and additionally the reading control signal RD supplied to the interactive buffer circuit 371 is temporarily turned to be Hi, so that the AD conversion pixel data retained in the data storage unit 52 of the pixel 21A is output to the time code transferring unit 23 (the D-F/F 351 inside).

When the AD conversion pixel data of the pixel 21A is output to the time code transferring unit 23, next, the AD conversion pixel data retained in the data storage unit 52 of the pixel 21B is similarly output to the time code transferring unit 23. After that, the AD conversion data of all the pixels 21 in the same cluster U, is sequentially output to the time code transferring unit 23.

Figure 22:
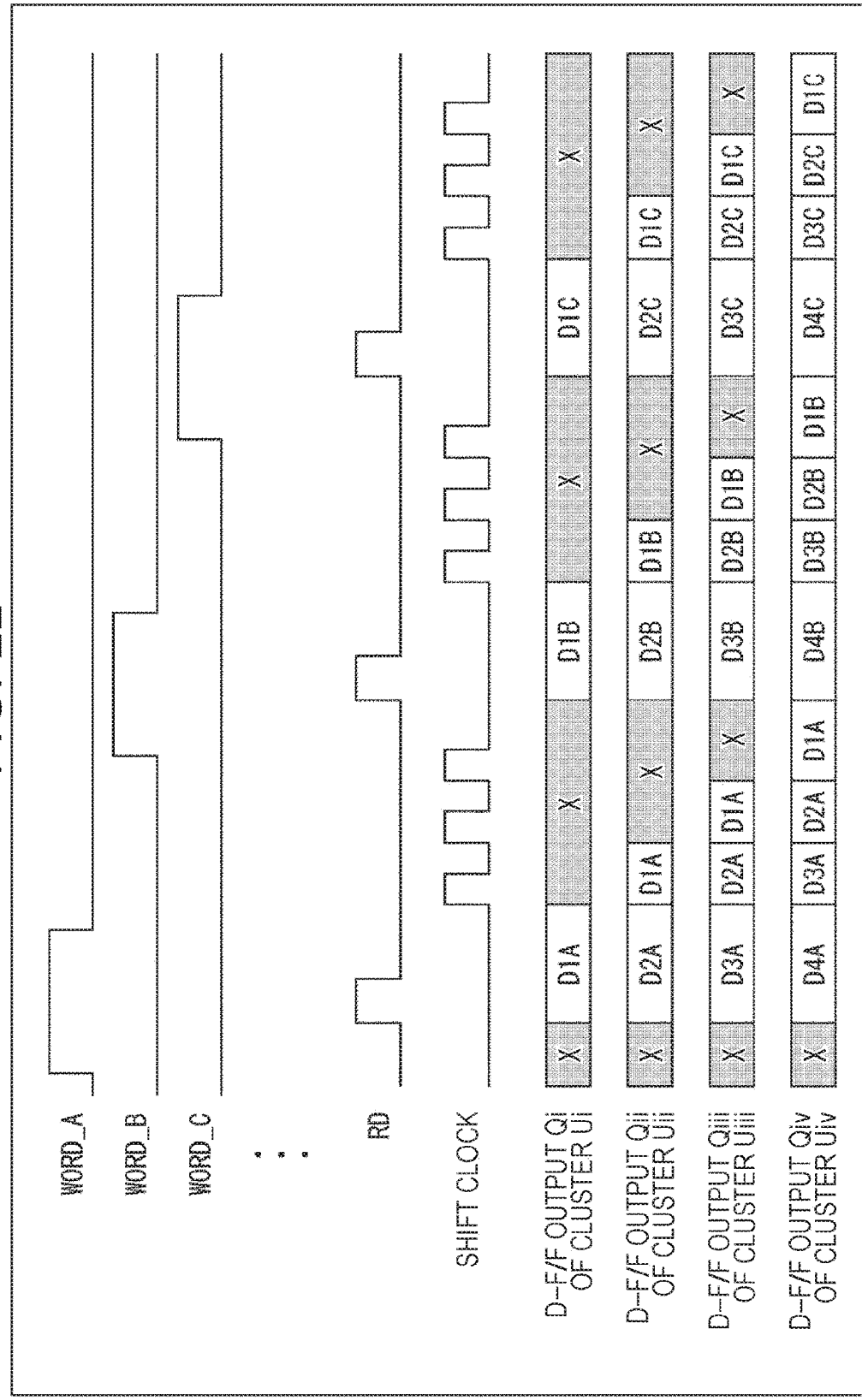
FIG. 22 is a timing chart for describing the flow of data output in four units of the D-F/Fs included in the shift register.

FIG. 22 is a timing chart for describing the flow of data output in the four D-F/Fs 351 included in the shift register 341 in the time code transferring unit 23.

As described above, in each of the four clusters Ui to iv formed in the column direction, the WORD signal (WORD_A) of the pixel 21A is turned to be Hi and additionally the reading control signal RD supplied to the interactive buffer circuit 371 is temporarily turned to be Hi so that the AD conversion pixel data of the pixel 21A in each of the four clusters Ui to iv, is output.

More specifically, AD conversion pixel data D1A of the pixel 21A in the cluster Ui is supplied to the D-F/F 351 coupled to the cluster Ui, in the time code transferring unit 23, so as to be output. AD conversion pixel data D2A of the pixel 21A in the cluster Uii is supplied to the D-F/F 351 coupled to the cluster Uii, in the time code transferring unit 23, so as to be output. AD conversion pixel data D3A of the pixel 21A in the cluster Uiii is supplied to the D-F/F 351 coupled to the cluster Uiii, in the time code transferring unit 23, so as to be output. AD conversion pixel data D4A of the pixel 21A in the cluster Uiv is supplied to the D-F/F 351 coupled to the cluster Uiv, in the time code transferring unit 23, so as to be output. The output destination of the D-F/F 351 coupled to the cluster Uiv, is the output unit 28.

After that, the shift clock having three pulses is supplied to the clock input of each D-F/F 351 in the time code transferring unit 23 so that the AD conversion pixel data D1A of the pixel 21A in the cluster Ui, the AD conversion pixel data D2A of the pixel 21A in the cluster Uii, the AD conversion pixel data D3A of the pixel 21A in the cluster Uiii, and the AD conversion pixel data D4A of the pixel 21A in the cluster Uiv, are sequentially transferred by the four D-F/Fs 351 included in the shift register 341. As a result, the D-F/F 351 coupled to the cluster Uiv, inputs the AD conversion pixel data of the pixel 21A into the output unit 28, in order of the AD conversion pixel data D4A of the pixel 21A in the cluster Uiv, the AD conversion pixel data D3A of the pixel 21A in the cluster Uiii, the AD conversion pixel data D2A of the pixel 21A in the cluster Uii, and the AD conversion pixel data D1A of the pixel 21A in the cluster Ui.

Next, in each of the four clusters Ui to iv formed in the column direction, the WORD signal (WORD_B) of the pixel 21B is turned to be Hi and additionally the reading control signal RD supplied to the interactive buffer circuit 371 is temporarily turned to be Hi so that the AD conversion pixel data of the pixel 21B in each of the four clusters Ui to iv, is output to the time code transferring unit 23. Then, the shift register 341 in the time code transferring unit 23, transfers the AD conversion pixel data of the pixel 21B in each of the four clusters Ui to iv, to the output unit 28.

The AD conversion pixel data of the pixel 21C in each of the four clusters Ui to iv and the AD conversion pixel data of the pixel 21D in each of the four clusters Ui to iv, are similarly transferred from each pixel 21 in the clusters U, to the time code transferring unit 23, and from the time code transferring unit 23 to the output unit 28.

FIG. 22 illustrates an exemplary configuration of one cluster U including the four pixels 21A to 21D, but a similar configuration is acquired in a case where one cluster U includes the eight pixels 21A to 21H. In addition, a similar configuration can be acquired even for the cluster U including arbitrary K pixels. Note that, in FIG. 22, the Hi periods of the WORD signal and the RD signal overlap each other, but do not necessarily overlap each other.

<13. First Modification of Time Code Transferring Unit According to Third Exemplary Configuration>

Figure 23:
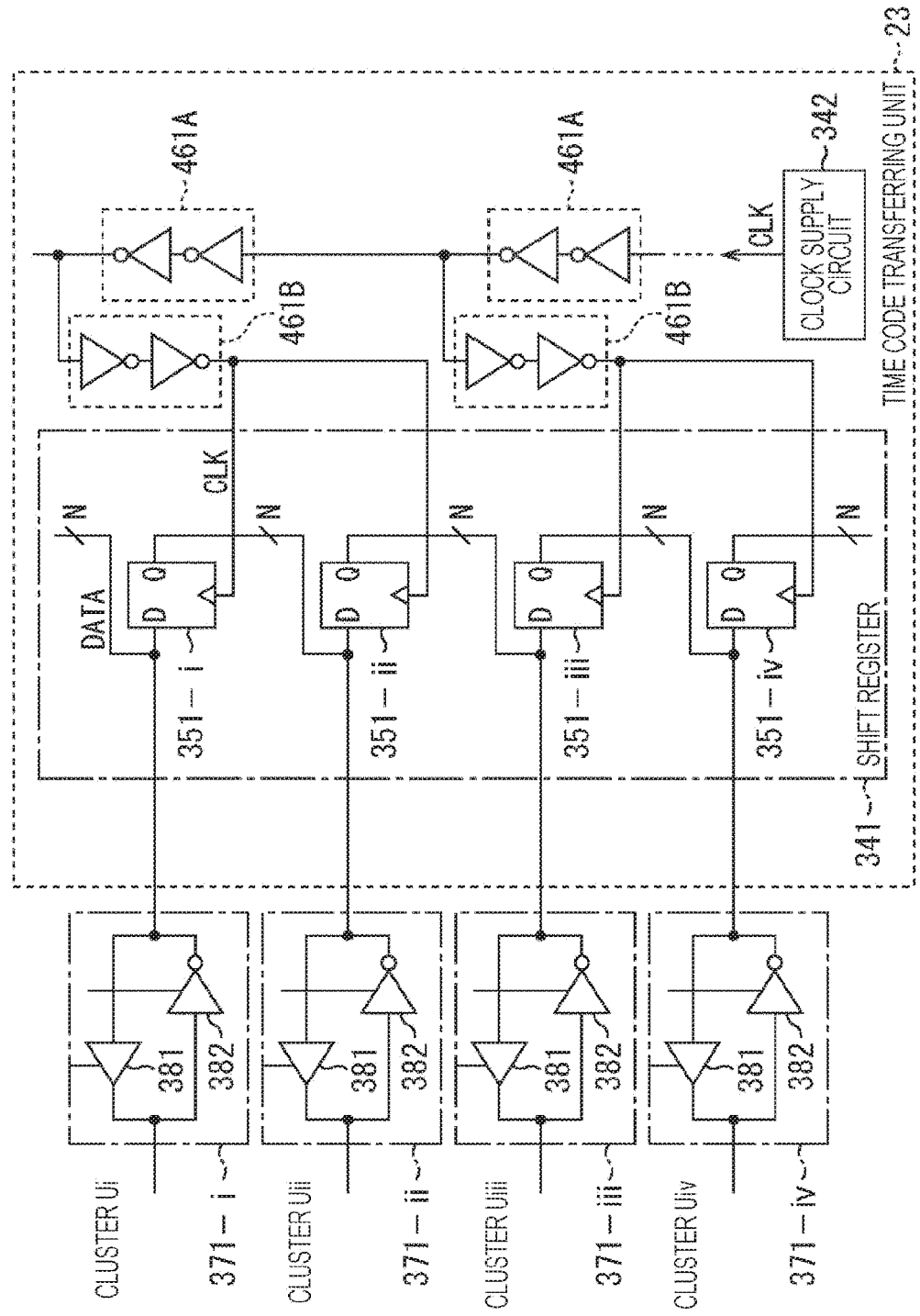
FIG. 23 is a diagram of a first modification of the time code transferring unit according to the third exemplary configuration.

FIG. 23 illustrates a first modification of the time code transferring unit 23 according to the third exemplary configuration.

In the first modification of the time code transferring unit 23 illustrated in FIG. 23, a plurality of repeater circuits 461 is provided between the shift register 341 and the clock supply circuit 342. More specifically, a plurality of repeater circuits 461A is arranged in series in the column direction of the pixel array unit 22, and the clock signal CLK is supplied to each cluster U in the pixel array unit 22, through a repeater circuit 461B coupled to the subsequent stage of the predetermined repeater circuit 461A. The repeater circuit 461B is coupled to the D-F/F 351 of at least one cluster U. FIG. 23 illustrates exemplary coupling with the D-F/Fs 351 of two clusters U. Note that, the conductive lines of the repeater circuits 461 for power supply and GND, are arranged so as to be separated from the other circuits.

The transmission direction of the clock signal CLK of the plurality of repeater circuits 461A arranged in series in the column direction, is opposite to the transmission direction of the time code. In the example of FIG. 23, the transmission direction of the time code is a direction from the upper side to the lower side so that the transmission direction of the clock signal CLK is a direction from the lower side to the upper side. With this arrangement, the delay of the clock signal CLK increases as being closer to the upper side of FIG. 23 (on the side close to the time code generating unit 26 in the pixel array unit 22), and each D-F/F 351 of the shift register 341 outputs the AD conversion pixel data retained by itself and then receives the next AD conversion pixel data. That is, a hold-time margin for data transmission of the AD conversion pixel data, can be certainly ensured.

<14. Second Modification of Time Code Transferring Unit According to Third Exemplary Configuration>

Figure 24:
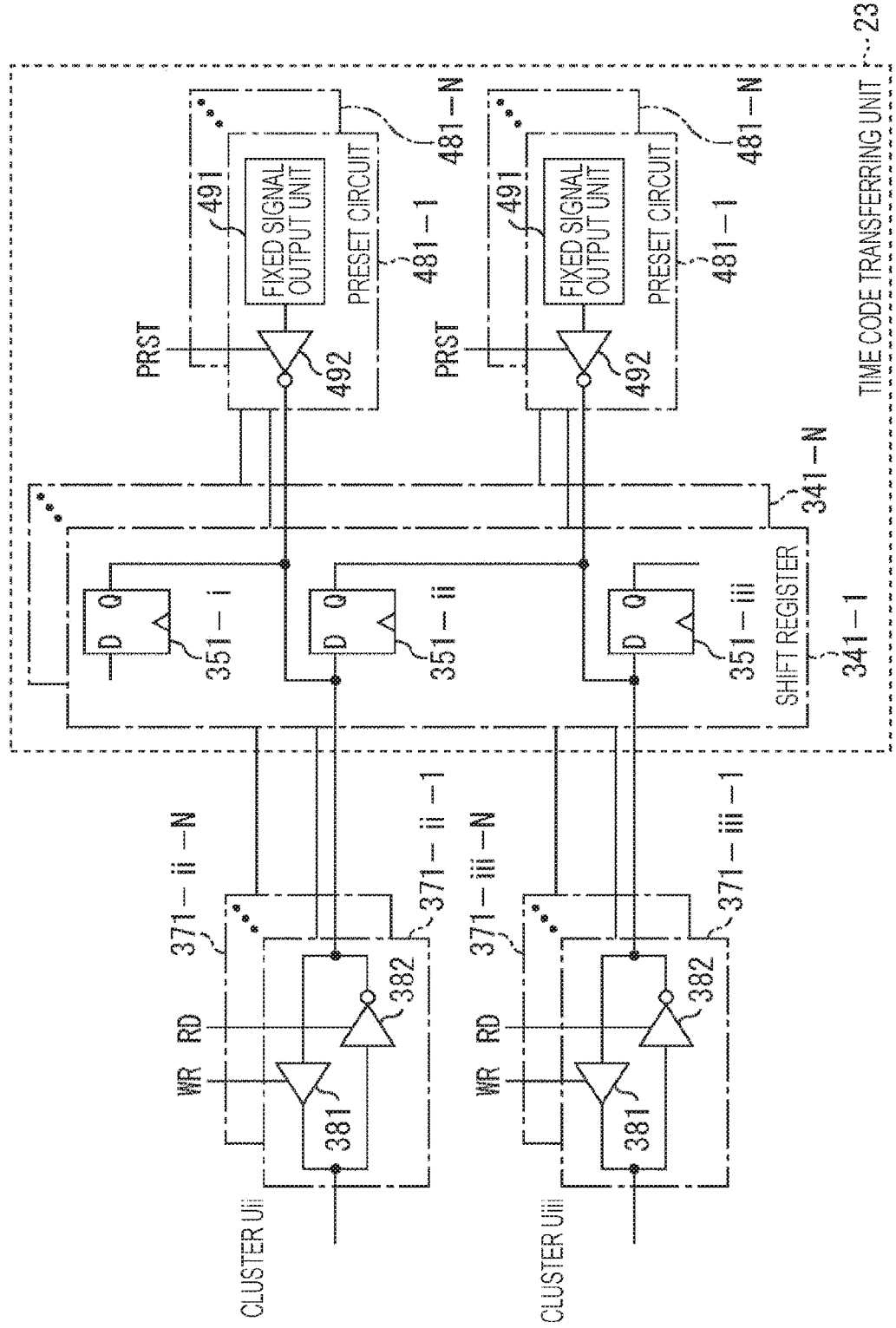
FIG. 24 is a diagram of a second modification of the time code transferring unit according to the third exemplary configuration.

FIG. 24 illustrates a second modification of the time code transferring unit 23 according to the third exemplary configuration.

In the second modification of the time code transferring unit 23 illustrated in FIG. 24, a preset circuit 481 is newly provided corresponding to each D-F/F 351 in the time code transferring unit 23. The preset circuit 481 includes a fixed signal output unit 491 and a clocked inverter 492, and generates and outputs a fixed signal being Hi or Lo. The output point of the preset circuit 481 is coupled between the D-F/Fs 351 coupled in series.

With the configuration of the time code transferring unit 23 without the preset circuit 481 as illustrated in FIG. 15, a value not being the time code output from the time code generating unit 26 (hereinafter, referred to as an uncertain initial value), is retained on the downstream side of the shift register 341 at the initial stage at which the transfer of the time code starts during the comparison period for comparing the reference signal REF and the pixel signal SIG. Examples of the uncertain initial value, may include the rising initial value of the D-F/F 351 accidentally determined after power is turned on, and a value in the final state of the AD conversion pixel data transferred in the previous AD conversion operation.

If the sweep of the reference signal REF starts from a voltage sufficiently higher than those of the pixel signals SIG of all the pixels 21, the uncertain initial value is swept from the shift register 341 before the output signal VCO is turned to be Lo so that the data storage unit 52 (the bit storage unit 242) does not retain a wrong value as the compared result. However, wastefully operating the shift register 341 in order to sweep the uncertain initial value, wastes operating time and power consumption.

Thus, in the second modification of the time code transferring unit 23 illustrated in FIG. 24, on the basis of a preset signal PRST, the preset circuit 481 makes the output Q of the D-F/F 351 included in the shift register 341, into the Hi-Z state so as to initialize the output Q of the D-F/F 351, prior to the sweep of the reference signal REF and the output of the time code due to the time code generating unit 26.

The value initialized by the preset circuit 481, to be input into the D-F/F 351, can be made to be a value corresponding to a case where as if the sweep of the reference signal REF and the input of the time code have continued from the past. More specifically, when it is assumed that the code generated by the time code generating unit 26, starts from C(N) and the time code generated after M cycles, is C(N+M), the output Q through the D-F/F 351 at the first stage from the time code generating unit 26 can be made to be C(N−1) and the output Q through the D-F/F 351 at the second stage from the time code generating unit 26 can be made to be C(N−2).

Note that, instead of providing the preset circuit 481, initialization may be similarly performed with a circuit having a reset input or a set input is used as the D-F/F 351, prior to the sweep of the reference signal REF and the output of the time code due to the time code generating unit 26.

In addition, a preset value to be initialized can be made to be an arbitrary value instead of a value corresponding to the time code back in the past. In that case, a part of the data storage units 52 cannot capture a meaningful time code until the preset value that has been initialized is swept from the shift register 341, so that sweep time cannot shorten. However, if the preset value is made to be an appropriate value, such as all zero, large current consumption that may occur when the clock signal CLK is supplied to the shift register 341 having a disordered initial value remaining, can be prevented from occurring.

<15. Third Modification of Time Code Transferring Unit According to Third Exemplary Configuration>

Figure 25:
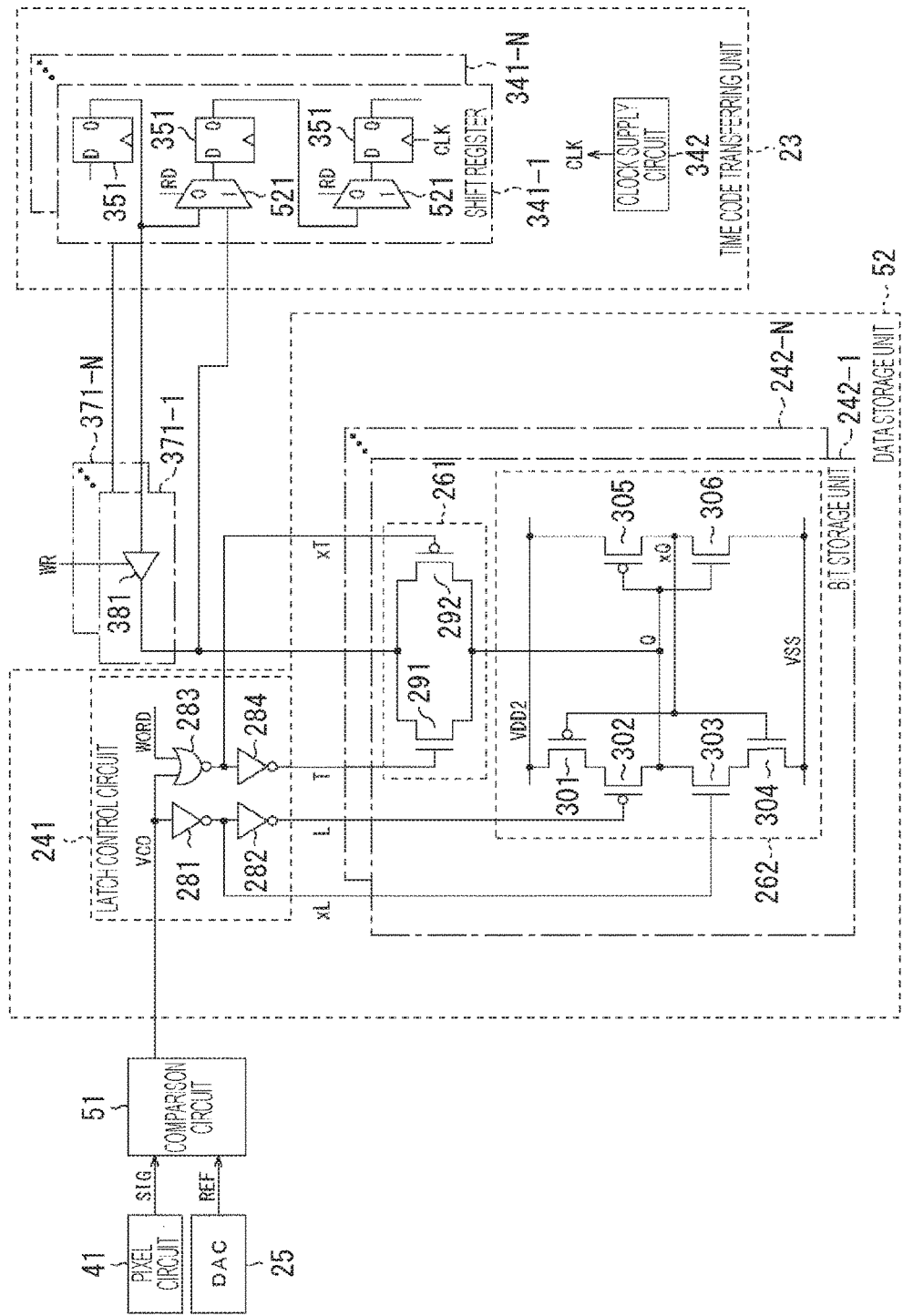
FIG. 25 is a diagram of a third modification of the time code transferring unit according to the third exemplary configuration.

FIG. 25 illustrates a third modification of the time code transferring unit 23 according to the third exemplary configuration.

In the third modification of the time code transferring unit 23 illustrated in FIG. 25, a selector 521 that selects and outputs one of two signals that have been input, on the basis of the reading control signal RD, is newly provided at the previous stage of the input D of each D-F/F 351 in the time code transferring unit 23. In addition, the inverter circuit 382 to which the reading control signal RD is supplied, is omitted in the interactive buffer circuit 371, as a result.

When the reading control signal RD is Hi, the selector 521 selects the AD conversion pixel data supplied from the transfer gate 261 in the bit storage unit 242 so as to output the AD conversion pixel data to the D-F/F 351. Meanwhile, when the reading control signal RD is Lo, the output Q of the D-F/F 351 at the previous stage is selected so that output is made to the D-F/F 351.

<16. Exemplary Configuration of Time Code Generating Unit>

Figure 26:
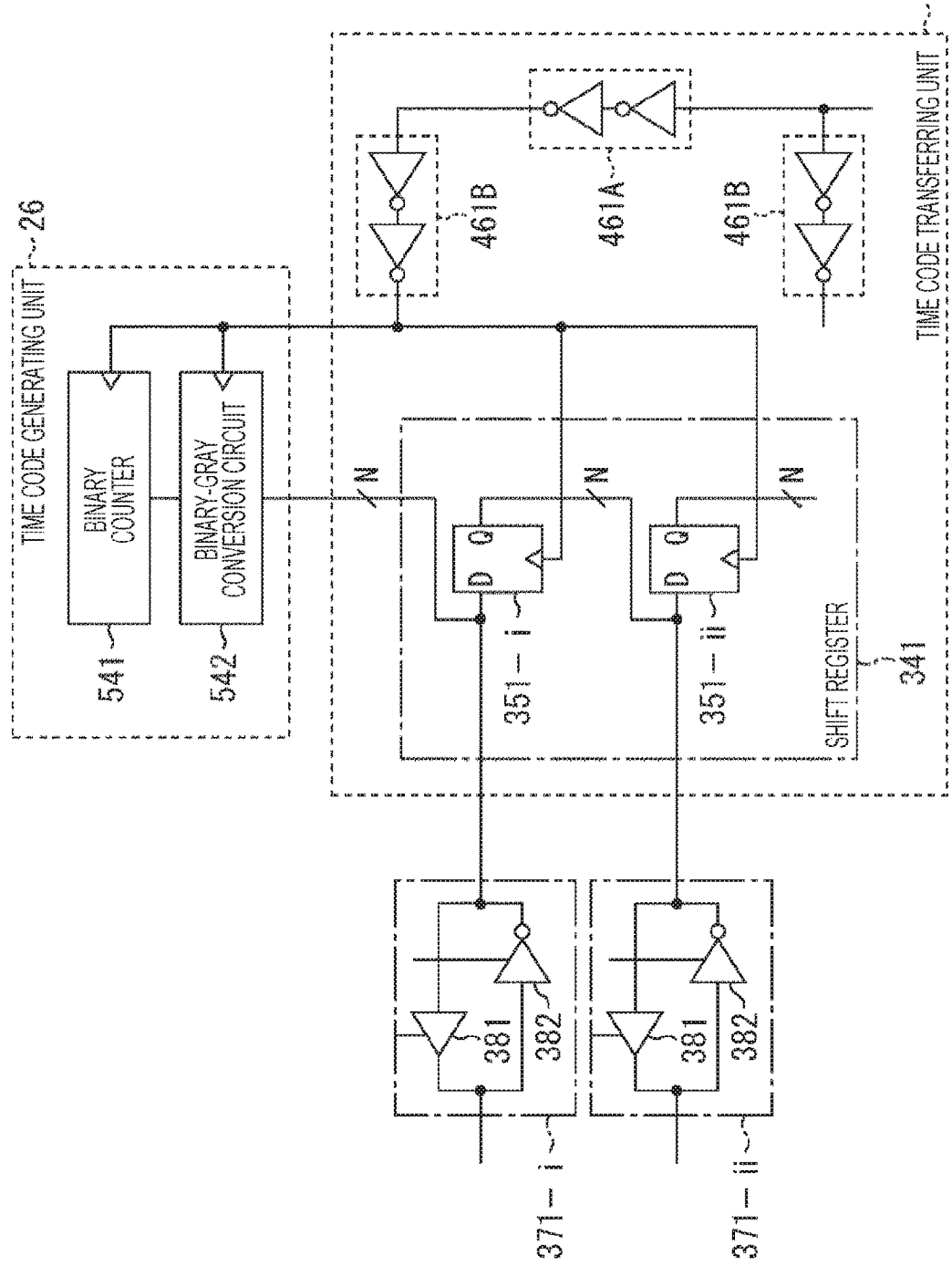
FIG. 26 is a diagram of an exemplary configuration of a time code generating unit.

FIG. 26 is a diagram of an exemplary configuration of the time code generating unit 26.

FIG. 26 illustrates the detailed configuration of the time code generating unit 26 together with the first modification of the time code transferring unit 23 according to the third exemplary configuration illustrated in FIG. 23.

The time code generating unit 26 includes a binary counter 541 and a binary-gray conversion circuit 542 that converts a binary number supplied from the binary counter 541, into a Gray code, the time code generating unit 26 being configured to supply the Gray code that has been generated, as the time code, to the shift register 341 in the time code transferring unit 23.

The clock signal CLK output from the repeater circuit 461 at the end in the time code transferring unit 23, is input into the clock inputs of the binary counter 541 and the binary-gray conversion circuit 542 in the time code generating unit 26, so that the binary counter 541 and the binary-gray conversion circuit 542 operate on the basis of the clock signal CLK output from the repeater circuit 461 at the end in the time code transferring unit 23.

Note that, the time code generating unit 26 can use, as the time code, a code, such as a thermometer code, including only one bit varying in consecutive two time codes, other than the Gray code.

<17. Difference Between First and Second Exemplary Configurations and Third Exemplary Configuration of Time Code Transferring Unit>

Next, the difference between the first and second exemplary configurations and the third exemplary configuration of the time code transferring unit 23, will be described with reference to FIG. 27.

Here, as described again, the time code transferring unit 23 transmits the N bits of DATA[1] to DATA[N] through the N lines of conductive lines BL[1] to BL[N], respectively, in the first and second exemplary configurations of the time code transferring unit 23, as illustrated in FIGS. 13 and 14. Meanwhile, the N shift registers 341-1 to 341-N transmit the N bits of DATA[1] to DATA[N], respectively, in the third exemplary configuration of the time code transferring unit 23 as illustrated in FIG. 15.

In the first and second exemplary configurations, there is a problem that the delay of the time code signal occurs in supplying the time code to the data storage unit 52 of each pixel 21 during the AD conversion period. That is, the conductive lines BL[1] to BL[N] each have parasitic resistance in the time code transferring unit 23, and the data storage unit 52 being a load and the conductive lines BL[1] to BL[N] each have parasitic capacitance. Accordingly, the time code that arrives at the data storage unit 52 at the far end portion farthest away from the time code generating unit 26, has a large CR delay. The CR delay varies due to factors, such as the parasitic resistance, the parasitic capacitance, and the driving force of a buffer circuit. Therefore, the time code transferring unit 23 including a large number of bits of bus, has skew (deviation) between the bits.

Figure 27:
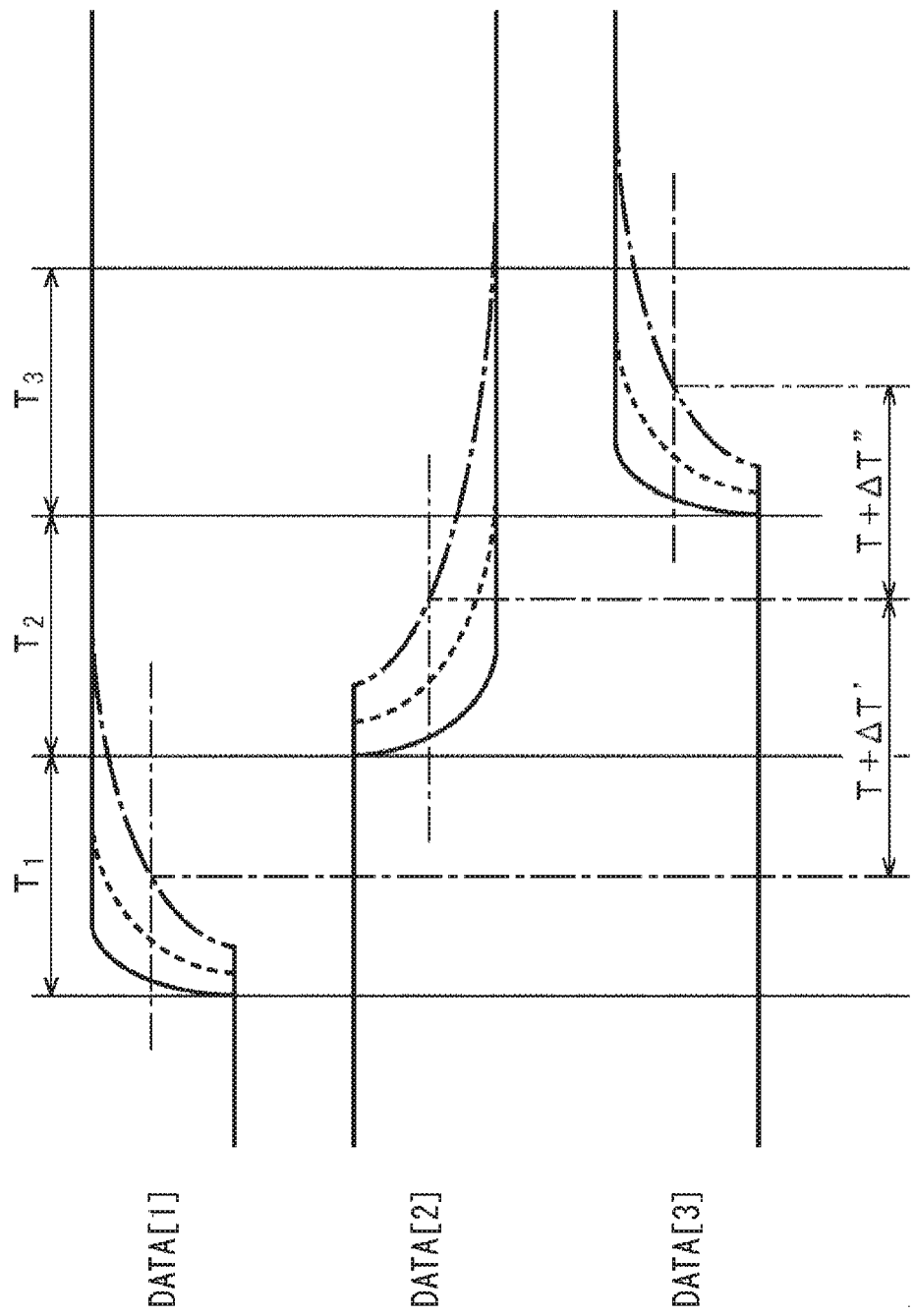
FIG. 27 is a graphical representation for describing the difference between the first and second exemplary configurations and the third exemplary configuration of the time code transferring unit.

FIG. 27 illustrates the signal waveforms of the three-bit time code (DATA[1] to DATA[3]) from the N-bit time code varied with a period T being the unit time.

In FIG. 27, the three bits of time code transferred in a first period T ($T_1$), satisfies the following expression: DATA[1] to DATA[3]=[1, 1, 0], the three bits of time code transferred in the next period T ($T_2$), satisfies the following expression: DATA[1] to DATA[3]=[1, 0, 0], and the three bits of time code transferred in the further next period T ($T_3$), satisfies the following expression: DATA[1] to DATA[3]=[1, 0, 1].

In addition, in FIG. 27, the signal waveforms of DATA[1] to DATA[3] indicated with a solid line, are supplied to the data storage unit 52 of the pixel 21 close to the time code generating unit 26. The signal waveforms of DATA[1] to DATA[3] indicated with a dot-and-dash line, are supplied to the data storage unit 52 of the pixel 21 far away from the time code generating unit 26. The signal waveforms of DATA[1] to DATA[3] indicated with a broken line, are supplied to the data storage unit 52 of the pixel 21 at an intermediate position between the pixel 21 supplied with the signal waveforms indicated with the solid line and the pixel 21 supplied with the signal waveforms indicated with the dot-and-dash line, for example, the pixel 21 being at a center portion in the column direction.

According to the signal waveforms of FIG. 27, a delay occurs as the pixel 21 is far away from the time code generating unit 26 so that the time code received by the data storage unit 52 is updated with an interval different from the time interval T, for example, with T+ΔT' or T+ΔT", regardless of the time code that has been varied with the constant time interval T, originally.

The ununiformity of the update time of the time code may result in an error in the AD conversion. Typically, in a case where the solid-state image pickup device 1 has high precision and high gradation, a shift amount ΔT from the original time interval T is preferably 10% or less of the unit time T. For example, the update cycle of the time code needs to be set to be 20 nsec or more for the solid-state image pickup device 1 in which the physical length of each time code transferring unit 23 is 20 mm and the number of lines of the pixels 21 in the pixel array unit 22 is 3000. If the gradation number of the AD conversion is 16384, an AD conversion period of 300 μsec or more is required. The AD conversion period is a large current consumption period during which the differential input circuits 61 of an enormous number of comparison circuits 51, operate in parallel. Lengthening the period increases the power necessary for picking up one image.

In contrast to this, in the third exemplary configuration, since the shift clock supplied to the D-F/F 351, is generated with a trigger, the skew between the bits is extremely small for all the bits of time code supplied to the data storage unit 52 of each pixel 21. Therefore, according to the third exemplary configuration, the update of the time code can be made in a short time.

Furthermore, if a configuration including the repeater circuit 461 provided is provided similarly to the first modification illustrated in FIG. 23, the cycle of the shift clock, namely, the update cycle of the time code can be set to be further short.

According to the third exemplary configuration, the update cycle of the time code can be set to be 5 nsec or less for the solid-state image pickup device 1 in which the number of lines of the pixels 21 in the pixel array unit 22 is 3000, under a condition the same as the above. Therefore, the AD conversion duration can shorten to be one quarter of that in the first and second exemplary configurations so that the power necessary for picking up one image can be dramatically reduced.

In addition, in the third exemplary configuration, since CMOS logic including all signal amplitude being power supply voltage, transfers the reading of the time code, there is no need to provide a sense amplifier necessary in a case where a minute voltage is read, the minute voltage occurring in each of the time code transferring units 23 including a bundle of passive conductive lines, in the first and second exemplary configurations, so that certain reading of the time code can be made with a high noise margin.

<18. Different Exemplary Configuration of Data Storage Unit>

Figure 28:
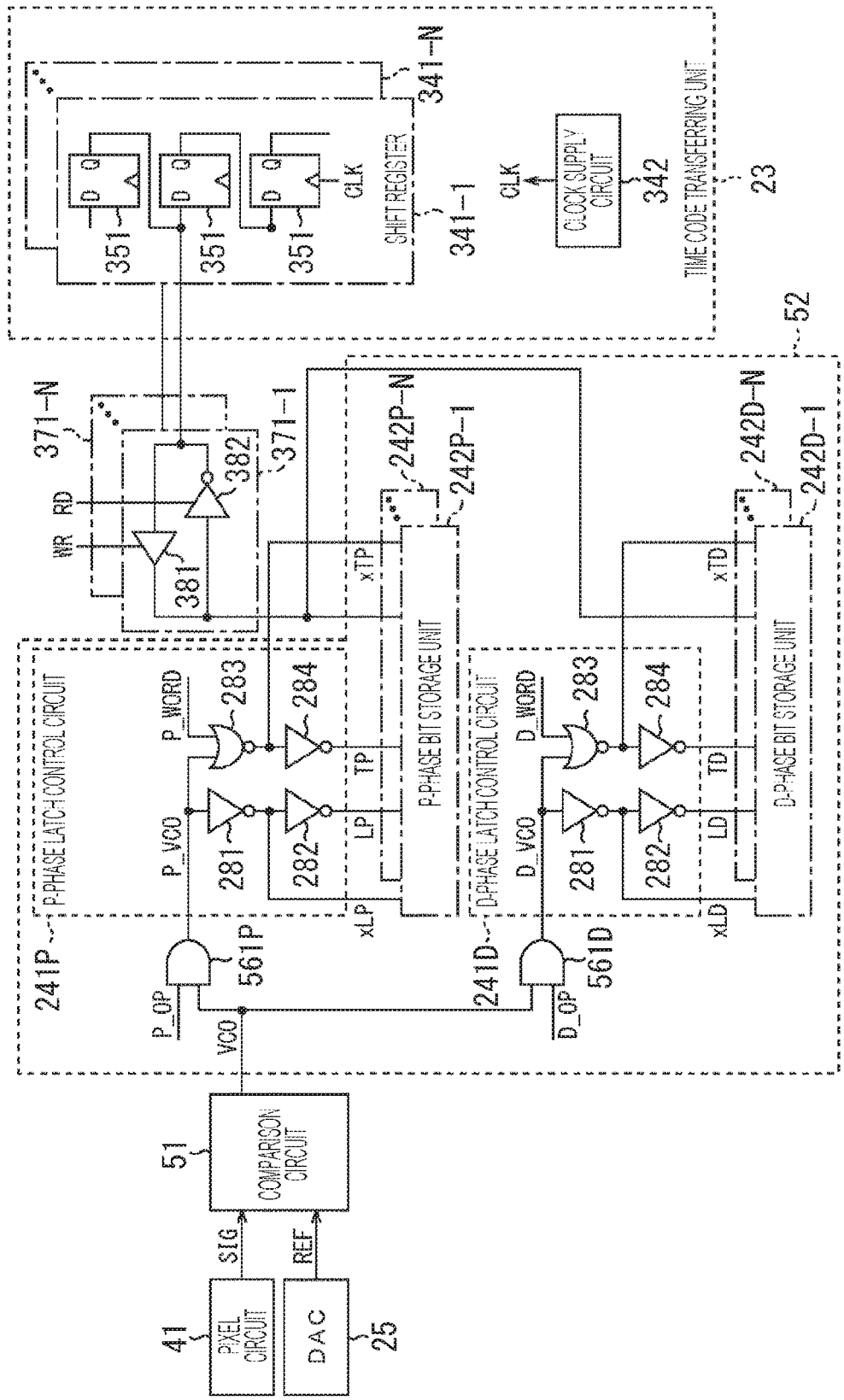
FIG. 28 is a diagram for describing a different exemplary configuration of the data storage unit in the pixel.

FIG. 28 is a diagram of a different exemplary configuration of the data storage unit 52 in the pixel 21.

The solid-state image pickup device 1 performs the AD conversion to the pixel signal SIG at the reset level so as to acquire the P-phase data. After that, the solid-state image pickup device 1 performs the AD conversion to the pixel signal SIG at the signal level so as to acquire the D-phase data, and then performs the CDS processing of outputting the difference between the P-phase data and the D-phase data, as a video signal.

Two types of circuits including a P-phase latch control circuit 241P for the P-phase data and a D-phase latch control circuit 241D for the D-phase data, are provided instead of the latch control circuit 241 of FIG. 15, in comparison between the configuration of the data storage unit 52 illustrated in FIG. 28 and the configuration of the data storage unit 52 illustrated in FIG. 15.

In addition, instead of the bit storage units 242-1 to 242-N of FIG. 15, two types of storage units including P-phase bit storage units 242P-1 to 242P-N for the P-phase data and D-phase bit storage units 242D-1 to 242D-N for the D-phase data, are provided.

In addition, the data storage unit 52 includes two AND circuits 561P and 561D newly provided. The output signal VCO output from the comparison circuit 51 is input into one of the two inputs of each of the AND circuits 561P and 561D. A P-phase selection signal P_OP being Hi during the AD conversion period of the P-phase data, is input into the other of the two inputs of the AND circuit 561P, and a D-phase selection signal D_OP being Hi during the AD conversion period of the D-phase data, is input into the other of the two inputs of the AND circuit 561D.

In the configuration of the data storage unit 52 illustrated in FIG. 15, the acquisition of the D-phase data needs to start after the transfer of the P-phase data that has been acquired, is completed. In other words, the acquisition of the D-phase data needs to wait the completion of the transfer of the P-phase data.

In the configuration of the data storage unit 52 illustrated in FIG. 28, during the first AD conversion period of the P-phase data, the P-phase selection signal P_OP being Hi and the D-phase selection signal D_OP being Lo are supplied to the data storage unit 52, and then the P-phase data is stored in the P-phase bit storage units 242P-1 to 242P-N.

During the next AD conversion period of the D-phase data, the P-phase selection signal P_OP being Lo and the D-phase selection signal D_OP being Hi are supplied to the data storage unit 52 and then the D-phase data is stored in the D-phase bit storage units 242D-1 to 242D-N. After that, the P-phase data and the D-phase data are sequentially output to the time code transferring unit 23.

With this arrangement, shortening the time interval between the acquisition of the P-phase data and the acquisition of the D-phase data, can improve an offset in the CDS processing and a noise offsetting effect, according to the data storage unit 52 illustrated in FIG. 28. In addition, the P-phase data and the D-phase data are sequentially output to the time code transferring unit 23 so that a memory unit that temporarily stores the P-phase data is not required in the output unit 28.

Note that, a configuration the same as that of FIG. 15 has been adopted as the configuration of the time code transferring unit 23 in FIG. 28, but the other configurations of the time code transferring unit 23 described above may be adopted.

<19. Different Exemplary Configuration of Clock Supply Circuit>

According to the configurations described above, for example, as described with reference to FIG. 15, the clock supply circuit 342 that supplies the clock signal CLK, is provided in each of the plurality of time code transferring units 23 arranged in the pixel array unit 22.

Figure 29:
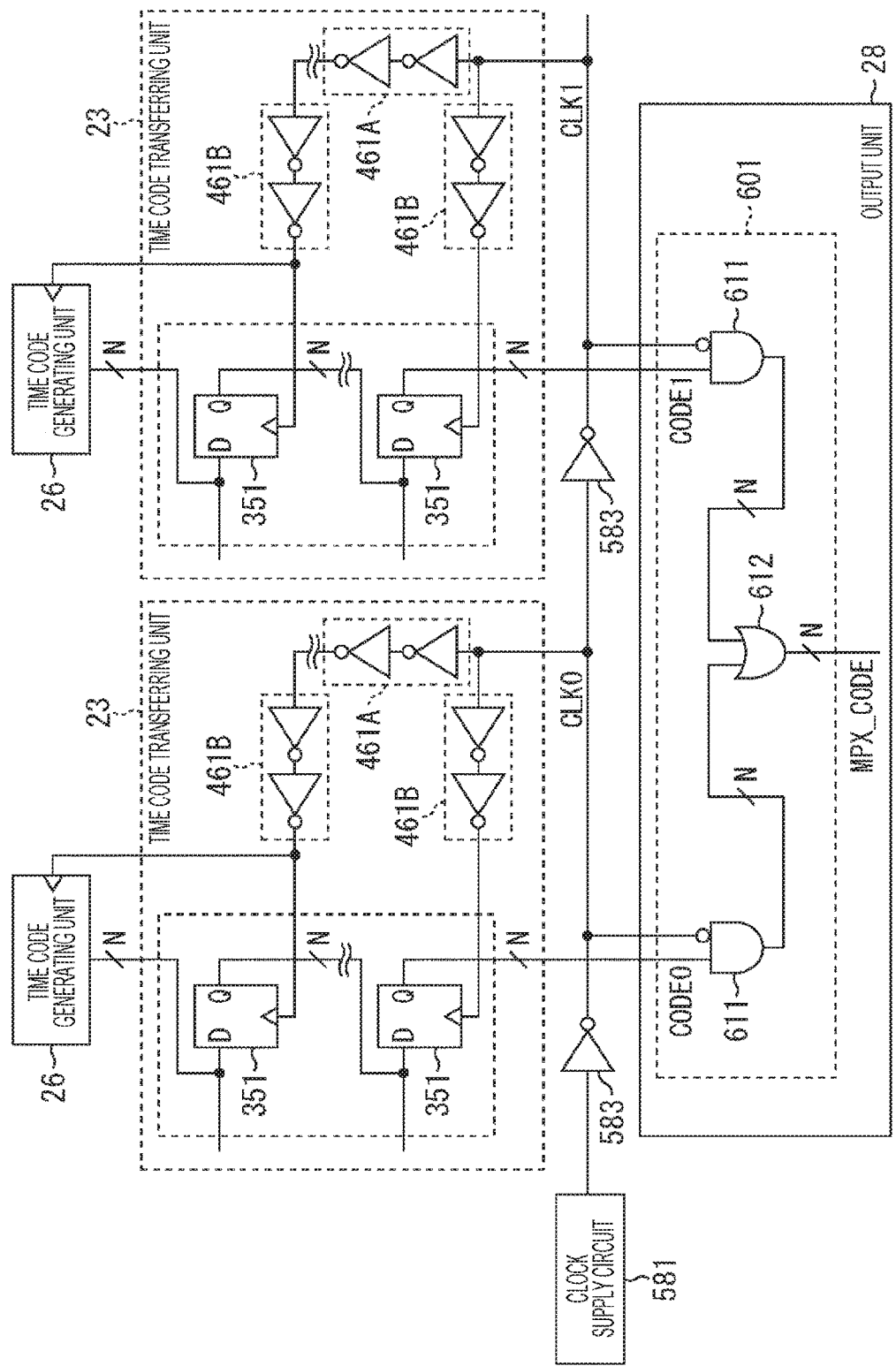
FIG. 29 is a diagram for describing a different exemplary configuration of a clock supply circuit.

However, as illustrated in FIG. 29, a clock supply circuit 581 is provided outside the plurality of time code transferring units 23 so that the clock supply circuit 581 may supply a common clock signal CLK to each of the plurality of time code transferring units 23.

Providing simply the one clock supply circuit 581 makes the rise and the fall of a clock in the clock signal CLK supplied to each of the plurality of time code transferring units 23, the same.

Thus, as illustrated in FIG. 29, inverters 583 are further arranged to the time code transferring units 23 on a one-to-one basis at the subsequent stage of the clock supply circuit 581 so that a clock signal CLK0 and a clock signal CLK1 supplied to the adjacent time code transferring units 23 can have opposite phases. With this configuration, a circuit operation current that concentrates in the vicinity of the rising time of the clock signal CLK, is dispersed in a case where no inverter 583 is arranged, so that a peak current value decreases.

In a case where the clock signal CLK0 and the clock signal CLK1 supplied to the adjacent time code transferring units 23 have the opposite phases, the time code and the AD conversion pixel data output from the final stage of the shift register 341 in each time code transferring unit 23, are shifted by a half cycle between the adjacent time code transferring units 23.

Therefore, as illustrated in FIG. 29, a multiplexing circuit 601 is provided in the output unit 28 so that a code MPX_CODE including outputs CODE0 and CODE1 from two units of the adjacent time code transferring units 23, time-division multiplexed, can be easily generated.

The multiplexing circuit 601 includes two AND circuits 611 and one OR circuit 612. The output CODE0 from the corresponding time code transferring unit 23 and the inverted signal of the clock signal CLK0 supplied to the time code transferring unit 23, are input into one of the two AND circuits 611. The output CODE1 from the corresponding time code transferring unit 23 and the inverted signal of the clock signal CLK1 supplied to the time code transferring unit 23, are input into the other of the two AND circuits 611. The OR circuit 612 receives outputs from the two AND circuits 611 so as to output the code MPX_CODE that has been time-division multiplexed.

The multiplexing circuit 601 is provide so that conductive lines for the output unit 28 to transmit the AD conversion pixel data to an output terminal or to transmit the AD conversion pixel data to a memory circuit (e.g., DRAM) in the solid-state image pickup device 1, can be reduced.

Note that, the phase relationship between the clock signal CLK0 and the clock signal CLK1 supplied to the adjacent time code transferring units 23, may have a phase shift of 90° other than the opposite phase. In addition, four phases of clock signals CLK0 to CLK3 each having a phase shifted by 90°, may be supplied to four adjacent time code transferring units 23.

<20. Exemplary Application to Column AD System>

The solid-state image pickup device 1 described above is an image sensor including the AD conversion circuit (ADC 42) arranged in each pixel 21.

However, the time code transferring unit 23 described above can be applied to an image sensor having a column AD system, that includes the AD conversion circuits linearly formed in the column direction and performs AD conversion processing, per unit column, to the pixel signal SIG of each pixel 21 in the pixel array unit 22.

Figure 30:
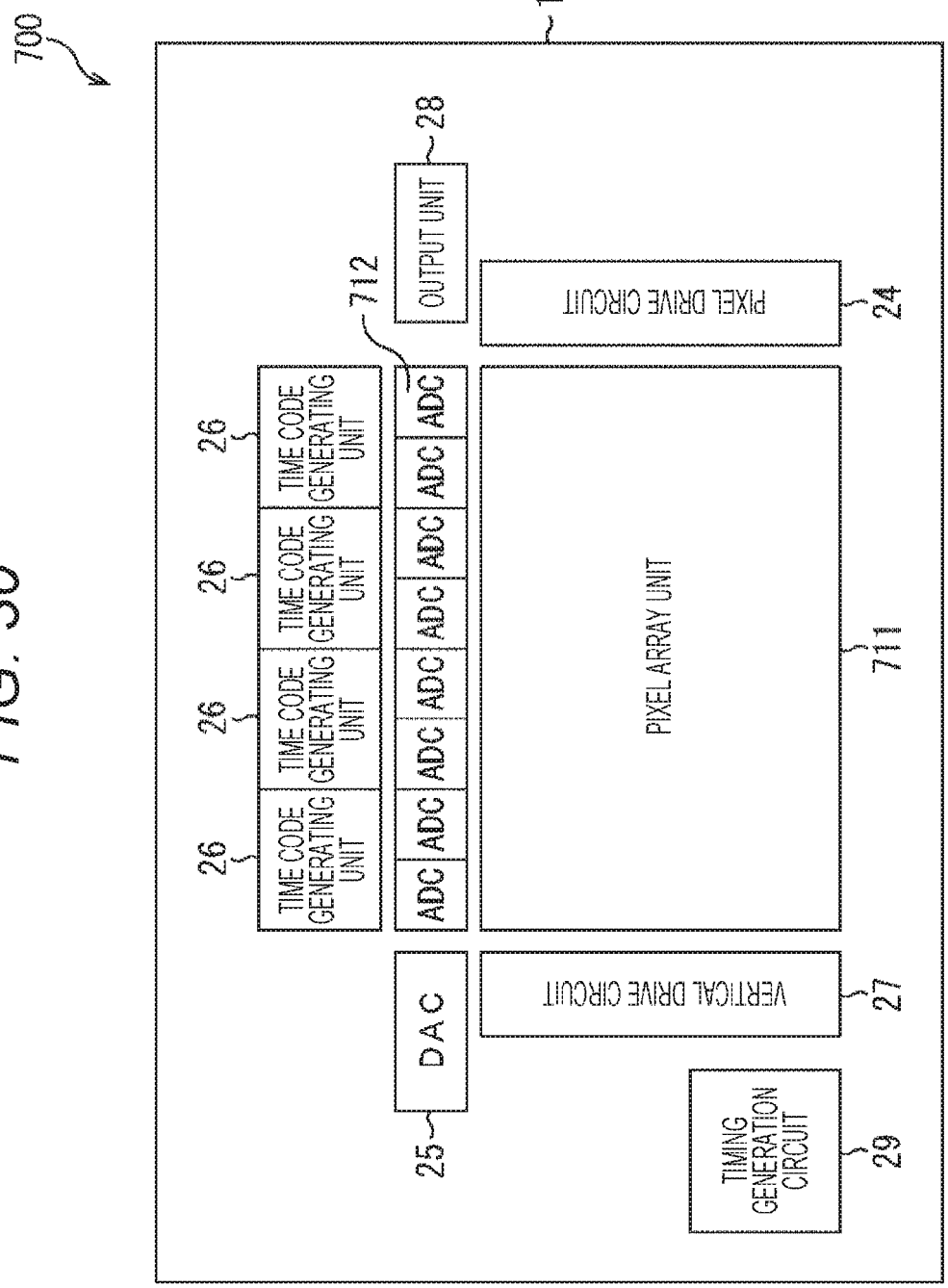
FIG. 30 is a diagram for describing an exemplary application to a solid-state image pickup device having a column AD system.

FIG. 30 illustrates a configuration of a solid-state image pickup device 700 having the column AD system in a case where no time code transferring unit 23 is used. The solid-state image pickup device 700 of FIG. 30, includes a number of ADCs 712 each including the comparison circuit 51 and the data storage unit 52 described above, linearly arranged outside a pixel array unit 711. Since a number of the ADCs 712 that have been arranged, include a long physical length, a plurality of the time code generating units 26 is arranged and then the time codes generated by the plurality of the time code generating units 26 are distributed into every predetermined number of the ADCs 712 so that the skew between the bits of the time codes is inhibited.

Figure 31:
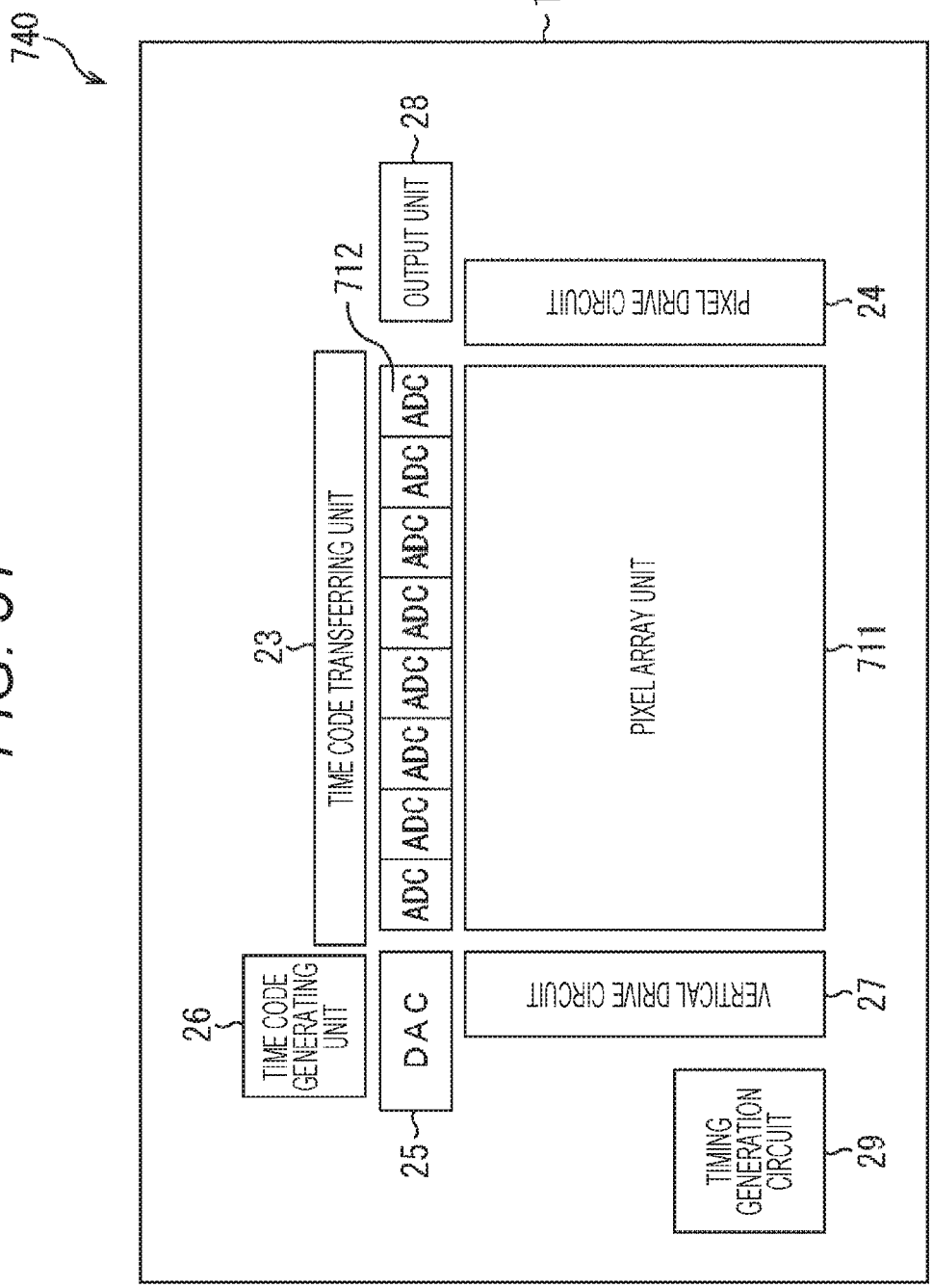
FIG. 31 is a diagram for describing an exemplary application to a solid-state image pickup device having a column AD system.

FIG. 31 illustrates a configuration of a solid-state image pickup device 740 having the column AD system in a case where the time code transferring unit 23 has been used.

The solid-state image pickup device 740 of FIG. 31, includes one time code generating unit 26 and the time code transferring unit 23 that transfers and supplies the time code generated by the time code generating unit 26 to a number of the ADCs 712 arranged linearly. For example, the configuration of the shift register 341 illustrated in FIG. 15 or the modifications thereof can be adopted as the configuration of the time code transferring unit 23.

In a case where the time code is a Gray code, the solid-state image pickup device 700 of FIG. 30 needs D-F/Fs, the number of the D-F/Fs being double the bit length of the code, and combinational gates, the number of the combination gates being approximate to the bit length of the code, for the entire time code generating units 26. Meanwhile, the solid-state image pickup device 740 of FIG. 31 includes D-F/Fs provided, the number of the D-F/Fs being equivalent to the bit length of the code, so that the time code having small skew can be reproduced, and a circuit scale and current consumption can be reduced.

<21. Plural Substrate Configuration 1>

The solid-state image pickup device 1 formed on one unit of the semiconductor substrate 11, has been described in the above descriptions, but the solid-state image pickup device 1 may include the circuits separately made into a plurality of the semiconductor substrates 11.

Figure 32:
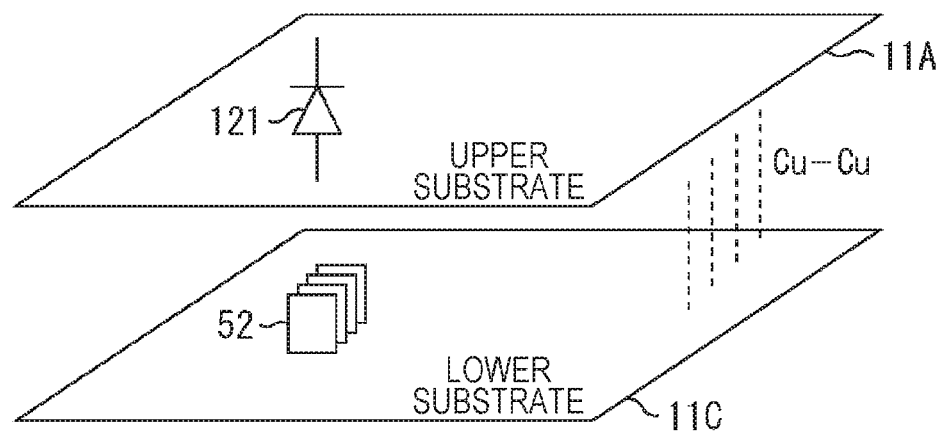
FIG. 32 is a conceptual diagram of a solid-state image pickup device including two semiconductor substrates layered.

FIG. 32 is a conceptual diagram of the solid-state image pickup device 1 including two units of the semiconductor substrates 11 including an upper substrate 11A and a lower substrate 11C, layered.

A pixel circuit 41 including the photodiode 121 is at least formed on the upper substrate 11A. The data storage unit 52 that stores the time code and the time code transferring unit 23 are at least formed on the lower substrate 11C. For example, the upper substrate 11A and the lower substrate 11C are joined due to metallic bonding, such as Cu—Cu.

Figure 33:
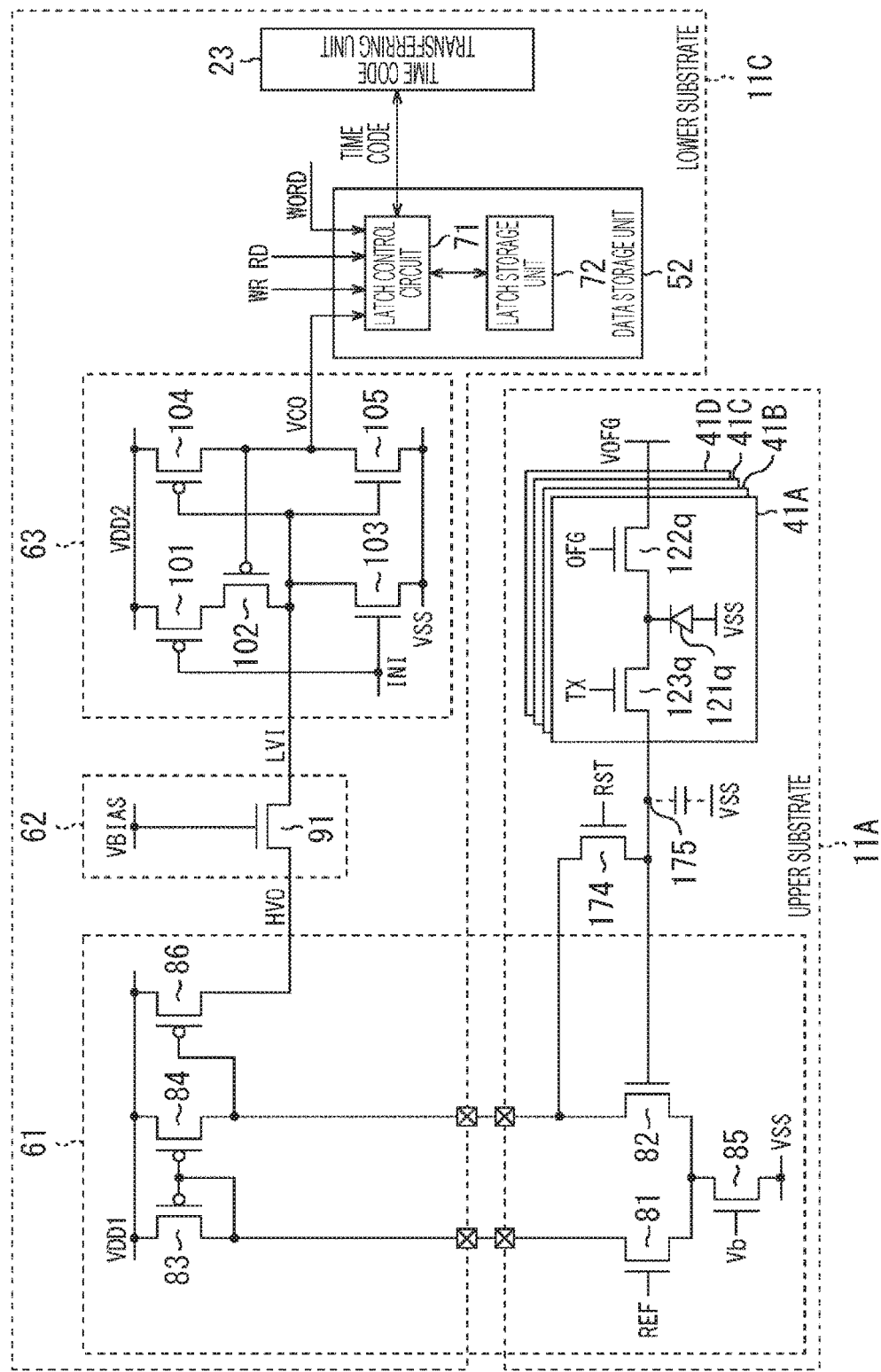
FIG. 33 is a diagram of an exemplary circuit configuration in a case where the solid-state image pickup device includes the two semiconductor substrates layered.

FIG. 33 illustrates exemplary circuit configurations individually formed on the upper substrate 11A and the lower substrate 11C.

A pixel circuit 41 and a circuit including the transistors 81, 82, and 85 in the differential input circuit 61 in the ADC 42, are formed on the upper substrate 11A. The circuits of the ADC 42 excluding the transistors 81, 82, and 85 and the time code transferring unit 23, are formed on the lower substrate 11C.

<22. Plural Substrate Configuration 2>

FIGS. 32 and 33 illustrate the exemplary configuration of the solid-state image pickup device 1 including the two units of the semiconductor substrates 11, but the solid-state image pickup device 1 can include three units of the semiconductor substrates 11.

Figure 34:
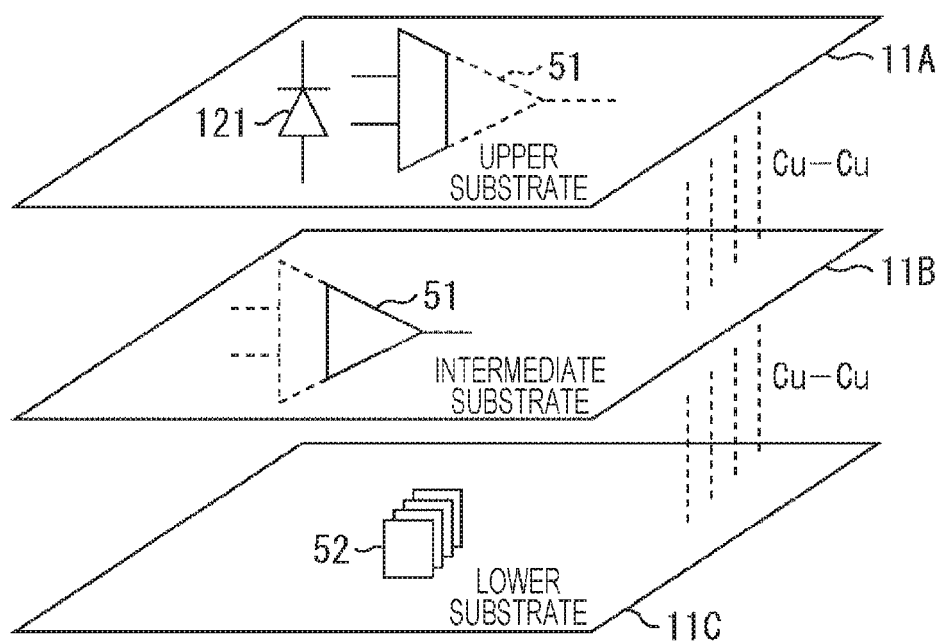
FIG. 34 is a conceptual diagram of the solid-state image pickup device including three semiconductor substrates layered.

FIG. 34 is a conceptual diagram of the solid-state image pickup device 1 including three units of the semiconductor substrates 11 including the upper substrate 11A, an intermediate substrate 11B, and the lower substrate 11C, layered.

A pixel circuit 41 including the photodiode 121 and at least a partial circuit in the comparison circuit 51, are formed on the upper substrate 11A. The data storage unit 52 that stores the time code and the time code transferring unit 23 are at least formed on the lower substrate 11C. The remaining circuits in the comparison circuit 51, that are not arranged on the upper substrate 11A, are formed on the intermediate substrate 11B. For example, the upper substrate 11A and the intermediate substrate 11B, and, the intermediate substrate 11B and the lower substrate 11C, are joined due to the metallic bonding, such as Cu—Cu.

Figure 35:
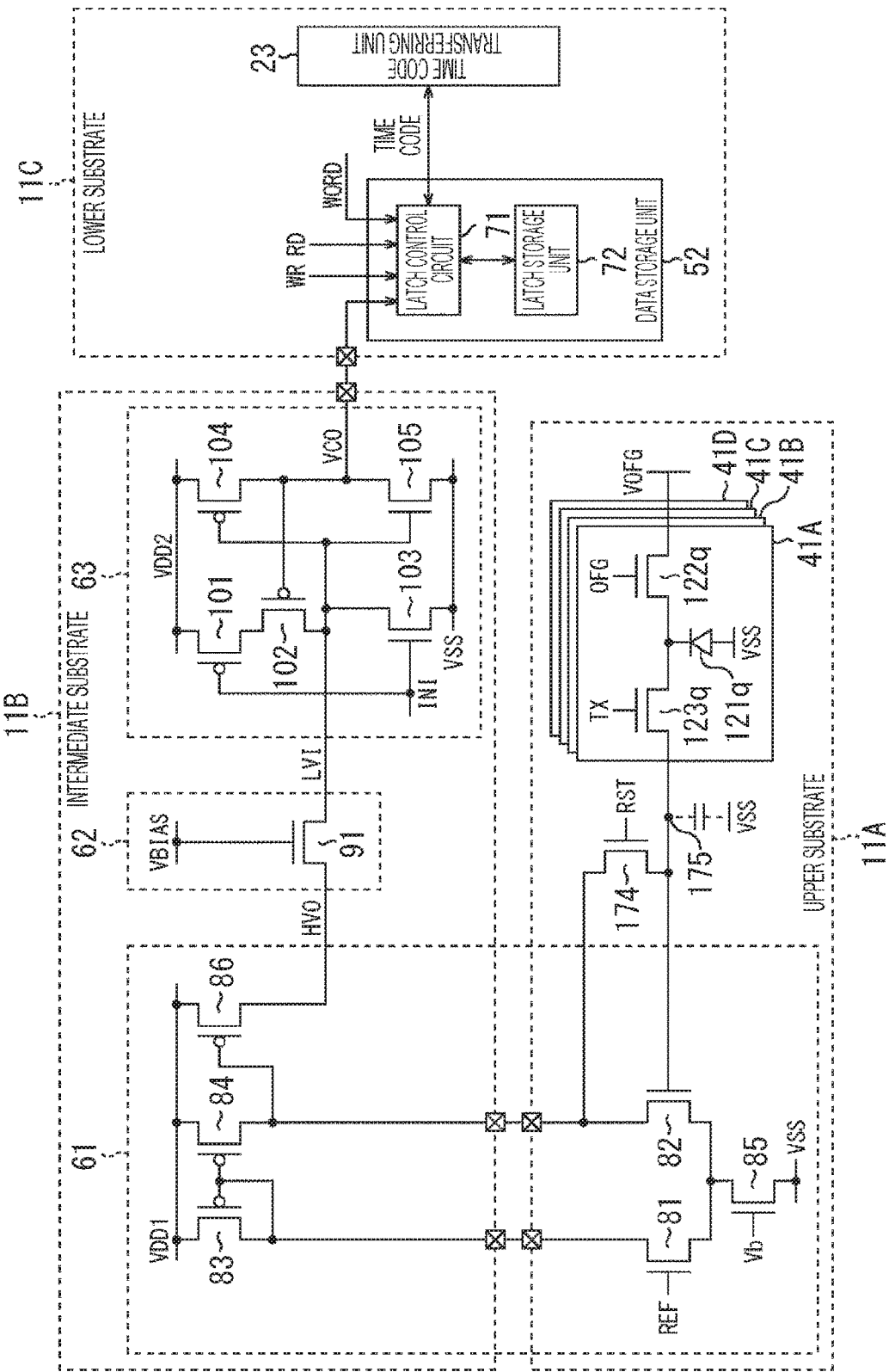
FIG. 35 is a diagram of an exemplary circuit configuration in a case where the solid-state image pickup device includes the three semiconductor substrates layered.

FIG. 35 illustrates an exemplary circuit arrangement of each semiconductor substrate 11 in a case where the solid-state image pickup device 1 is formed with the three units of the semiconductor substrates 11.

In the example of FIG. 35, the circuits arranged on the upper substrate 11A are the same as the circuits on the upper substrate 11A illustrated in FIG. 33. The remaining circuits in the comparison circuit 51 are arranged on the intermediate substrate 11B, and the data storage unit 52 and the time code transferring unit 23 are arranged on the lower substrate 11C.

<23. Exemplary Application to Electronic Device>

The present disclosure is not limited to an application to solid-state image pickup devices. That is, the present disclosure can be applied to general electronic devices each including a solid-state image pickup device used for an image capturing unit (a photoelectric conversion unit), such as an image pickup device, such as a digital still camera or a video camera, a portable terminal device having an image pickup function, and a copying machine including a solid-state image pickup device used for an image capturing unit. The solid-state image pickup devices each may be formed in a one-chip mode, or may have a module mode having an image pickup function with an image pickup unit and a signal processing unit or an optical system collectively packaged.

Figure 36:
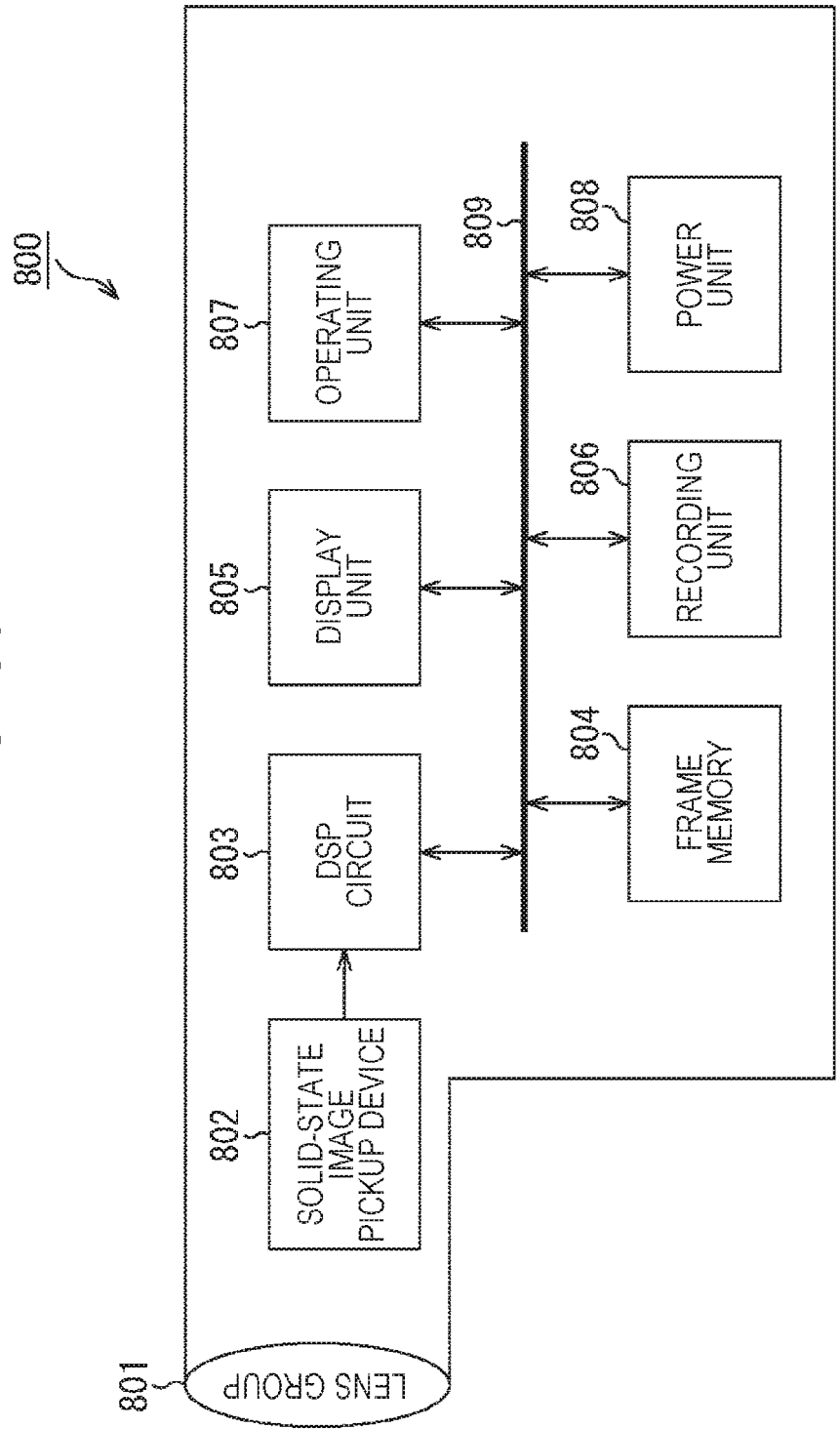
FIG. 36 is a block diagram of an exemplary configuration of an image pickup device being an electronic device according to the present disclosure.

FIG. 36 is a block diagram of an exemplary configuration of an image pickup device as an electronic device according to the present disclosure.

The image pickup device 800 of FIG. 36 includes an optical unit 801 including a lens group, a solid-state image pickup device (an image pickup device) 802 including the configuration of the solid-state image pickup device 1 of FIG. 8 adopted, and a digital signal processor (DSP) circuit 803 being a camera signal processing circuit. In addition, the image pickup device 800 also includes a frame memory 804, a display unit 805, a recording unit 806, an operating unit 807, and a power unit 808. The DSP circuit 803, the frame memory 804, the display unit 805, the recording unit 806, the operating unit 807, and the power unit 808 are mutually coupled through a bus line 809.

The optical unit 801 receives incident light (image light) from a subject so as to form an image on the image pickup surface of the solid-state image pickup device 802. The solid-state image pickup device 802 converts the light intensity of the incident light of the image formation, due to the optical unit 801, on the image pickup surface, into an electrical signal per unit pixel so as to output a pixel signal. The solid-state image pickup device 1 of FIG. 1, namely, a solid-state image pickup device including the comparison circuits 51 each that improve the determining speed in performing the AD conversion to the pixel signal with the power consumption reduced, and the time code transferring units 23 each capable of dramatically reducing the circuit scale and the power consumption, can be used for the solid-state image pickup device 802.

The display unit 805 includes, for example, a panel-typed display device, such as a liquid crystal panel or an organic electro luminescence (EL) panel, and displays a moving image or a still image picked up by the solid-state image pickup device 802. The recording unit 806 records the moving image or the still image picked up by the solid-state image pickup device 802, on a recording medium, such as a hard disk or a semiconductor memory.

The operating unit 807 issues instructions for various functions included in the image pickup device 800, on the basis of an operation by a user. The power unit 808 appropriately supplies various types of power being operating power for the DSP circuit 803, the frame memory 804, the display unit 805, the recording unit 806, and the operating unit 807, to the objects to be supplied.

As described above, the solid-state image pickup device 1 that has adopted any of the configurations described above, is used as the solid-state image pickup device 802 so that the power consumption can be reduced with the determining speed of AD conversion accelerated. Therefore, acceleration of shooting and low power consumption can be achieved for the image pickup device 800, such as a video camera, a digital still camera, or furthermore a camera module for a mobile device, such as a portable phone.

Note that, the solid-state image pickup device 740 of FIG. 31 may be adopted as the solid-state image pickup device 802. In this case, the circuit scale and the power consumption can be reduced.

In the above descriptions, the comparison circuits 51 and the ADCs 42 have been described as components built in the solid-state image pickup device 1, but can be made as products (comparators and AD converters) that are individually distributed.

In addition, the present disclosure is not limited to solid-state image pickup devices, and thus can be applied to general semiconductor devices each having a different semiconductor integrated circuit.

The embodiments of the present disclosure are not limited to the above embodiments, and thus various alterations may be made without departing from the spirit of the present disclosure.

The circuit configuration according to each embodiment described above, has been described as a circuit configuration in which electrons are electric charges, but the present disclosure can adopt a circuit configuration in which holes are electric charges. In addition, a circuit configuration in which the transistors have switched in polarity in each circuit configuration described above (NMOS transistors and PMOS transistors), can be achieved. In that case, the control signals input into the transistors switch from Hi to Low or from Low to Hi.

In each embodiment described above, the reference signal REF has been described as the slope signal having the level (the voltage) monotonously decreasing in response to the passage of time, but the reference signal REF can be made as a slope signal having a level (a voltage) monotonously increasing in response to the passage of time.

In each embodiment described above, in a case an ADC 42 is shared, the example of the ADC 42 shared by the four pixels 21 has been described, but the number of pixels 21 sharing is not limited to four and thus can be made to be a different number (e.g., eight).

In addition, a mode including the plurality of embodiments described above entirely or partially combined, can be adopted. A mode including different embodiments that have not described in the embodiments described above, appropriately combined, may be made.

In FIGS. 1 and 20, the time code generating units 26 are arranged on the upper side in the drawing and the output unit 28 is arranged on the lower side of the drawing. For example, the arrangement of the time code generating units 26 and the arrangement of the output units 28 may be alternately arranged so that the transferring direction of the time code is inverted in the upper and lower direction between adjacent clusters U in the horizontal direction. For example, the time code generating unit 26 is arranged on the upper side and the output unit 28 is arranged on the lower side for each odd numbered cluster U counted from the side of the DAC 25 in terms of the positions of the clusters U in the horizontal direction so that the time code is transferred downward from the upper side, and the time code generating unit 26 is arranged on the lower side and the output unit 28 is arranged on the upper side for each even numbered cluster U so that the time code is transferred upward from the lower side. With this arrangement, the circuit concentration of the time code generating units 26 and the output units 28 can be inhibited.

Note that, the effects described in the present specification are, but are not limited to, just exemplifications, and thus effects other than those described in the present specification may be provided.

Note that, the present disclosure can have the following configurations.

(1)

A comparator including:

a differential input circuit configured to operate with a first power supply voltage, the differential input circuit configured to output a signal when an input signal is higher than a reference signal in voltage;

a positive feedback circuit configured to operate with a second power supply voltage lower than the first power supply voltage, the positive feedback circuit being configured to accelerate transition speed when a compared result signal indicating a compared result between the input signal and the reference signal in voltage, is inverted, on the basis of the output signal from the differential input circuit; and a voltage conversion circuit configured to convert the output signal of the differential input circuit into a signal corresponding to the second power supply voltage.

(2)

According to the comparator described in (1) above, the voltage conversion circuit includes a transistor.

(3)

According to the comparator described in (1) above, the voltage conversion circuit includes a plurality of diodes.

(4)

According to the comparator described in any of (1) to (3) above, the positive feedback circuit receives input of a control signal different from the output signal of the differential input circuit, and inverts the compared result signal on the basis of the control signal regardless of the output signal of the differential input circuit.

(5)

According to the comparator described in (4) above, the positive feedback circuit includes a NOR circuit configured to receive the output signal of the differential input circuit and the control signal.

(6)

An AD converter including:

a differential input circuit configured to operate with a first power supply voltage, the differential input circuit configured to output a signal when an input signal is higher than a reference signal in voltage;

a positive feedback circuit configured to operate with a second power supply voltage lower than the first power supply voltage, the positive feedback circuit being configured to accelerate transition speed when a compared result signal indicating a compared result between the input signal and the reference signal in voltage, is inverted, on the basis of the output signal from the differential input circuit;

a voltage conversion circuit configured to convert the output signal of the differential input circuit into a signal corresponding to the second power supply voltage; and a data storage unit configured to store a time code when the compared result signal is inverted.

(7)

A solid-state image pickup device including:

an AD converter including:

a differential input circuit configured to operate with a first power supply voltage, the differential input circuit configured to output a signal when an input signal is higher than a reference signal in voltage;

a positive feedback circuit configured to operate with a second power supply voltage lower than the first power supply voltage, the positive feedback circuit being configured to accelerate transition speed when a compared result signal indicating a compared result between the input signal and the reference signal in voltage, is inverted, on the basis of the output signal from the differential input circuit;

a voltage conversion circuit configured to convert the output signal of the differential input circuit into a signal corresponding to the second power supply voltage; and a data storage unit configured to store a time code when the compared result signal is inverted; and a pixel circuit configured to output an electric charge signal to the differential input circuit as the input signal, the electric charge signal being generated by receiving and photoelectrically converting light incident on a pixel.

(8)

The solid-state image pickup device described in (7) above, further including: a time code transferring unit including a shift register configured to supply the time code to the data storage unit during a comparison period during which the input signal and the reference signal are compared in voltage, the shift register being configured to read inverted time data including the time code when the compared result signal is inverted, stored in the data storage unit, after the comparison period is completed.

(9)

According to the solid-state pickup device described in (8) above, the shift register includes a plurality of D-F/Fs configured to be made into a high-impedance state when a clock signal to be input is a predetermined value.

(10)

According to the solid-state pickup device described in (9) above, the D-F/Fs are shared by a plurality of the pixels.

(11)

According to the solid-state pickup device described in (9) or (10) above, the time code transferring unit further includes a repeater circuit configured to transmit the clock signal to be input into the shift register.

(12)

According to the solid-state pickup device described in (11) above, a direction in which the repeater circuit transmits the clock signal is opposite to a direction in which the time code of the shift register is transferred.

(13)

According to the solid-state pickup device described in (11) or (12) above, a plurality of the time code transferring units is provided, and the clock signals to be supplied to the time code transferring units adjacent to each other, have opposite phases.

(14)

The solid-state pickup device described in (13) above, further including: a multiplexing circuit configured to time-division multiplex output signals from the time code transferring units adjacent to each other.

(15)

According to the solid-state pickup device described in any of (8) to (14) above, the time code transferring unit further includes a preset circuit configured to input a predetermined fixed signal into the shift register.

(16)

According to the solid-state pickup device described in any of (9) to (15) above, the time code transferring unit further includes a selector configured to switch input of each of the D-F/Fs, to any of the time code supplied to the data storage unit and the inverted time code read from the data storage unit.

(17)

According to the solid-state pickup device described in any of (7) to (16) above, further including: an interactive buffer configured to make a switch between a writing operation and a reading operation of the time code with respect to the data storage unit.

(18)

According to the solid-state pickup device described in (17) above, the interactive buffer inverts the time code stored in the data storage unit, in polarity, so as to read the time code, in the reading operation.

(19)

According to the solid-state pickup device described in (17) above, the interactive buffer does not invert the time code stored in the data storage unit, in polarity, so as to read the time code, in the reading operation.

(20)

According to the solid-state pickup device described in any of (7) to (19) above, the data storage unit includes a P-phase data storage unit configured to store the time code for P-phase data and a D-phase data storage unit configured to store the time code for D-phase data.

(21)

According to the solid-state pickup device described in any of (7) to (20) above, the AD converter is arranged for each of the pixels.

(22)

According to the solid-state pickup device described in any of (7) to (20) above, the AD converter is arranged per unit pixel line.

(23)

The solid-state pickup device described in any of (7) to (22) above, further including: a plurality of semiconductor substrates.

(24)

An electronic device including:

a solid-state image pickup device including:

an AD converter including:

a differential input circuit configured to operate with a first power supply voltage, the differential input circuit configured to output a signal when an input signal is higher than a reference signal in voltage;

a positive feedback circuit configured to operate with a second power supply voltage lower than the first power supply voltage, the positive feedback circuit being configured to accelerate transition speed when a compared result signal indicating a compared result between the input signal and the reference signal in voltage, is inverted, on the basis of the output signal from the differential input circuit;

a voltage conversion circuit configured to convert the output signal of the differential input circuit into a signal corresponding to the second power supply voltage; and a data storage unit configured to store a time code when the compared result signal is inverted; and a pixel circuit configured to output an electric charge signal to the differential input circuit as the input signal, the electric charge signal being generated by receiving and photoelectrically converting light incident on a pixel.

(25)

A method of controlling a comparator including a differential input circuit configured to operate with a first power supply voltage, a positive feedback circuit configured to operate with a second power supply voltage lower than the first power supply voltage, and a voltage conversion circuit, the method of controlling the comparator, including:

outputting a signal by the differential input circuit when an input signal is higher than a reference signal in voltage;

converting the output signal of the differential input circuit into a signal corresponding to the second power supply voltage, by the voltage conversion circuit; and accelerating transition speed when a compared result signal indicating a compared result between the input signal and the reference signal in voltage, is inverted, by the positive feedback circuit on the basis of the output signal of the differential input circuit, the output signal being converted by the voltage conversion circuit.

(26)

A data writing circuit including: a shift register configured to acquire a time code output from a time code generating unit so as to transfer the time code sequentially; and a latch circuit configured to latch-store the time code that has been transferred.

(27)

A data reading circuit including:

a latch circuit configured to latch-store a predetermined time code; and a shift register configured to receive the time code latch-stored in the latch circuit so as to transfer the time code sequentially.

(28)

A data transferring circuit including:

an interactive buffer configured to make a switch between a writing operation and a reading operation of a time code output from a time code generating unit;

a latch circuit configured to latch-store a predetermined time code; and a shift register configured to acquire the time code output from the time code generating unit and supply it to the latch circuit so as to transfer the time code sequentially in a case where the writing operation has been set in the interactive buffer, the shift register being configured to receive the time code latch-stored in the latch circuit so as to transfer the time code sequentially in a case where the reading operation has been set in the interactive buffer.

REFERENCE SINGS LIST

1 Solid-state image pickup device
21 Pixel
22 Pixel array unit
23 Time code transferring unit
26 Time code generating unit
28 Output unit
41 Pixel circuit
42 ADC
51 Comparison circuit
52 Data storage unit
61 Differential input circuit
62 Voltage conversion circuit
63 Positive feedback circuit
71 Latch control circuit
72 Latch storage unit
81 to 87 and 91 Transistor
101 to 105 and 111 to 113 Transistor
141 Diode
201 Bit storage unit
211 Latch control circuit
212 Latch storage unit
341 Shift register
342 Clock supply circuit
351 D-F/F
371 Interactive buffer circuit
461 Repeater circuit
481 Preset circuit
491 Fixed signal output unit
521 Selector
581 Clock supply circuit
583 Inverter
601 Multiplexing circuit
740 Solid-state image pickup device
800 Image pickup device
802 Solid-state image pickup device

What is claimed is:

1. An imaging device, comprising:
    a pixel circuit including:
        a photoelectric converter;
        a transfer transistor; and
        a reset transistor;
    a comparator including:
        a first differential transistor;
        a second differential transistor; and
        a first output node; and
    a feedback circuit coupled to the first output node.

2. The imaging device according to claim 1, wherein the reset transistor is coupled to a gate of the first differential transistor and one of a source or a drain of the first differential transistor.

3. The imaging device according to claim 2, wherein the second differential transistor is configured to receive a reference signal.

4. The imaging device according to claim 3, wherein the photoelectric converter converts incident light into a pixel signal.

5. The imaging device according to claim 4, wherein the first differential transistor is configured to receive a first signal based on the pixel signal.

6. The imaging device according to claim 5, wherein the comparator is configured to compare the first signal and the reference signal.

7. The imaging device according to claim 1, wherein the feedback circuit comprises a first transistor coupled to a power source voltage and a second transistor.

8. The imaging device according to claim 7, wherein the second transistor is coupled to a ground.

9. The imaging device according to claim 8, wherein a gate of the first transistor and a gate of the second transistor is configured to receive a second signal.

10. The imaging device according to claim 9, wherein the first transistor is coupled to the second transistor via a third transistor.

11. The imaging device according to claim 10, wherein a gate of the third transistor is coupled to a fourth transistor.

12. The imaging device according to claim 11, wherein the fourth transistor is coupled to the power source voltage.

13. The imaging device according to claim 12, wherein the fourth transistor is coupled to a fifth transistor.

14. The imaging device according to claim 13, wherein gates of the fourth and fifth transistors are configured to receive a third signal based on a first signal.

15. The imaging device according to claim 14, wherein the feedback circuit comprising a second output node.

16. The imaging device according to claim 1, further comprising a transistor coupled between the feedback circuit and the comparator.

* * * * *